(12) United States Patent
Sekine et al.

(10) Patent No.: US 11,107,998 B2
(45) Date of Patent: Aug. 31, 2021

(54) TRANSPARENT ELECTRODE AND ELECTRONIC DEVICE

(71) Applicant: KONICA MINOLTA, INC., Tokyo (JP)

(72) Inventors: Noboru Sekine, Tokyo (JP); Hiroki Kurata, Tokyo (JP)

(73) Assignee: KONICA MINOLTA, INC., Tokyo (JP)

( * ) Notice: Subject to any disclaimer, the term of this patent is extended or adjusted under 35 U.S.C. 154(b) by 358 days.

(21) Appl. No.: 16/328,096

(22) PCT Filed: Aug. 4, 2017

(86) PCT No.: PCT/JP2017/028376
§ 371 (c)(1),
(2) Date: Feb. 25, 2019

(87) PCT Pub. No.: WO2018/037880
PCT Pub. Date: Mar. 1, 2018

(65) Prior Publication Data
US 2019/0189932 A1    Jun. 20, 2019

(30) Foreign Application Priority Data
Aug. 25, 2016    (JP) .............................. JP2016-164841

(51) Int. Cl.
*H01L 51/50*    (2006.01)
*H01L 51/00*    (2006.01)
(Continued)

(52) U.S. Cl.
CPC .......... *H01L 51/0072* (2013.01); *C09K 11/06* (2013.01); *H01B 1/02* (2013.01); *H01L 51/50* (2013.01); *H01L 51/5016* (2013.01); *H01L 51/5092* (2013.01); *H01L 51/5212* (2013.01); *H01L 51/5215* (2013.01); *H01L 51/5228* (2013.01); *H01L 51/5234* (2013.01); *H01L 51/56* (2013.01); *C09K 2211/1007* (2013.01); *C09K 2211/1044* (2013.01);
(Continued)

(58) Field of Classification Search
None
See application file for complete search history.

(56) References Cited

U.S. PATENT DOCUMENTS

2015/0128855 A1*    5/2015    Kinoshita ............... H01L 51/56
118/500

FOREIGN PATENT DOCUMENTS

| JP | 5328845 B | 10/2013 |
| JP | 2014103103 A | 6/2014 |
| WO | 2013162004 A1 | 10/2013 |

OTHER PUBLICATIONS

International Search Report corresponding to Application No. PCT/JP2017/028376; dated Oct. 31, 2017.
(Continued)

*Primary Examiner* — Gregory D Clark
(74) *Attorney, Agent, or Firm* — Cantor Colburn LLP

(57) ABSTRACT

A transparent electrode includes a conductive layer and at least one metal affinity layer adjacent to the conductive layer. The conductive layer is composed of silver as a main component. The metal affinity layer contains an organic compound and a lanthanoid. The organic compound is a compound including a heteroatom having an unshared electron pair in a molecule.

7 Claims, 3 Drawing Sheets

(51) Int. Cl.
H01B 1/02 (2006.01)
C09K 11/06 (2006.01)
H01L 51/52 (2006.01)
H01L 51/56 (2006.01)

(52) U.S. Cl.
CPC .... *C09K 2211/185* (2013.01); *H01L 51/5056* (2013.01); *H01L 51/5072* (2013.01)

(56) References Cited

OTHER PUBLICATIONS

CNIPA First Office Action for corresponding CN Application No. 201780051069.9; dated Sep. 3, 2020.
KIPO Notice of Final Rejection for corresponding KR Application No. 10-2019-7003939; dated Sep. 28, 2020.
International Preliminary Report on Patentability corresponding to Application No. PCT/JP2017/028376; dated Feb. 26, 2019.
TW Decision of Rejection corresponding to Application No. TW106127724; dated Oct. 29, 2018.
TW Office Action corresponding to Application No. TW106127724; dated Jul. 3, 2018.
Written Opinion of the International Searching Authority corresponding to Application No. PCT/JP2017/028376; dated Oct. 31, 2017.
KIPO Notification of Reason for Refusal corresponding to Application No. 10-2019-7003939; dated Dec. 19, 2019.
JPO Notice of Reasons for Refusal for corresponding JP Patent Application. No. 2018-535569A; dated Apr. 6, 2021.

* cited by examiner

TRANSPARENT ELECTRODE AND ELECTRONIC DEVICE

CROSS REFERENCE TO RELATED APPLICATIONS

This is the U.S. national stage of application No. PCT/JP2017/028376, filed on Aug. 4, 2017. Priority under 35 U.S.C. § 119(a) and 35 U.S.C. § 365(b) is claimed from Japanese Application No. 2016-164841, filed on Aug. 25, 2016, the disclosure of which is incorporated herein by reference.

TECHNICAL FIELD

The present invention relates to a transparent electrode and an electronic device. More specifically, the present invention relates to a transparent electrode that is conductive and has a light-transmitting property, and that has excellent durability, and an electronic device using this transparent electrode.

BACKGROUND ART

An organic EL device utilizing the electroluminescence (abbreviated below as "EL") of an organic material is a thin completely solid-state device capable of emitting light at a low voltage of about several volts to several tens of volts. Such an organic EL device has many excellent characteristics, such as a high brightness, high luminous efficiency, thin shape, and light weight. For this reason, in recent years, organic EL devices have been drawing attention as surface light-emitters used in fields such as the backlights of various displays, display boards such as signboards and emergency lights, illumination light sources, and the like.

These organic EL devices have a structure in which a light-emitting layer composed of at least an organic material is arranged between two opposing electrodes, and the emission light generated in the light-emitting layer passes through an electrode and is extracted to the outside. Therefore, at least one of the two electrodes is configured as a transparent electrode.

As a material for forming the transparent electrode, an oxide semiconductor material, such as indium tin oxide ($SnO_2$—$In_2O_3$: Indium Tin Oxide, hereinafter abbreviated as "ITO") is generally used. Studies have been also carried out about how to reduce resistance by stacking ITO and silver. However, since ITO uses indium, which is a rare metal, the material cost is high, and a sputtering method is mainly used as the deposition method. However, in the case of an electronic device such as an organic electroluminescence device, when the transparent electrode is formed by sputter deposition on an organic layer mainly composed of an organic material, a problem is that the organic layer is damaged, which harms the inherent performance of the organic layer.

In order to solve the above problem, as a deposition method not employing a sputtering method, attempts have been made to form the transparent electrode by forming a thin film of a metal material by a vapor deposition method. A technique has been studied that achieves both a light-transmitting property and conductivity by using silver, which has a high electric conductivity, or an alloy of silver and magnesium to form the thin film structure. When forming a thin film of silver or an alloy of silver and magnesium, because silver tends to migrate (migration of the silver atoms), silver suffers from the problem of reduced conductivity. Further, a problem is that, for example, a light-transmitting property is reduced when thickness of the film is increased in order to suppress the migration, and hence it is difficult to achieve both conductivity and a light-transmitting property.

In response to such problems, studies have been carried out focusing on the electron injection layer, which is a base layer, when forming the silver thin film layer. For example, a method has been disclosed for simultaneously achieving a light-transmitting property and conductivity by combining a known electron injection material and a metal material for the base layer (e.g., see Patent Literature 1). Although the method described in Patent Literature 1 tries to achieve a light-transmitting property and conductivity while adjusting the alloy ratio of silver and magnesium, both of those properties were still insufficient.

Further, there is also disclosed a method for achieving both a light-transmitting property and conductivity by using an organic compound that interacts with silver in the base layer (e.g., see Patent Literature 2). In this case, in particular, good performance is exhibited when silver is used for the conductive layer, but a problem is that durability deteriorates when an alloy of silver and magnesium is used for the conductive layer.

In this way, in addition to characteristics such as a light-transmitting property and conductivity that a transparent electrode has, it is necessary to simultaneously improve various other performance aspects when applying a transparent electrode in an electronic device or an organic electroluminescence device, and development of new technologies is desired.

CITATION LIST

Patent Literature

Patent Literature 1: Japanese Patent No. 5328845
Patent Literature 2: Japanese Patent Laid-Open No. 2014-103103

SUMMARY OF INVENTION

To achieve at least one of the abovementioned objects, according to an aspect of the present invention claim 1 claims A transparent electrode, comprising a conductive layer and at least one metal affinity layer adjacent to the conductive layer,
wherein the conductive layer is composed of silver as a main component,
the metal affinity layer contains an organic compound and a lanthanoid, and
the organic compound is a compound comprising a heteroatom having an unshared electron pair in a molecule.

Solution to Problem

As a result of studies into the causes and the like of the above-mentioned problems in order to solve the problem addressed by the present invention, the present inventors discovered that a transparent electrode having excellent conductivity and light-transmitting property, as well as excellent durability, can be realized by employing a transparent electrode having, in order, a metal affinity layer including a substrate, a specific organic material, and a lanthanoid (hereinafter also referred to as "La metal"), and a conductive layer that has silver as a mainly component and that is provided adjacent to the metal affinity layer. Further, the present inventors also found that characteristics of an electronic device can be improved by applying this transparent electrode to the electronic device, particularly an organic electroluminescence device, thereby arriving at the present invention.

BRIEF DESCRIPTION OF DRAWINGS

"The advantages and features provided by one or more embodiments of the invention will
become more fully understood from the detailed description given hereinbelow and the
appended drawings which are given by way of illustration only, and thus are not
intended as a definition of the limits of the present invention."

DESCRIPTION OF EMBODIMENTS

Figure 1:
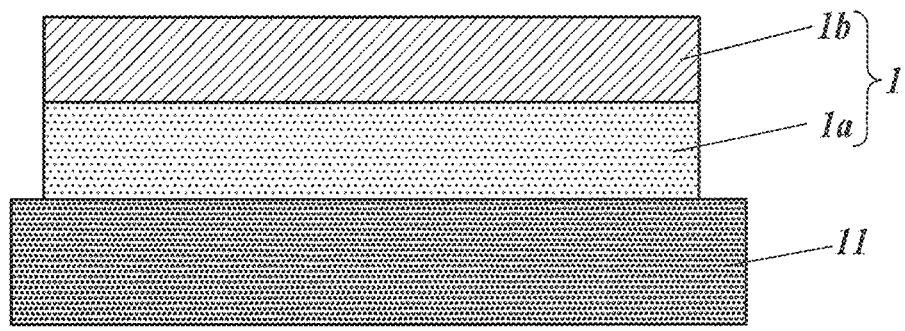
FIG. 1 is a schematic cross-sectional view showing an example of a basic structure of a transparent electrode of the present invention.

The transparent electrode of the present invention has a conductive layer and at least one metal affinity layer adjacent to the conductive layer. The conductive layer is composed mainly of silver. The metal affinity layer contains an organic compound and a lanthanoid. The organic compound is a compound including a hetero atom having an unshared electron pair in the molecule. These characteristics are technical characteristics that are common to, or correspond to, the claims.

In the present invention, from the viewpoint that the object and the effect of the present invention can be more exhibited better, the organic compound contained in the metal affinity layer is preferably an aromatic heterocyclic compound that contains a nitrogen atom having an unshared electron pair not involved in aromaticity, and that has an effective action energy $\Delta E_{ef}$ with silver represented by the above expression (1) satisfying the condition defined by the above expression (2), as this enables the aggregation of silver atoms associated with the migration of silver in the conductive layer containing silver as a main component to be more effectively suppressed, and enables a transparent electrode having better conductivity and a light-transmitting property to be obtained.

In addition, if the organic compound contained in the metal affinity layer is an organic compound whose energy level of its lowest unoccupied molecular orbital (hereinafter abbreviated as "LUMO") is in the range of −2.2 to −1.6 eV, it is possible for that organic compound to have an energy level close to that of the metal material constituting the conductive layer, in particular that of the silver atoms, and for there to be interaction between electron orbitals. This is preferable because affinity with the conductive layer is improved and aggregation of silver can be suppressed. In addition, in the organic electroluminescence device, setting to such an energy level is preferable because carrier injection from the conductive layer and carrier transport to the light-emitting layer are more likely to occur.

Further, it is preferable to use the compound having the structure represented by the general formula (I), because this improves the stability of the organic compound contained in the metal affinity layer, and also further improves the stability of the formed metal affinity layer. In particular, the compound represented by the general formula (I) is preferable because it has a large 7C plane and the intermolecular stack becomes strong, which improves the Tg (glass transition point) and thermal stability.

In addition, it is preferable that the lanthanoid is samarium (Sm), europium (Eu), or ytterbium (Yb) from the viewpoint that the object and effect of the present invention can exhibited better.

Further, the electronic device of the present invention is characterized by comprising the transparent electrode of the present invention. In addition, the electronic device is preferably an organic electroluminescent device. Specifically, the transparent electrode of the present invention can be suitably used as a transparent electrode for electronic devices, in particular as a transparent electrode for an organic electroluminescence device.

The effects when the transparent electrode of the present invention is applied as a transparent electrode for an electronic device, in particular as a transparent electrode for an organic electroluminescence device, are inferred to be as follows.

As described above, when the main component constituting the conductive layer according to the present invention is silver atoms, the conductive layer is deposited by layered growth type (Frank-van der Merwe: FM type) film growth in which the silver atoms first form two-dimensional nuclei on the surface of the metal affinity layer containing a lanthanoid and a silver affinity compound having atoms with affinity for silver atoms, and then a two-dimensional monocrystalline layer is formed centered around those nuclei. This enables a transparent electrode to be provided that achieves both a light-transmitting property and conductivity.

In addition, when the transparent electrode of the present invention is applied to an electronic device, in particular an organic electroluminescent device, it is important that the electrons be injected from the conductive layer into the organic electroluminescent layer including the metal affinity layer.

In the past, as known electron injection materials, improvements have been made to electron injection properties by providing an alkali metal salt, such as LiQ (mono(8-quinolinolato)lithium complex), LiF, or KF, an alkaline earth metal salt, and the like adjacent to a conductive layer composed of aluminum or a silver-magnesium alloy, or by using a known electron injection material in the electron injection layer in combination.

However, it is known that in these metal salts, a part of the metal and a ligand, or the metal and the halogen atom, dissociate and migrate during deposition or driving. It has been suggested that the dissociated substance produced by the dissociation phenomenon of the metal salt, even though only a very small amount is produced, diffuses into the electronic device, inhibiting carrier transport, deactivating the excitons, and reacting with other materials, thereby adversely affecting device performance.

In addition, when these alkali metal salts and alkaline earth metal salts are used alone as an electron injection layer, it is necessary to use such a salt as a very thin layer within a range of 0.1 to 3 nm. It is known that if the electron injection layer is thicker than this, the electron injection characteristics are not exhibited, and to the contrary the layer function as an insulating layer, causing the electron injection characteristics to deteriorate. Although such a thin film layer has a large influence on the device characteristics, it is difficult to stably manufacture a thin film layer, which is a cause of production variation.

On the other hand, in the present invention, by utilizing a metal affinity layer containing the silver affinity compound and a lanthanoid as an electron injection layer or an electron transport layer/electron injection layer, good electron injection properties can be exhibited even in a system not containing a dissociating metal salt, such as an alkali metal salt or an alkaline earth metal salt. In addition, when an alkali metal salt or an alkaline earth metal salt is used in combination with the metal affinity layer according to the present invention, the lanthanoid (La metal) has an affinity for the ligand of the metal salt and the halogen atom. Consequently, the diffusion of partially dissociated ligands or halogen atoms can be suppressed, and as a result, it is possible to provide an electronic device having superior durability.

Further, in the present invention, when the metal affinity layer is used as an organic electroluminescence constituent layer, since both carrier transporting properties and electron injection properties are achieved, the above-mentioned functions can be exhibited even in a thin film of 5 nm or more.

As described above, the metal affinity layer according to the present invention contains a silver affinity compound and a La metal, and as a result it is thought that a transparent electrode having both a light-transmitting property and conductivity, as well as carrier injecting properties, can be provided by adjusting the growth of the silver atoms, which are a constituent material of the adjacent conductive layer. Furthermore, since the silver affinity compound and the La metal included in the metal affinity layer interact with the silver atoms constituting the conductive layer, it is possible to suppress physical changes in the conductive layer and to provide a highly durable transparent electrode. In addition, the metal affinity layer in the present invention can exhibit not only a very thin state, but also exhibit an electron injection function even when formed with a thickness that can be stably produced.

Furthermore, when the metal affinity layer is used on an upper portion of the conductive layer, the silver affinity compound and the La metal included in the metal affinity layer interact with the silver atoms included in the conductive layer, improving the surface smoothness of the conductive layer. This enables transmittance and conductivity to be improved, and also allows physical changes in the conductive layer to be suppressed. As a result, a transparent electrode having good transmittance, conductivity, and durability can be obtained.

Hereinafter, the present invention, its constituent elements, and embodiments and modes for carrying out the present invention will be described in detail. It is also noted that in the present application, "-" representing a numerical range is used with the meaning that the numerical values described before and after the hyphen are included as a lower limit value and an upper limit value. Further, in the explanation of each drawing, the numbers written in parentheses at the end of the constituent elements represent the reference numerals in the drawings.

(Transparent Electrode)

The transparent electrode of the present invention is a transparent electrode having a conductive layer and at least one metal affinity layer adjacent to the conductive layer. The conductive layer is composed mainly of silver. The metal affinity layer contains an organic compound and a lanthanoid. The organic compound is a compound including a hetero atom having an unshared electron pair in the molecule. With these characteristics, a transparent electrode having sufficient conductivity and a light-transmitting property (transparency), as well as excellent durability (heat resistance), can be obtained.

Hereinafter, details of the transparent electrode of the present invention will be described.

[Structure of Transparent Electrode]

FIG. 1 is a schematic cross-sectional view showing an example of a basic structure of a transparent electrode of the present invention.

As shown in FIG. 1, the transparent electrode (1) has a two-layer structure of a metal affinity layer (1a) and a conductive layer (1b) stacked on an upper portion of the metal affinity layer (1a). For example, the metal affinity layer (1a) and the conductive layer (1b) are provided in this order on a base material (11). Of these layers, the metal affinity layer (1a) is a layer composed of a lanthanoid and a silver affinity compound, which is an organic compound including at least a hetero atom having an unshared electron pair in the molecule. The conductive layer (1b) is a layer composed mainly of silver.

Note that, "composed of silver as a main component" as used in the present invention means that the proportion of silver in the material components constituting the conductive layer is 60% by mass or more, preferably 70% by mass, more preferably 80% by mass or more, even more preferably 90% by mass or more, and particularly preferably 99% by mass or more. Further, "transparent" as used to refer to the transparent electrode (1) of the present invention means that the light transmittance at a wavelength of 500 nm is 50% or more, the light transmittance more preferably being 60% or more, and a light transmittance of 65% or more is even more preferable.

Next, a detailed structure of the base material (11) provided with the transparent electrode (1) having such a stacked structure, and the metal affinity layer (1a) and conductive layer (1b) constituting the transparent electrode (1), will be described in order.

[Base Material]

The transparent electrode (1) of the present invention is preferably formed on the base material (11) as shown in FIG. 1.

Examples of the base material (11) that can be applied in the present invention include, but are not limited to, glass, plastic, and the like. In addition, although the base material (11) may be transparent or non-transparent, when the transparent electrode (1) of the present invention is used in an electronic device which extracts light from the base material (11) side, the base material (11) needs to be transparent. Examples of the transparent base material (11) that may be preferably used include glass, quartz, and a transparent resin film.

Examples of the glass include glass materials such as silica glass, soda lime silica glass, lead glass, borosilicate glass, non-alkali glass, and the like. On the surface of these glass materials, from the viewpoint of adhesion with the metal affinity layer (1a), durability, and smoothness, a physical treatment such as grinding may be carried out as necessary. A coating made of an inorganic material or an organic material, or a hybrid coating formed by combining these coatings, may also be formed.

Examples of the resin film include polyesters such as polyethylene terephthalate (abbreviation: PET), polyethylene naphthalate (abbreviation: PEN), polyethylene (abbreviation: PE), and polypropylene (abbreviation: PP), cellulose esters and derivatives thereof such as cellophane, cellulose diacetate (abbreviation: DAC), cellulose triacetate (abbreviation: TAC), cellulose acetate butyrate, cellulose acetate propionate (abbreviation: CAP), cellulose acetate phthalate, and cellulose nitrate, cycloolefin resins such as polyvinylidene chloride, polyvinyl alcohol (abbreviation: PVA), polyethylene vinyl alcohol, syndiotactic polystyrene, polycarbonate (abbreviation: PC), norbornene resin, polymethyl pentene, polyether ketone, polyimide (abbreviation: PI), polyethersulfone (abbreviation: PES), polyphenylene sulfide, polysulfones, polyether imide, polyether ketone imide, polyamide, fluororesin, nylon, polymethyl methacrylate (abbreviation: PMMA), acrylic or polyarylates, ARTON (trade name, manufactured by JSR Corporation), and APEL (trade name, manufactured by Mitsui Chemicals, Inc.), and the like.

Similar to the glass, a coating composed of an inorganic material or an organic material, or a hybrid coating formed by combining these coatings, may be formed on the surface of the above-mentioned resin film. It is preferable for such a coating or a hybrid coating to be a film having a barrier property (also referred to as a barrier film etc.) having a water vapor permeability (25±0.5° C., relative humidity 90±2% RH) measured by a method in accordance with JIS K 7129-1992 of 0.01 g/(m$^2$·24 h) or less. Further, more preferable is a film having a high barrier property with an oxygen permeability measured by a method in accordance with JIS K 7126-1987 of $1 \times 10^{-3}$ mL/(m$^2$·24 h·atm) or less, and a water vapor permeability of $1 \times 10^{-5}$ g/(m$^2$·24 h) or less.

As the material forming a film having a barrier property like that described above, any material may be used as long as it is a material having a function of suppressing the infiltration of factors causing organic EL devices and electronic devices to degrade, such as moisture and oxygen. Examples of materials that can be used include silicon oxide, silicon dioxide, silicon nitride, and the like. Further, to improve the brittleness of the film having a barrier property, it is more preferable to have a stacked structure of these inorganic layers and layers (organic layers) composed of an organic material. There is no particular limitation on the stacking order of the inorganic layers and the organic layers, but it is preferable to alternately stack them plural times.

There is no particular limitation on the method for forming the barrier film constituting the film having a barrier property. Examples thereof include a vacuum deposition method, a sputtering method, a reactive sputtering method, a molecular beam epitaxy method, a cluster ion beam method, an ion plating method, a plasma polymerization method, an atmospheric pressure plasma polymerization method, a plasma CVD method, a laser CVD method, a thermal CVD method, and a coating method. As one example, the atmospheric pressure plasma polymerization method described in Japanese Patent Laid-Open No. 2004-68143 may be mentioned.

On the other hand, when constituting the base material (11) from a light non-transmissive material, for example, a metal substrate such as aluminum or stainless steel, a non-transparent resin substrate, a ceramic substrate, or the like can be used.

[Metal Affinity Layer]

The metal affinity layer according to the present invention is a layer containing a lanthanoid and an organic compound, which is a silver affinity compound, including a hetero atom having an unshared electron pair in the molecule. Examples of the deposition method may include, but are not particularly limited to, a wet method using a wet process, such as an application method, an inkjet method, a coating method, and a dipping method, and a dry method using a dry process, such as a vapor deposition method (a resistance heating method, an EB method, etc.), a sputtering method, a CVD method, and the like. Of these, a vapor deposition method is preferably employed.

The term unshared electron pair, which is also referred to as a lone pair of electrons, is an electron pair created by two electrons belonging to the same atom in one of the outer shell electron orbits of the atom forming a pair. Such an unshared electron pair is not involved in covalent bonding. Specifically, the term unshared electron pair as referred to in the present invention refers to a pair of unshared electrons that, among the unshared electron pairs of a heteroatom constituting a compound, is not involved in aromaticity and is not coordinated to a metal.

Here, aromaticity refers to an unsaturated cyclic structure in which atoms having $\pi$ electrons are arranged in a ring, which is aromaticity according to the so-called "Huckel's rule", with the condition that the number of electrons in the $\pi$ electron system on the ring is "4n+2" (n being an integer equal to or larger than 0).

Further, the metal affinity layer (1a) preferably has a thickness being preferably in the range of 1 to 100 nm, and more preferably in the range of 3 to 50 nm. Within this range, an effect can be obtained with any thickness. Specifically, a thickness of 100 nm or less is preferable, because when the thickness is 100 nm or less, the absorption component of the layer is reduced, and the transmittance of the transparent electrode improves. Further, a thickness of 3 nm or more is preferable, because when the thickness is 3 nm or more, a uniform and continuous metal affinity layer is formed.

In the present invention, specific examples of the silver affinity compound, which is an organic compound including a hetero atom having an unshared electron pair in the molecule, include compounds containing a sulfur atom having an unshared electron pair not involved in aromaticity, compounds containing a halogen atom having an unshared electron pair not involved in aromaticity, aromatic heterocyclic compounds containing a nitrogen atom having an unshared electron pair not involved in aromaticity, and the like.

(Silver Affinity Compound)

(1) Organic Compound Containing a Sulfur Atom

Examples of the organic compound containing a sulfur atom having an unshared electron pair not involved in aromaticity may include organic compounds having in the molecule a sulfide bond (also referred to as a thioether bond), a disulfide bond, a mercapto group, a sulfone group, a thiocarbonyl bond, or the like, and in particular, an organic compound having sulfide bond or a mercapto group is preferable.

Specifically, examples include sulfur-containing compounds represented by the following general formulas (1) to (4).

$R_1$—S—$R_2$  General Formula (1)

$R_3$—S—S—$R_4$  General Formula (2)

$R_5$—S—H  General Formula (3)

[Formula 2]

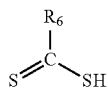

General Formula (4)

In the above general formula (1), $R_1$ and $R_2$ each independently represent a substituent.

Examples of the substituent represented by $R_1$ and $R_2$ include an alkyl group (e.g., a methyl group, an ethyl group, a propyl group, an isopropyl group, a tert-butyl group, a pentyl group, a hexyl group, an octyl group, a dodecyl group, a tridecyl group, a tetradecyl group, a pentadecyl group, etc.), a cycloalkyl group (e.g., a cyclopentyl group, a cyclohexyl group, etc.), an alkenyl group (e.g., a vinyl group, an allyl group, etc.), an alkynyl group (e.g., an ethynyl group, a propargyl group, etc.), an aromatic hydrocarbon group (also referred to as an aromatic carbocyclic group, an aryl group, and the like, e.g., a phenyl group, a p-chlorophenyl group, a mesityl group, a tolyl group, a xylyl group, a naphthyl group, an anthryl group, an azulenyl group, an acenaphthenyl group, a fluorenyl group, a phenanthryl group, an indenyl group, a pyrenyl group, a biphenylyl group, etc.), an aromatic heterocyclic group (e.g., a furyl group, a thienyl group, a pyridyl group, a pyridazinyl group, a pyrimidinyl group, a pyrazinyl group, a triazinyl group, an imidazolyl group, a pyrazolyl group, a thiazolyl group, a quinazolinyl group, a carbazolyl group, a carbolinyl group, a diazacarbazolyl group (representing a group in which one arbitrary carbon atom constituting the carboline ring of the carbolinyl group is substituted with a nitrogen atom), a phthalazinyl group, etc.), a heterocyclic group (e.g., a pyrrolidyl group, an imidazolidyl group, a morpholyl group, an oxazolidyl group, etc.), an alkoxy group (e.g., a methoxy group, an ethoxy group, a propyloxy group, a pentyloxy group, a hexyloxy group, an octyloxy group, a dodecyloxy group, etc.), a cycloalkoxy group (e.g., a cyclopentyloxy group, a cyclohexyloxy group, etc.), an aryloxy group (e.g., a phenoxy group, a naphthyloxy group, etc.), an alkylthio group (e.g. a methylthio group, an ethylthio group, a propylthio group, a pentylthio group, a hexylthio group, an octylthio group, a dodecylthio group, etc.), a cycloalkylthio group (e.g., a cyclopentylthio group, a cyclohexylthio group, etc.), an arylthio group (e.g., a phenylthio group, a naphthylthio group, etc.), an alkoxycarbonyl group (e.g., a methyloxycarbonyl group, an ethyloxycarbonyl group, a butyloxycarbonyl group, an octyloxycarbonyl group, a dodecyloxycarbonyl group, etc.), an aryloxycarbonyl group (e.g., a phenyloxycarbonyl group, a naphthyloxycarbonyl group, etc.), a sulfamoyl group (e.g., an aminosulfonyl group, a methylaminosulfonyl group, a dimethylaminosulfonyl group, a butylaminosulfonyl group, a hexylaminosulfonyl group, a cyclohexylaminosulfonyl group, an octylaminosulfonyl group, a dodecylaminosulfonyl group, a phenylaminosulfonyl group, a naphthylaminosulfonyl group, a 2-pyridylaminosulfonyl group, etc.), an acyl group (e.g., an acetyl group, an ethylcarbonyl group, a propylcarbonyl group, a pentylcarbonyl group, a cyclohexylcarbonyl group, an octylcarbonyl group, a 2-ethylhexylcarbonyl group, a dodecylcarbonyl group, a phenylcarbonyl group, a naphthylcarbonyl group, a pyridylcarbonyl group, etc.), an acyloxy group (e.g., an acetyloxy group, an ethylcarbonyloxy group, a butylcarbonyloxy group, an octylcarbonyloxy group, a dodecylcarbonyloxy group, a phenylcarbonyloxy group, etc.), an amido group (e.g., a methylcarbonylamino group, an ethylcarbonylamino group, a dimethylcarbonylamino group, a propylcarbonylamino group, a pentylcarbonylamino group, a cyclohexylcarbonylamino group, a 2-ethylhexylcarbonylamino group, an octylcarbonylamino group, a dodecylcarbonylamino group, a phenylcarbonylamino group, a naphthylcarbonylamino group, etc.), a carbamoyl group (e.g., an aminocarbonyl group, a methylaminocarbonyl group, a dimethylaminocarbonyl group, propylaminocarbonyl group, a pentylaminocarbonyl group, a cyclohexylaminocarbonyl group, an octylaminocarbonyl group, a 2-ethylhexylaminocarbonyl group, a dodecylaminocarbonyl group, a phenylaminocarbonyl group, a naphthylaminocarbonyl group, a 2-pyridylaminocarbonyl group, etc.), a ureido group (e.g., a methylureido group, an ethylureido group, a pentylureido group, a cyclohexylureido group, an octylureido group, a dodecylureido group, a phenylureido group, a naphthylureido group, a 2-pyridylaminoureido group, etc.), a sulfinyl group (e.g., a methylsulfinyl group, an ethylsulfinyl group, a butylsulfinyl group, a cyclohexylsulfinyl group, a 2-ethylhexylsulfinyl group, a dodecylsulfinyl group, a phenylsulfinyl group, a naphthylsulfinyl group, a 2-pyridylsulfinyl group, etc.), an alkylsulfonyl group (e.g., a methylsulfonyl group, an ethylsulfonyl group, a butylsulfonyl group, a cyclohexylsulfonyl group, a 2-ethylhexylsulfonyl group, a dodecylsulfonyl group, etc.), an arylsulfonyl group or a heteroarylsulfonyl group (e.g., a phenylsulfonyl group, a naphthylsulfonyl group, a 2-pyridylsulfonyl group, etc.), an amino group (e.g., an amino group, an ethylamino group, a dimethylamino group, a butylamino group, a cyclopentylamino group, a 2-ethylhexylamino group, a dodecylamino group, an anilino group, a naphthylamino group, a 2-pyridylamino group, a piperidyl group (also referred to as a piperidinyl group), a 2,2,6,6-tetramethylpiperidinyl group, etc.), a halogen atom (e.g., a fluorine atom, a chlorine atom, a bromine atom, etc.), a fluorohydrocarbon group (e.g., a fluoromethyl group, a trifluoromethyl group, a pentafluoroethyl group, a pentafluorophenyl group, etc.), a cyano group, a nitro group, a hydroxyl group, a mercapto group, a silyl group (e.g., a trimethylsilyl group, a triisopropylsilyl group, a triphenylsilyl group, a phenyldiethylsilyl group, etc.), a phosphate group (e.g., a dihexylphosphoryl group, etc.), a phosphite group (e.g., a diphenylphosphinyl group, etc.), a phosphono group, and the like.

In the above general formula (2), $R_3$ and $R_4$ each independently represent a substituent.

Examples of the substituent represented by $R_3$ and $R_4$ include the same substituents as those mentioned for $R_1$ and $R_3$.

In the above general formula (3), $R_5$ represents a substituent.

Examples of the substituent represented by $R_5$ include the same substituents as those mentioned for $R_1$ and $R_3$.

In the above general formula (4), $R_6$ represents a substituent.

Examples of the substituent represented by $R_6$ include the same substituents as those mentioned for $R_1$ and $R_3$.

Specific examples of the sulfur atom-containing organic compound applicable to the metal affinity layer according to the present invention will be described below.
[Formula 3]
1-1
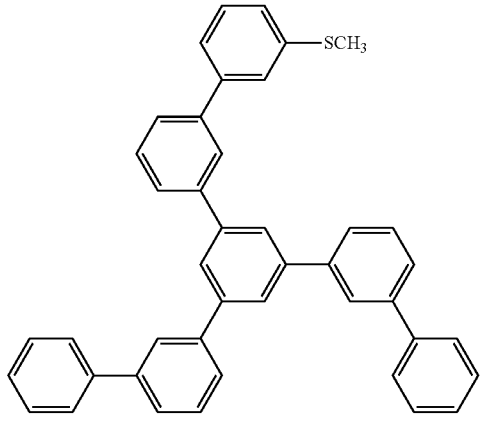
1-2
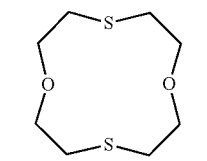
1-3
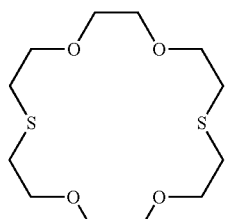
1-4
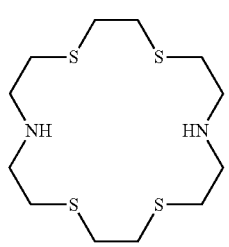
1-5
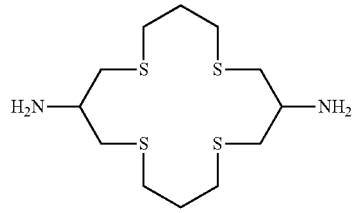
1-6
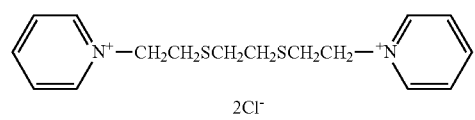
1-7
1-8
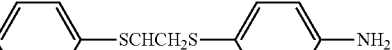
1-9
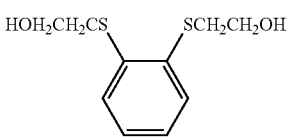
[Formula 4]
2-1
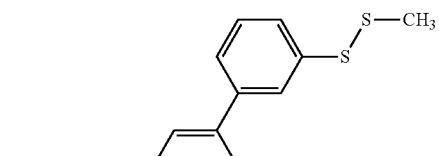
2-2
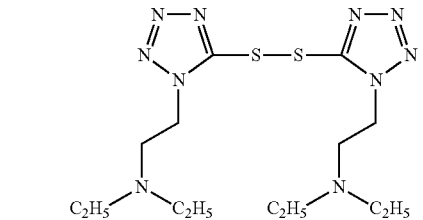
2-3
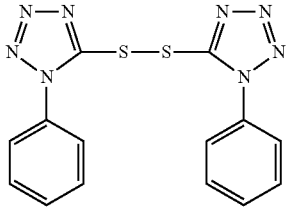
2-4
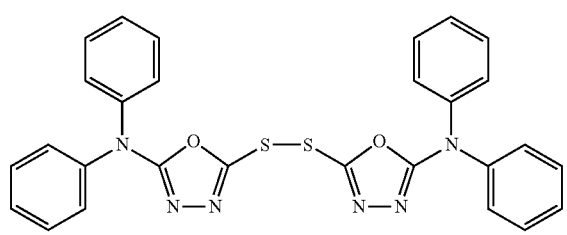

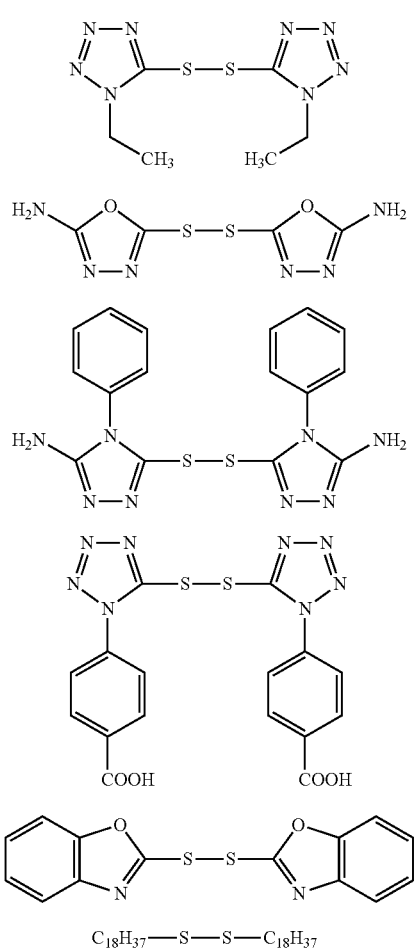
[Formula 5]
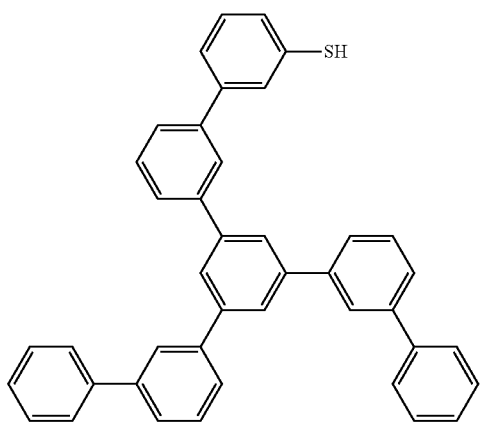
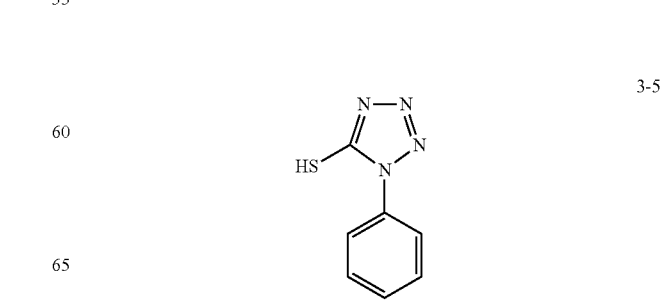

-continued
3-6
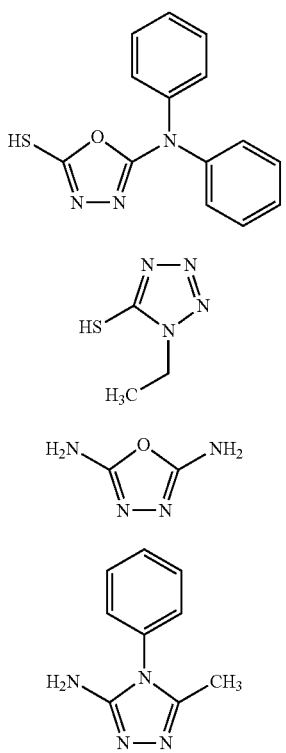
3-7
3-8
3-9
[Formula 6]
3-10
3-11
3-12
3-13
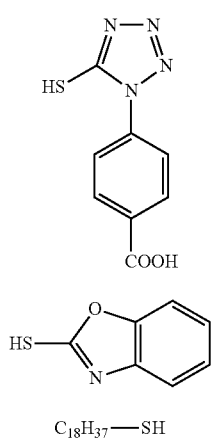
3-14
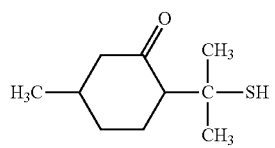
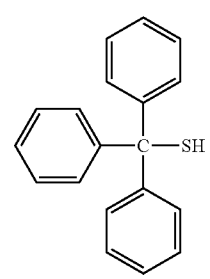
-continued
3-15
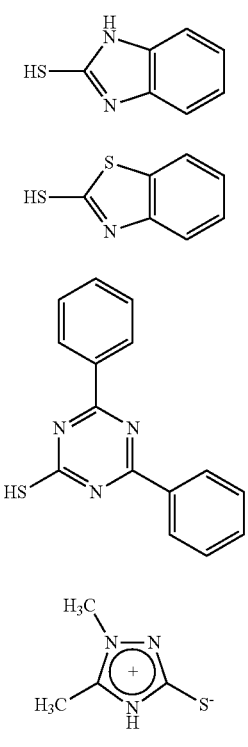
3-16
3-17
3-18
3-19
3-20
3-21
3-22

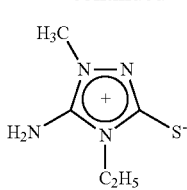

3-23

[Formula 7]

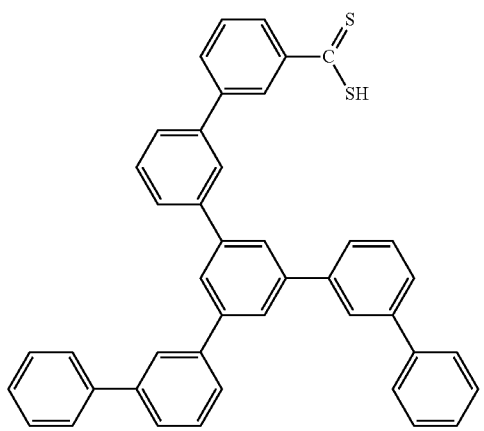

4-1

Further, among the organic compounds having a sulfur atom exemplified above, compounds represented by any one of general formulas (1) to (3) are preferable.

As the substituent represented by $R_1$ to $R_6$, an aromatic ring group is preferable, and a substituent having as a partial structure an aromatic heterocyclic compound including a nitrogen atom having an unshared electron pair not involved in aromaticity is particularly preferable.

Further, in the general formulas (1) to (3), an organic compound represented by the general formula (3) is preferable from the viewpoint of light-transmitting property and conductivity, and an organic compound represented by the general formula (1) is preferable from the viewpoint of light-transmitting property, conductivity, and durability.

(2) Organic Compound Containing a Halogen Atom

In the transparent electrode (1) of the present invention, as an organic compound including a hetero atom having an unshared electron pair in the molecule to be applied to the metal affinity layer (1a), it is preferable to use an organic compound containing a halogen atom having an unshared electron pair not involved in aromaticity.

The organic compound having a halogen atom applicable to the present invention is a compound including at least a halogen atom and a carbon atom. The structure of this organic compound is not particularly limited, but a halogenated aryl compound represented by the following general formula (5) is preferable.

Hereinafter, the halogenated aryl compound represented by the following general formula (5) suitable for the present invention will be described.

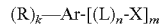 General Formula (5)

In the above general formula (5), Ar represents an aromatic hydrocarbon ring group or an aromatic heterocyclic group. X represents a halogen atom, and m denotes an integer of 1 to 5. L represents a direct bond or a divalent linking group, and n denotes 0 or 1. R represents a hydrogen atom or a ring-attached group. "k" denotes an integer of 1 to 5.

Examples of the aromatic hydrocarbon ring group (also referred to as an aromatic carbocyclic group or an aryl group) represented by Ar in the general formula (5) include a phenyl group, a p-chlorophenyl group, a mesityl group, a tolyl group, an xylyl group, a naphthyl group, an anthryl group, an azulenyl group, an acenaphthenyl group, a fluorenyl group, a phenanthryl group, an indenyl group, a pyrenyl group, a biphenylyl group, and the like Examples of the aromatic heterocyclic group represented by Ar include a pyridyl group, a pyrimidinyl group, a furyl group, a pyrrolyl group, an imidazolyl group, a benzimidazolyl group, a pyrazolyl group, a pyrazinyl group, a triazolyl group (e.g., a 1, 2, 4-triazol-1-yl group, a 1,2,3-triazol-1-yl group, etc.

In the present invention, Ar is preferably an aromatic hydrocarbon ring group, and more preferably a phenyl group.

Examples of the halogen atom represented by X include a fluorine atom, a chlorine atom, a bromine atom and an iodine atom. Among these, a chlorine atom, a bromine atom, or an iodine atom is preferable, and a bromine atom or an iodine atom is even more preferable.

"m" denotes an integer of 1 to 5, and preferably 1 or 2.

L represents a direct bond or a divalent linking group. Examples of the divalent linking group include an alkylene group (e.g., a methylene group, an ethylene group, a trimethylene group, a propylene group, etc.), a cycloalkylene group (e.g., a 1,2-cyclobutanediyl group, a 1,2-cyclopentanediyl group, a 1,3-cyclopentanediyl group, a 1,2-cyclohexanediyl group, a 1,3-cyclohexanediyl group, a 1,4-cyclohexanediyl group, a 1,2-cycloheptanediyl group, a 1,3-cycloheptanediyl group, a 1,4-cycloheptanediyl group, etc.), an arylene group (e.g., an o-phenylene group, an m-phenylene group, a p-phenylene group, a 1,2-naphthylene group, a 2,3-naphtholene group, a 1,3-naphthylene group, a 1,4-naphthylene group, a 2,7-naphthylene group etc.), a heteroarylene group (e.g., a thiophene-2,5-diyl group, a 2,6-pyridinediyl group, a 2,3-pyridinediyl group, a 2,4-pyridinediyl group, a 2,4-dibenzofurandiyl group, a 2,8-dibenzofuranediyl group, a 4,6-dibenzofurandiyl group, a 3,7-dibenzofurandiyl group, a 2,4-dibenzothiophenediyl group, a 2,8-dibenzothiophenediyl group, a 4,6-dibenzothiophenediyl group, a 3,7-dibenzothiophenediyl group, a 1,3-carbazolediyl group, a 1,8-carbazolediyl group, a 3,6-carbazolediyl group, a 2,7-carbazolediyl group, a 1,9-carbazolediyl group, a 2,9-carbazolediyl group, a 3,9-carbazolediyl group, a 4,9-carbazolediyl group, etc.), an —O— group, a CO— group, an —O—CO— group, a —CO—O— group, an —O—CO—O— group, a —S— group, a —SO— group, and —SO$_2$— group, and the like.

The divalent linking group represented by L is preferably an alkylene group, and more preferably a methylene group.

"n" denotes 0 or 1, and preferably 0.

R represents a hydrogen atom or a substituent. Examples of the substituent represented by R include an alkyl group (e.g., a methyl group, an ethyl group, a propyl group, an isopropyl group, a tert-butyl group, a pentyl group, a hexyl group, an octyl group, a dodecyl group, a tridecyl group, a tetradecyl group, a pentadecyl group, etc.), a cycloalkyl group (e.g., a cyclopentyl group, a cyclohexyl group, etc.), an alkenyl group (e.g., a vinyl group, an allyl group, etc.), an alkynyl group (e.g., an ethynyl group, a propargyl group, etc.), an aromatic hydrocarbon ring group (also referred to as an aromatic carbocyclic group, an aryl group, and the like, e.g., a phenyl group, a p-chlorophenyl group, a mesityl group, a tolyl group, a xylyl group, a naphthyl group, an anthryl group, an azulenyl group, an acenaphthenyl group, a fluorenyl group, a phenanthryl group, an indenyl group, a pyrenyl group, a biphenylyl group, etc.), an aromatic heterocyclic group (e.g., a pyridyl group, a pyrimidinyl group, a furyl group, a pyrrolyl group, an imidazolyl group, a benzimidazolyl group, a pyrazolyl group, a pyrazinyl group, a triazolyl group (e.g., a 1,2,4-triazol-1-yl group, a 1,2,3-triazol-1-yl group, etc.), an oxazolyl group, a benzoxazolyl group, a thiazolyl group, an isoxazolyl group, an isothiazolyl group, a furazanyl group, a thienyl group, a quinolyl group, a benzofuryl group, a dibenzofuryl group, a benzothienyl group, a dibenzothienyl group, an indolyl group, a carbazolyl group, a carbolinyl group, a diazacarbazolyl group (representing a group in which one of the carbon atoms constituting the carboline ring of the carbolinyl group is substituted with a nitrogen atom), a quinoxalinyl group, a pyridazinyl group, a triazinyl group, a quinazolinyl group, a phthalazinyl group, etc.), a heterocyclic group (e.g., a pyrrolidyl group, an imidazolidyl group, a morpholyl group, an oxazolidyl group, etc.), an alkoxy group (e.g., a methoxy group, an ethoxy group, a propyloxy group, a pentyloxy group, a hexyloxy group, an octyloxy group, a dodecyloxy group, etc.), a cycloalkoxy group (e.g., a cyclopentyloxy group, a cyclohexyloxy group, etc.), an aryloxy group (e.g., a phenoxy group, a naphthyloxy group, etc.), an alkylthio group (e.g. a methylthio group, an ethylthio group, a propylthio group, a pentylthio group, a hexylthio group, an octylthio group, a dodecylthio group, etc.), a cycloalkylthio group (e.g., a cyclopentylthio group, a cyclohexylthio group, etc.), an arylthio group (e.g., a phenylthio group, a naphthylthio group, etc.), an alkoxycarbonyl group (e.g., a methyloxycarbonyl group, an ethyloxycarbonyl group, a butyloxycarbonyl group, an octyloxycarbonyl group, a dodecyloxycarbonyl group, etc.), an aryloxycarbonyl group (e.g., a phenyloxycarbonyl group, a naphthyloxycarbonyl group, etc.), a sulfamoyl group (e.g., an aminosulfonyl group, a methylaminosulfonyl group, a dimethylaminosulfonyl group, a butylaminosulfonyl group, a hexylaminosulfonyl group, a cyclohexylaminosulfonyl group, an octylaminosulfonyl group, a dodecylaminosulfonyl group, a phenylaminosulfonyl group, a naphthylaminosulfonyl group, a 2-pyridylaminosulfonyl group, etc.), an acyl group (e.g., an acetyl group, an ethylcarbonyl group, a propylcarbonyl group, a pentylcarbonyl group, a cyclohexylcarbonyl group, an octylcarbonyl group, a 2-ethylhexylcarbonyl group, a dodecylcarbonyl group, a phenylcarbonyl group, a naphthylcarbonyl group, a pyridylcarbonyl group, etc.), an acyloxy group (e.g., an acetyloxy group, an ethylcarbonyloxy group, a butylcarbonyloxy group, an octylcarbonyloxy group, a dodecylcarbonyloxy group, a phenylcarbonyloxy group, etc.), an amido group (e.g., a methylcarbonylamino group, an ethylcarbonylamino group, a dimethylcarbonylamino group, a propylcarbonylamino group, a pentylcarbonylamino group, a cyclohexylcarbonylamino group, a 2-ethylhexylcarbonylamino group, an octylcarbonylamino group, a dodecylcarbonylamino group, a phenylcarbonylamino group, a naphthylcarbonylamino group, etc.), a carbamoyl group (e.g., an aminocarbonyl group, a methylaminocarbonyl group, a dimethylaminocarbonyl group, propylaminocarbonyl group, a pentylaminocarbonyl group, a cyclohexylaminocarbonyl group, an octylaminocarbonyl group, a 2-ethylhexylaminocarbonyl group, a dodecylaminocarbonyl group, a phenylaminocarbonyl group, a naphthylaminocarbonyl group, a 2-pyridylaminocarbonyl group, etc.), a ureido group (e.g., a methylureido group, an ethylureido group, a pentylureido group, a cyclohexylureido group, an octylureido group, a dodecylureido group, a phenylureido group, a naphthylureido group, a 2-pyridylaminoureido group, etc.), a sulfinyl group (e.g., a methylsulfinyl group, an ethylsulfinyl group, a butylsulfinyl group, a cyclohexylsulfinyl group, a 2-ethylhexylsulfinyl group, a dodecylsulfinyl group, a phenylsulfinyl group, a naphthylsulfinyl group, a 2-pyridylsulfinyl group, etc.), an alkylsulfonyl group (e.g., a methylsulfonyl group, an ethylsulfonyl group, a butylsulfonyl group, a cyclohexylsulfonyl group, a 2-ethylhexylsulfonyl group, a dodecylsulfonyl group, etc.), an arylsulfonyl group or a heteroarylsulfonyl group (e.g., a phenylsulfonyl group, a naphthylsulfonyl group, a 2-pyridylsulfonyl group, etc.), an amino group (e.g., an amino group, an ethylamino group, a dimethylamino group, a butylamino group, a cyclopentylamino group, a 2-ethylhexylamino group, a dodecylamino group, an anilino group, a naphthylamino group, a 2-pyridylamino group, etc.), a cyano group, a nitro group, a hydroxyl group, a mercapto group, a silyl group (e.g., a trimethylsilyl group, a triisopropylsilyl group, a triphenylsilyl group, a phenyldiethylsilyl group, etc.), a halogen atom (e.g., a fluorine atom, a chlorine atom, a bromine atom, an iodine atom, etc.) and the like. Among these substituents, an aryl group is preferable, and more preferable is a group further having a plurality of aryl groups, and a structure in which those aryl groups are further substituted with a halogen atom are even more preferable.

"k" denotes an integer of 1 to 5.

Specific examples of the organic compound having a halogen atom include Compounds (1) to (61) described in paragraphs [0070] to [0079] of Japanese Patent Laid-Open No. 2015-122184.

(3) Aromatic Heterocyclic Compound Containing a Nitrogen Atom Having an Unshared Electron Pair not Involved in Aromaticity As the compound including a hetero atom having an unshared electron pair in the molecule according to the present invention, it is preferable to use an aromatic heterocyclic compound containing a nitrogen atom having an unshared electron pair not involved in aromaticity, and more preferable is a low molecular weight organic compound (not a polymer compound) containing a nitrogen atom. The molecular weight of the low molecular weight organic compound is preferably in the range of 150 to 1200, and more preferably in the range of 650 to 1000. By setting the molecular weight within such a range, it is possible to improve amorphous properties while maintaining the film density, and it is possible to form a film having excellent film stability and a low surface roughness.

The low molecular weight organic compound containing a nitrogen atom is preferably a compound having a melting point of 80° C. or more and a molecular weight M within the range of 150 to 1200. Further, it is preferable that the low molecular organic compound containing a nitrogen atom has a large interaction with silver or the like. Examples thereof include nitrogen-containing heterocyclic compounds and phenyl group-substituted amine compounds.

When the value of the ratio of the number n of "effective unshared electron pairs" to the molecular weight M of the organic compound containing a nitrogen atom is defined as the effective unshared electron pair content ratio [n/M], it is preferable that the low molecular weight organic compound containing a nitrogen atom is a compound selected such that [n/M] is $2.0 \times 10^{-3} \leq [n/M]$, more preferably $3.9 \times 10^{-3} \leq [n/M]$, and even more preferably $7.0 \times 10^{-3} \leq [n/M]$.

The term "effective unshared electron pairs" as referred to herein refers to, as described above, among the unshared electron pairs of the nitrogen atom contained in the compound, the unshared electron pairs not involved in aromaticity and not coordinated to a metal.

As stated above, aromaticity refers to an unsaturated cyclic structure in which atoms having π electrons are arranged in a ring, which is aromaticity according to the so-called "Huckel's rule", with the condition that the number of electrons in the π electron system on the ring is "4n+2" (n being zero or a natural number).

The "effective unshared electron pairs" as described above are selected based on whether an unshared electron pair possessed by the nitrogen atom is involved in aromaticity or not, regardless of whether or not the nitrogen atom having the unshared electron pair is itself a hetero atom constituting the aromatic ring. For example, even if a given nitrogen atom is a heteroatom constituting the aromatic ring, if that nitrogen atom has an unshared electron pair not involved in aromaticity, that unshared electron pair is counted as an "effective unshared electron pair".

On the other hand, even when a given nitrogen atom is not a heteroatom constituting the aromatic ring, if all the unshared electron pairs of that nitrogen atom are involved in aromaticity, the unshared electron pairs of that nitrogen atom are not counted as an "effective unshared electron pair".

In each compound, the number n of the above-mentioned "effective unshared electron pairs" matches the number of nitrogen atoms having "effective unshared electron pairs".

When the organic compound having a nitrogen atom is constituted using a plurality of compounds, it is preferable that an average value of the effective unshared electron pair content ratio [n/M] be within the above-mentioned predetermined range. This average value may be calculated by, for example, determining the molecular weight M of the mixed compound in which those compounds are mixed based on the mixing ratio of the compounds, and taking the total number n of "effective unshared electron pairs" with respect to the molecular weight M to be the average value.

Hereinafter, as the low molecular weight organic compound containing a nitrogen atom, the following Example Compounds No. 1 to No. 42 are illustrated as compounds satisfying the above-mentioned effective unshared electron pair content ratio [n/M] of $2.0 \times 10^{-3} \leq [n/M]$.

Note that in the copper phthalocyanine of Example Compound No. 31 illustrated below, among the unshared electron pairs of the nitrogen atom, the unshared electron pairs not coordinated to copper are counted as "effective unshared electron pairs".

[Formula 8]

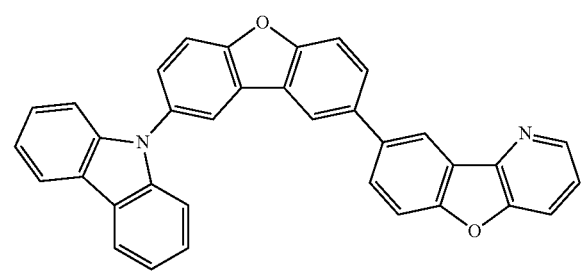

No. 1

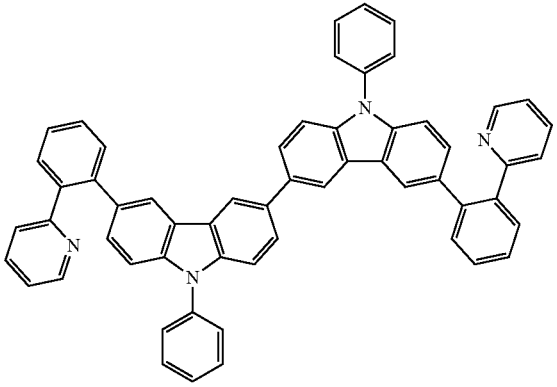

No. 2

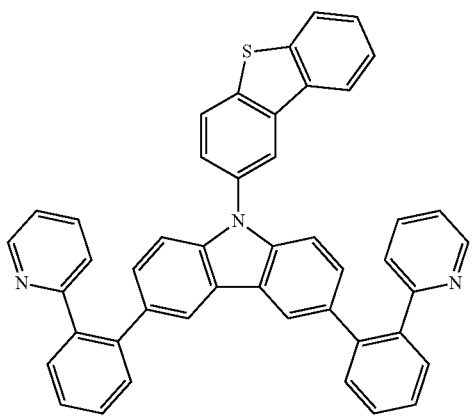

No. 3

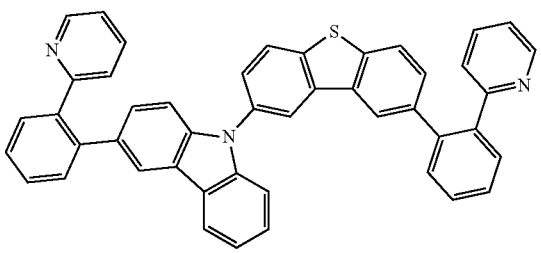

No. 4

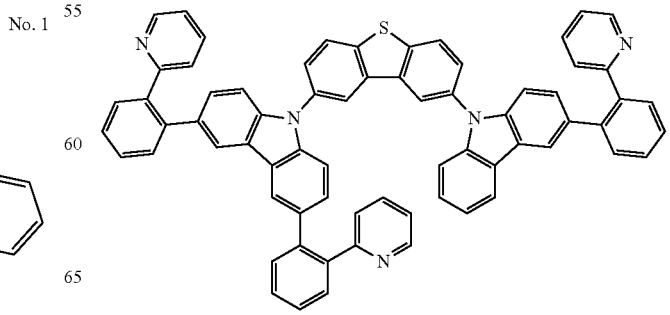

No. 5

No. 6
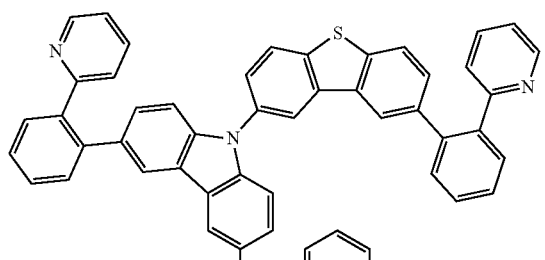
No. 7
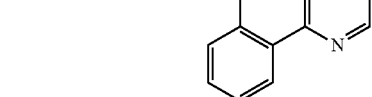
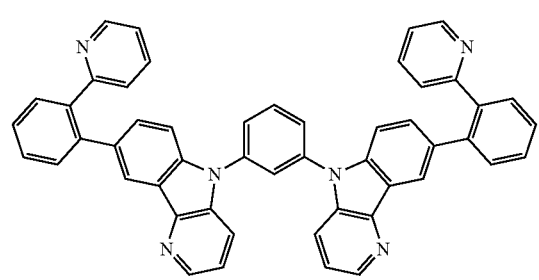
[Formula 9]
No. 8
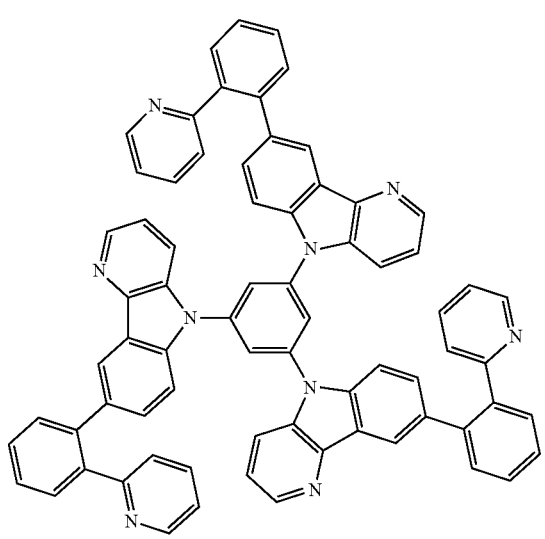
No. 9
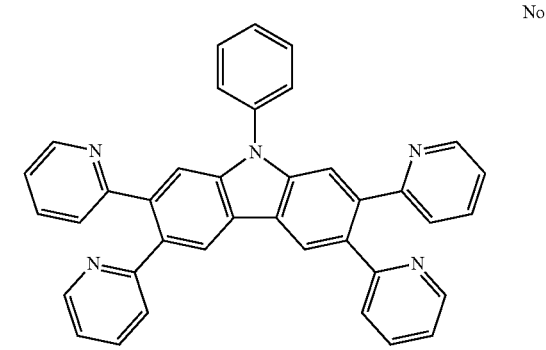
No. 10
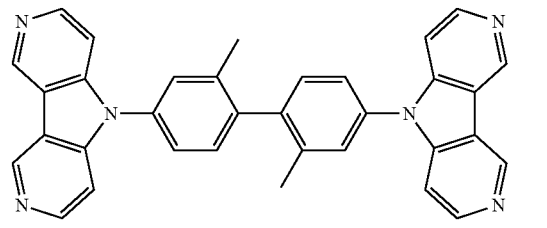
No. 11
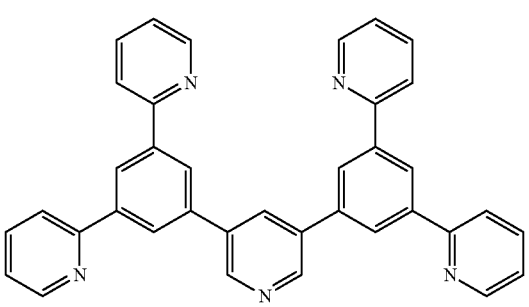
No. 12
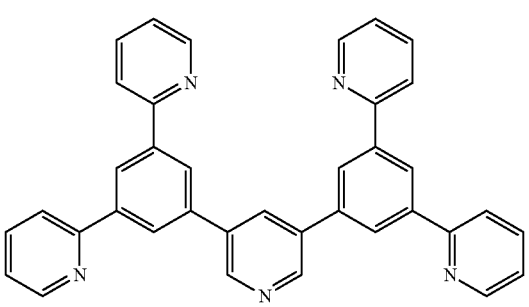
No. 13
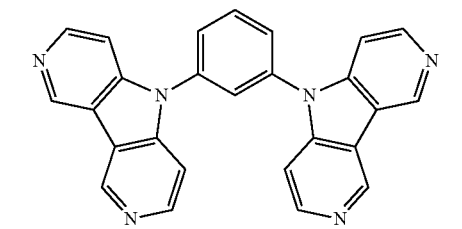
No. 14
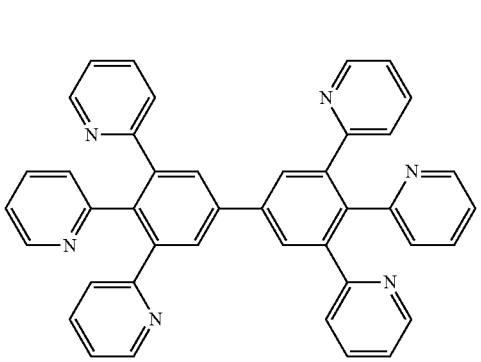

No. 15
No. 16
[Formula 10]
No. 17
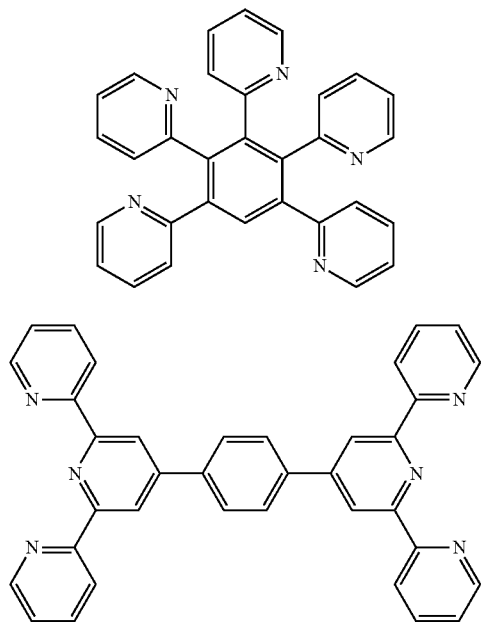
No. 18
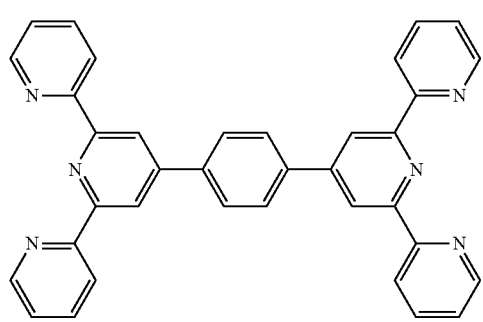
No. 19
No. 20
No. 21
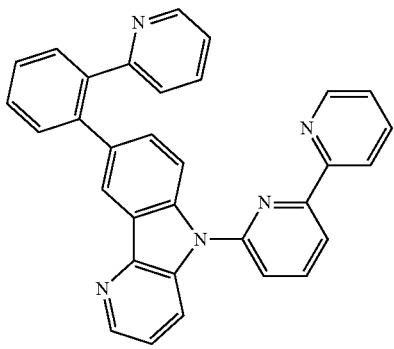
No. 22
No. 23
[Formula 11]
No. 24
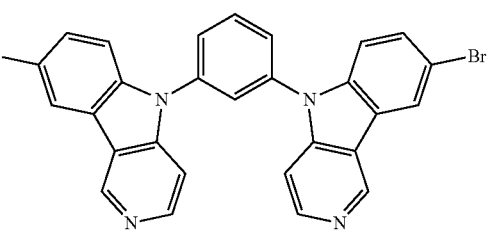

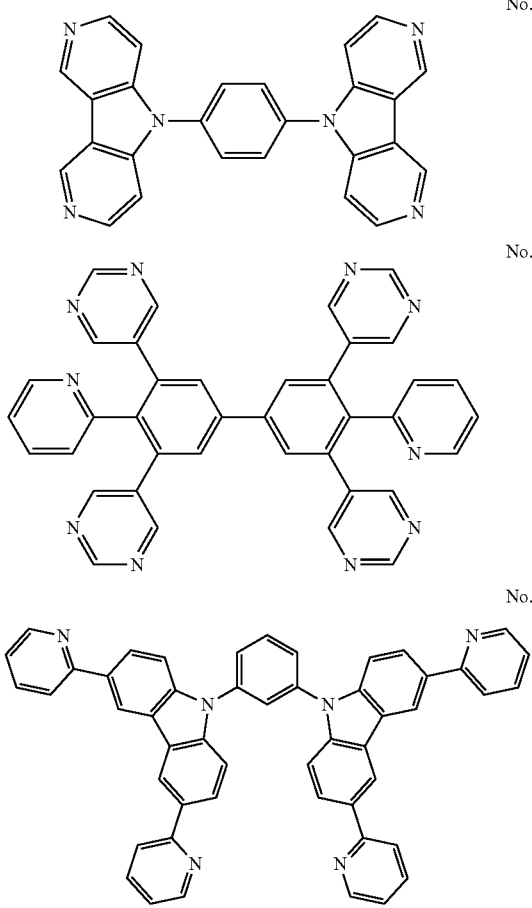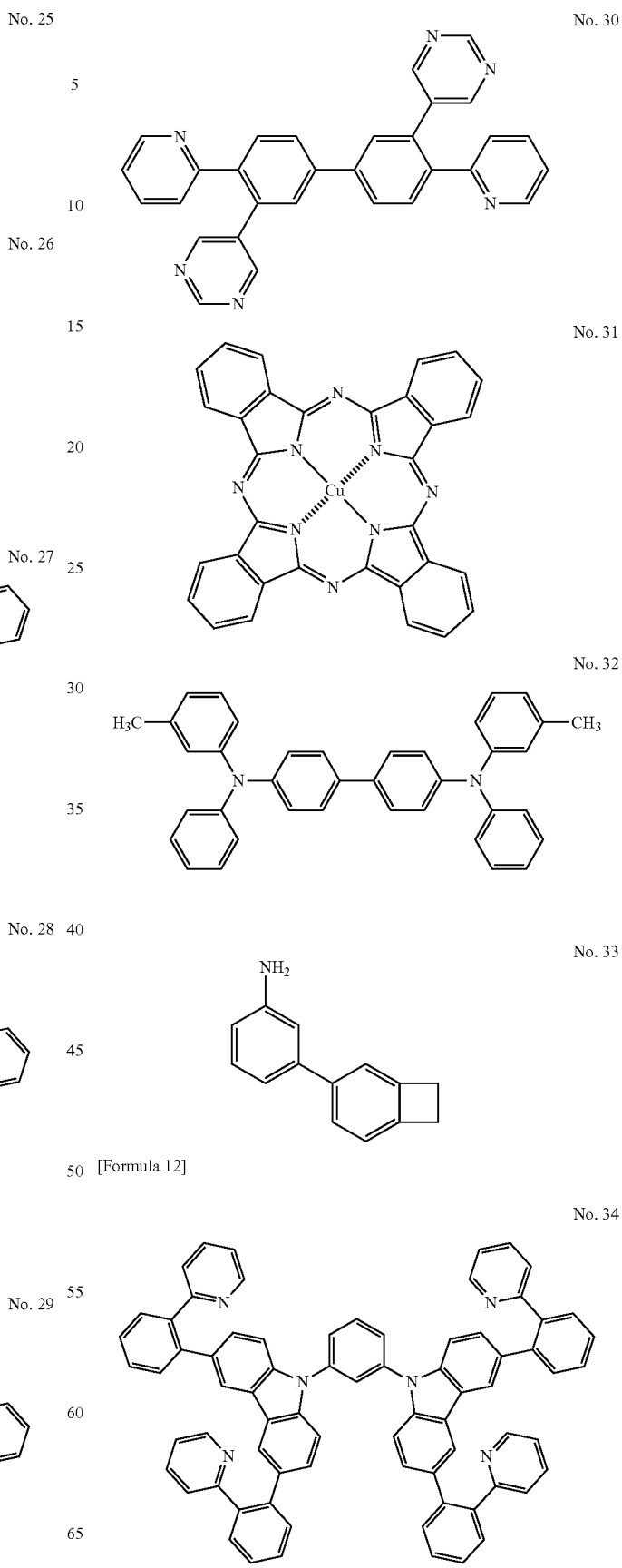

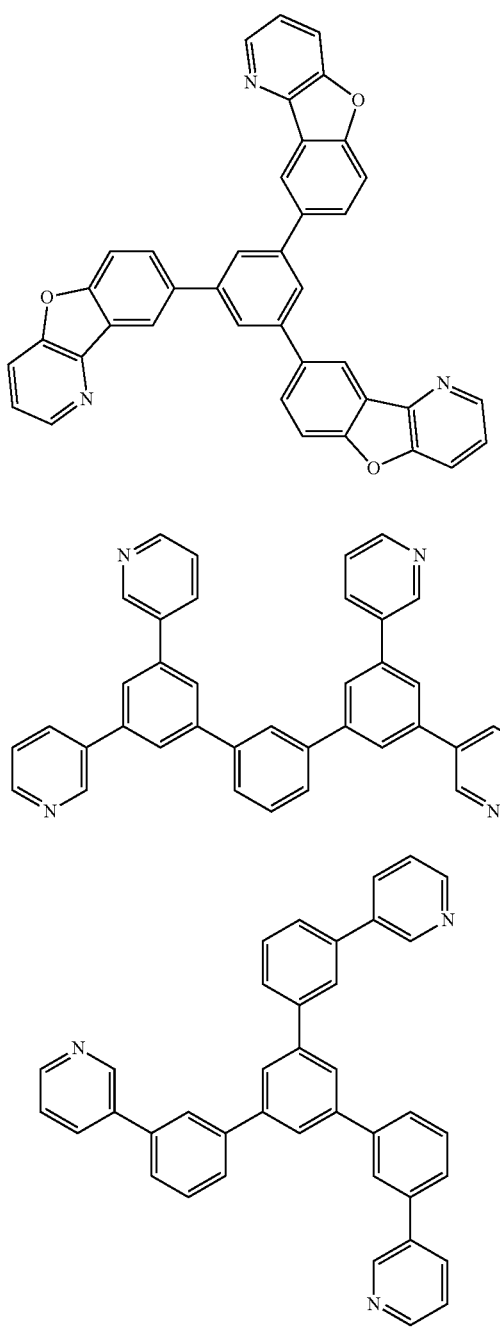
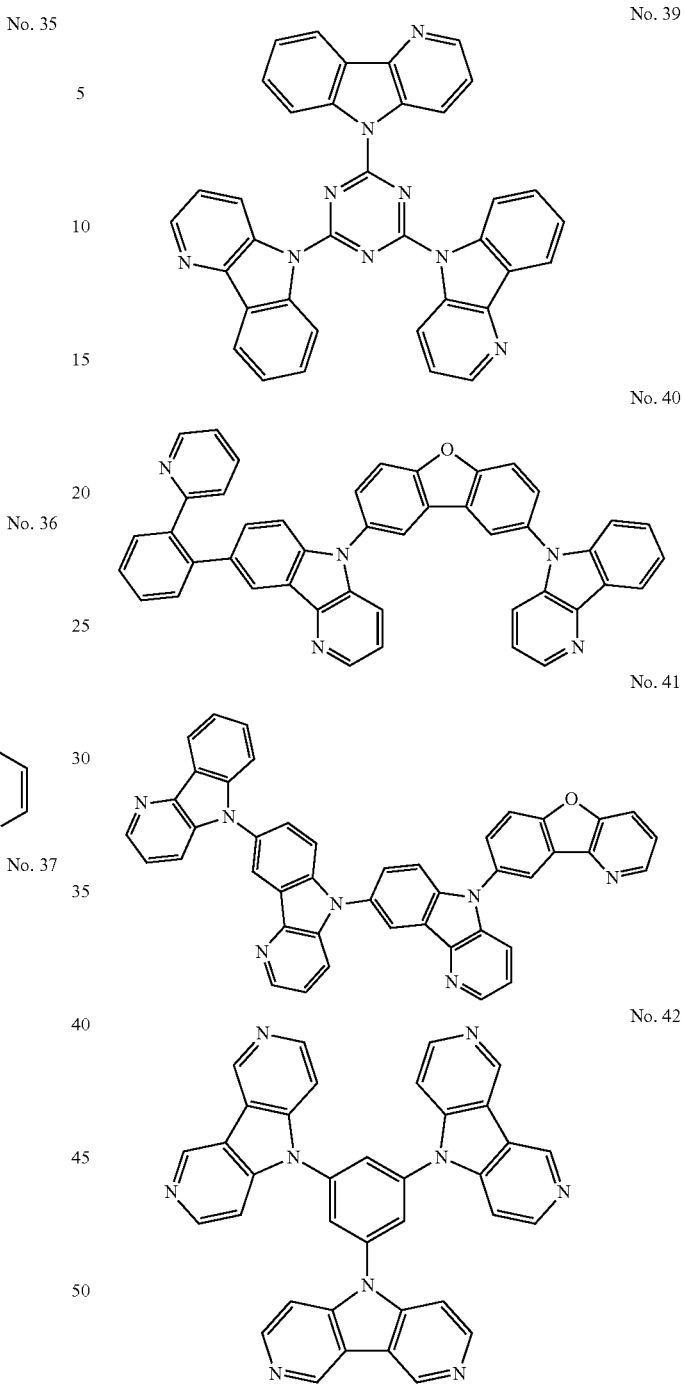
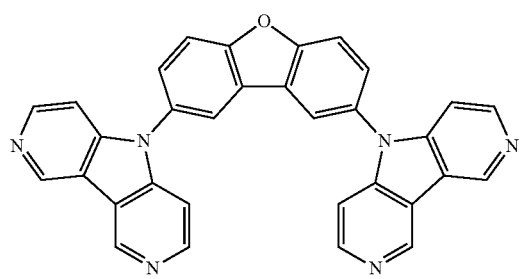
The number (n) of "effective unshared electron pairs", the molecular weight (M), and the effective unshared electron pair content ratio (n/M) of the above-mentioned Compounds No. 1 to No. 42 are shown in Table I.
TABLE 1
| Example Compound No. | Number (n) of Effective Unshared Electron Pairs | Molecular Weight (M) | Effective Unshared Electron Pair Content Ratio [n/M] |
|---|---|---|---|
| No. 1 | 1 | 500.55 | 0.0020 |
| No. 2 | 2 | 790.95 | 0.0025 |

TABLE 1-continued

| Example Compound No. | Number (n) of Effective Unshared Electron Pairs | Molecular Weight (M) | Effective Unshared Electron Pair Content Ratio [n/M] |
| --- | --- | --- | --- |
| No. 3 | 2 | 655.81 | 0.0030 |
| No. 4 | 2 | 655.81 | 0.0030 |
| No. 5 | 3 | 974.18 | 0.0031 |
| No. 6 | 3 | 808.99 | 0.0037 |
| No. 7 | 4 | 716.83 | 0.0056 |
| No. 8 | 6 | 1036.19 | 0.0058 |
| No. 9 | 4 | 551.64 | 0.0073 |
| No. 10 | 4 | 516.60 | 0.0077 |
| No. 11 | 5 | 539.63 | 0.0093 |
| No. 12 | 6 | 646.76 | 0.0093 |
| No. 13 | 4 | 412.45 | 0.0097 |
| No. 14 | 6 | 616.71 | 0.0097 |
| No. 15 | 5 | 463.53 | 0.0108 |
| No. 16 | 6 | 540.62 | 0.0111 |
| No. 17 | 9 | 543.58 | 0.0166 |
| No. 18 | 6 | 312.33 | 0.0192 |
| No. 19 | 6 | 540.62 | 0.0111 |
| No. 20 | 4 | 475.54 | 0.0084 |
| No. 21 | 2 | 672.41 | 0.0030 |
| No. 22 | 4 | 1021.21 | 0.0039 |
| No. 23 | 6 | 312.33 | 0.0192 |
| No. 24 | 2 | 568.26 | 0.0035 |
| No. 25 | 4 | 412.45 | 0.0097 |
| No. 26 | 10 | 620.66 | 0.0161 |
| No. 27 | 4 | 716.63 | 0.0056 |
| No. 28 | 5 | 717.82 | 0.0070 |
| No. 29 | 5 | 717.82 | 0.0070 |
| No. 30 | 6 | 464.52 | 0.0129 |
| No. 31 | 4 | 576.10 | 0.0069 |
| No. 32 | 2 | 516.67 | 0.0039 |
| No. 33 | 1 | 195.26 | 0.0051 |
| No. 34 | 4 | 1021.21 | 0.0039 |
| No. 35 | 3 | 579.60 | 0.0052 |
| No. 36 | 4 | 538.64 | 0.0074 |
| No. 37 | 3 | 537.65 | 0.0056 |
| No. 38 | 4 | 502.15 | 0.0080 |
| No. 39 | 6 | 579.19 | 0.0104 |
| No. 40 | 3 | 653.22 | 0.0046 |
| No. 41 | 4 | 667.21 | 0.0060 |
| No. 42 | 6 | 579.19 | 0.0104 |

Further examples of the low molecular weight organic compound containing a nitrogen atom include, in addition to Compounds No. 1 to No. 42 described above, the following Compounds No. 43 and No. 44.

[Formula 14]

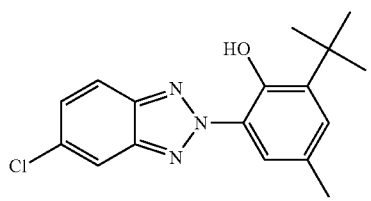

No.43

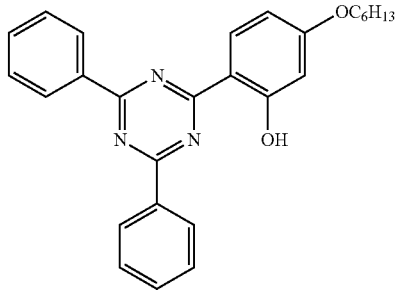

No.44

Further, it is particularly preferable that the organic compound contained in the metal affinity layer (1a) be a compound having a partial structure represented by the following general formulas (I) to (IV).

(Compound Having Partial Structure Represented by General formula (I)) In the transparent electrode (1) of the present invention, the compound contained in the metal affinity layer (1a) is preferably a compound having a partial structure represented by the following general formula (I).

[Formula 15]

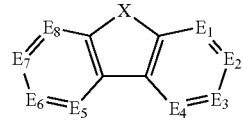

General Formula (I)

In the general formula (I), X represents $NR_1$, an oxygen atom, or a sulfur atom. $E_1$ to $E_8$ each independently represent $CR_2$ or a nitrogen atom. $R_1$ and $R_2$ each independently represent a hydrogen atom or a substituent. In the general formula (I), it is particularly preferable that at least one of $E_1$ to $E_8$ be a nitrogen atom.

In the general formula (I), examples of the substituent represented by $R_1$ include an alkyl group (e.g., a methyl group, an ethyl group, a propyl group, an isopropyl group, a tert-butyl group, a pentyl group, a hexyl group, an octyl group, a dodecyl group, a tridecyl group, a tetradecyl group, a pentadecyl group, etc.), a cycloalkyl group (e.g., a cyclopentyl group, a cyclohexyl group, etc.), an alkenyl group (e.g., a vinyl group, an allyl group, etc.), an alkynyl group (e.g., an ethynyl group, a propargyl group, etc.), an aromatic hydrocarbon group (also referred to as an aromatic carbocyclic group, an aryl group, and the like, e.g., a phenyl group, a p-chlorophenyl group, a mesityl group, a tolyl group, a xylyl group, a naphthyl group, an anthryl group, an azulenyl group, an acenaphthenyl group, a fluorenyl group, a phenanthryl group, an indenyl group, a pyrenyl group, a biphenylyl group, etc.), an aromatic heterocyclic group (e.g., a furyl group, a thienyl group, a pyridyl group, a pyridazinyl group, a pyrimidinyl group, a pyrazinyl group, a triazinyl group, an imidazolyl group, a pyrazolyl group, a thiazolyl group, a quinazolinyl group, a carbazolyl group, a carbolinyl group, a diazacarbazolyl group (representing a group in which one arbitrary carbon atom constituting the carboline ring of the carbolinyl group is substituted with a nitrogen atom), a phthalazinyl group, etc.), a heterocyclic group (e.g., a pyrrolidyl group, an imidazolidyl group, a morpholyl group, an oxazolidyl group, etc.), an alkoxy group (e.g., a methoxy group, an ethoxy group, a propyloxy group, a pentyloxy group, a hexyloxy group, an octyloxy group, a dodecyloxy group, etc.), a cycloalkoxy group (e.g., a cyclopentyloxy group, a cyclohexyloxy group, etc.), an aryloxy group (e.g., a phenoxy group, a naphthyloxy group, etc.), an alkylthio group (e.g. a methylthio group, an ethylthio group, a propylthio group, a pentylthio group, a hexylthio group, an octylthio group, a dodecylthio group, etc.), a cycloalkylthio group (e.g., a cyclopentylthio group, a cyclohexylthio group, etc.), an arylthio group (e.g., a phenylthio group, a naphthylthio group, etc.), an alkoxycarbonyl group (e.g., a methyloxycarbonyl group, an ethyloxycarbonyl group, a butyloxycarbonyl group, an octyloxycarbonyl group, a dodecyloxycarbonyl group, etc.), an aryloxycarbonyl group (e.g., a phenyloxycarbonyl group, a naphthyloxycarbonyl group, etc.), a sulfamoyl group (e.g., an aminosulfonyl group, a methylaminosulfonyl group, a dimethylaminosulfonyl group, a butylaminosulfonyl group, a hexylaminosulfonyl group, a cyclohexylaminosulfonyl group, an octylaminosulfonyl group, a dodecylaminosulfonyl group, a phenylaminosulfonyl group, a naphthylaminosulfonyl group, a 2-pyridylaminosulfonyl group, etc.), an acyl group (e.g., an acetyl group, an ethylcarbonyl group, a propylcarbonyl group, a pentylcarbonyl group, a cyclohexylcarbonyl group, an octylcarbonyl group, a 2-ethylhexylcarbonyl group, a dodecylcarbonyl group, a phenylcarbonyl group, a naphthylcarbonyl group, a pyridylcarbonyl group, etc.), an acyloxy group (e.g., an acetyloxy group, an ethylcarbonyloxy group, a butylcarbonyloxy group, an octylcarbonyloxy group, a dodecylcarbonyloxy group, a phenylcarbonyloxy group, etc.), an amido group (e.g., a methylcarbonylamino group, an ethylcarbonylamino group, a dimethylcarbonylamino group, a propylcarbonylamino group, a pentylcarbonylamino group, a cyclohexylcarbonylamino group, a 2-ethylhexylcarbonylamino group, an octylcarbonylamino group, a dodecylcarbonylamino group, a phenylcarbonylamino group, a naphthylcarbonylamino group, etc.), a carbamoyl group (e.g., an aminocarbonyl group, a methylaminocarbonyl group, a dimethylaminocarbonyl group, propylaminocarbonyl group, a pentylaminocarbonyl group, a cyclohexylaminocarbonyl group, an octylaminocarbonyl group, a 2-ethylhexylaminocarbonyl group, a dodecylaminocarbonyl group, a phenylaminocarbonyl group, a naphthylaminocarbonyl group, a 2-pyridylaminocarbonyl group, etc.), a ureido group (e.g., a methylureido group, an ethylureido group, a pentylureido group, a cyclohexylureido group, an octylureido group, a dodecylureido group, a phenylureido group, a naphthylureido group, a 2-pyridylaminoureido group, etc.), a sulfinyl group (e.g., a methylsulfinyl group, an ethylsulfinyl group, a butylsulfinyl group, a cyclohexylsulfinyl group, a 2-ethylhexylsulfinyl group, a dodecylsulfinyl group, a phenylsulfinyl group, a naphthylsulfinyl group, a 2-pyridylsulfinyl group, etc.), an alkylsulfonyl group (e.g., a methylsulfonyl group, an ethylsulfonyl group, a butylsulfonyl group, a cyclohexylsulfonyl group, a 2-ethylhexylsulfonyl group, a dodecylsulfonyl group, etc.), an arylsulfonyl group or a heteroarylsulfonyl group (e.g., a phenylsulfonyl group, a naphthylsulfonyl group, a 2-pyridylsulfonyl group, etc.), an amino group (e.g., an amino group, an ethylamino group, a dimethylamino group, a butylamino group, a cyclopentylamino group, a 2-ethylhexylamino group, a dodecylamino group, an anilino group, a naphthylamino group, a 2-pyridylamino group, a piperidyl group (also referred to as a piperidinyl group), a 2,2,6,6-tetramethylpiperidinyl group, etc.), a halogen atom (e.g., a fluorine atom, a chlorine atom, a bromine atom, etc.), a fluorohydrocarbon group (e.g., a fluoromethyl group, a trifluoromethyl group, a pentafluoroethyl group, a pentafluorophenyl group, etc.), a cyano group, a nitro group, a hydroxyl group, a mercapto group, a silyl group (e.g., a trimethylsilyl group, a triisopropylsilyl group, a triphenylsilyl group, a phenyldiethylsilyl group, etc.), a phosphate group (e.g., a dihexylphosphoryl group, etc.), a phosphite group (e.g., a diphenylphosphinyl group, etc.), a phosphono group, and the like.

In the general formula (I), examples of the substituent represented by $R_2$ may include the same substituents as those represented by $R_1$.

[Compound Having Partial Structure Represented by General Formula (II)]

The compound having a partial structure represented by the above general formula (I) is preferably a compound having a partial structure represented by the following general formula (II).

[Formula 16]

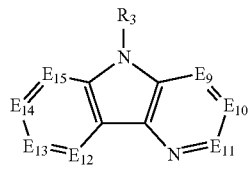

General Formula (II)

In the general formula (II), $E_9$ to $E_{15}$ each independently represent $CR_4$. $R_3$ and $R_4$ each independently represent a hydrogen atom or a substituent.

In the general formula (II), examples of the substituent represented by $R_3$ and $R_4$ may include the same substituents as those represented by $R_1$ in the above general formula (I).

[Compound Having Structure Represented by General Formula (III)]

The compound having a structure represented by the above general formula (I) is preferably a compound having a structure represented by the following general formula (III).

[Formula 17]

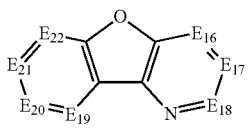

General Formula (III)

In the general formula (III), $E_{16}$ to $E_{22}$ each independently represent $CR_5$. $R_5$ represents a hydrogen atom or a substituent.

In the general formula (III), examples of the substituent represented by $R_5$ may include the same substituents as those represented by $R_1$ in the above general formula (I).

[Compound Having Structure Represented by General Formula (IV)]

The compound having a structure represented by the above general formula (I) is preferably a compound having a structure represented by the following general formula (IV).

[Formula 18]

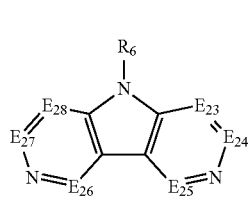

General Formula (IV)

In the general formula (IV), $E_{23}$ to $E_{28}$ each independently represent $CR_7$. $R_6$ and $R_7$ each independently represent a hydrogen atom or a substituent.

In the general formula (IV), examples of the substituent represented by $R_6$ and $R_7$ may include the same substituents as those represented by $R_1$ in the above formula (I).

[Specific Examples of Organic Compound Contained in Metal Affinity Layer]

In the present invention, the organic compound contained in the metal affinity layer is preferably an organic compound having a LUMO energy level in the range of −2.2 to −1.6 eV, and more preferably in the range of −2.05 to −1.75 eV.

When the LUMO energy level is more than −1.6 eV, the energy level is far from that of silver (work function: −4.3 eV). As a result, the interaction between electron orbits is reduced, aggregation of silver cannot be suppressed, and film quality deteriorates. When the LUMO energy level is smaller than −2.2 eV, electrons and excitons flow from the light-emitting layer, and the luminous efficiency deteriorates.

Specific examples of the organic compound contained in the metal affinity layer (1a) according to the present invention (Example Compound Nos. 45 to No. 100 and their LUMO energy levels (eV) are shown below, although the organic compound is not limited to these.

[Formula 19]

No.45

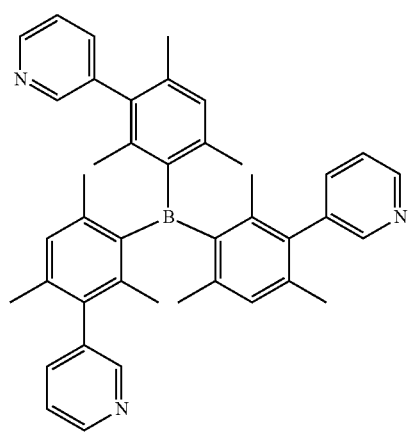

LUMO: -1.76

No.46

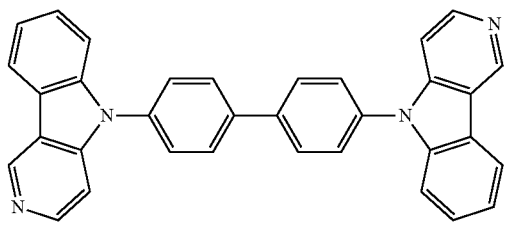

LUMO: -1.79

No.47

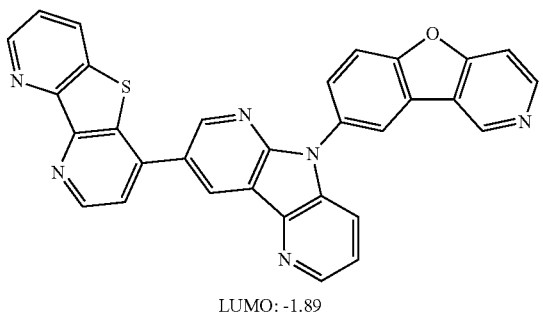

LUMO: -1.89

No.48

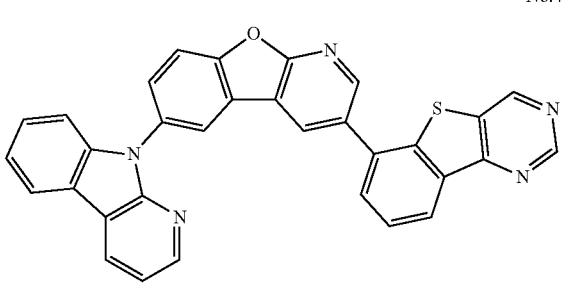

LUMO: -1.88

No.49

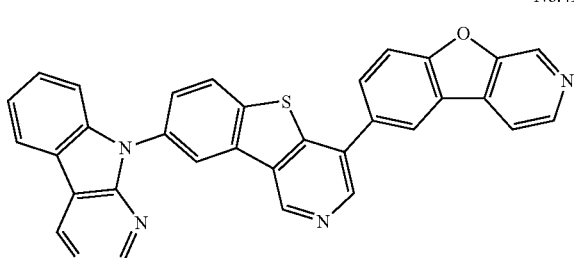

LUMO: -1.90

-continued
No.50
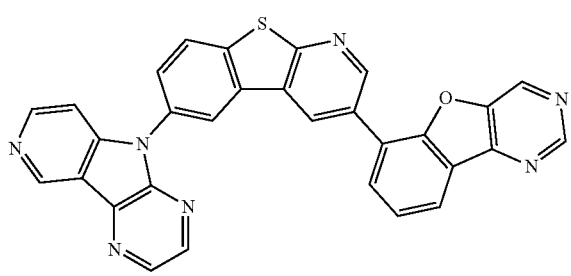
LUMO: -1.94
[Formula 20]
No.51
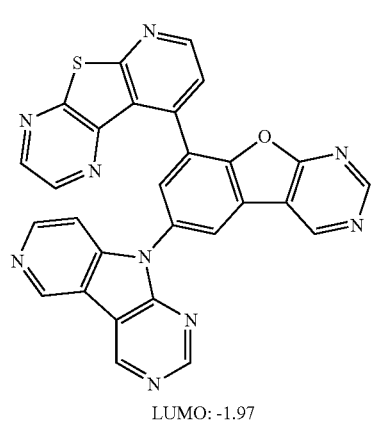
LUMO: -1.97
No.52
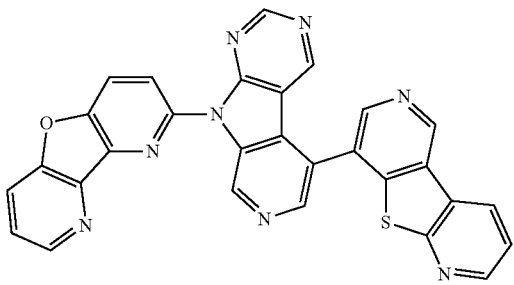
LUMO: -1.94
No.53
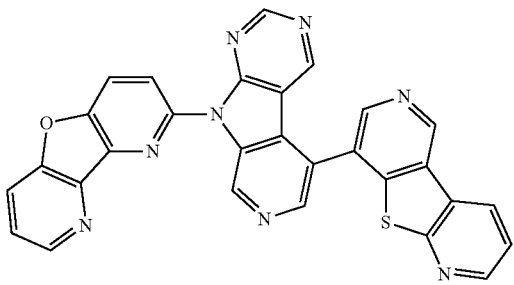
LUMO: -1.89
-continued
No.54
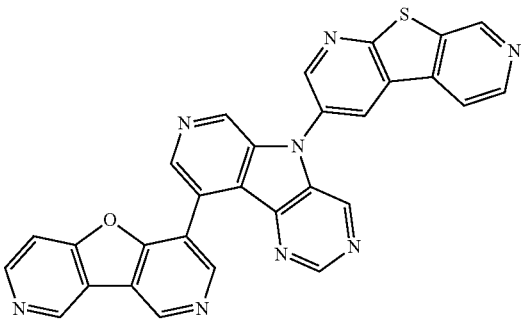
LUMO: -1.94
No.55
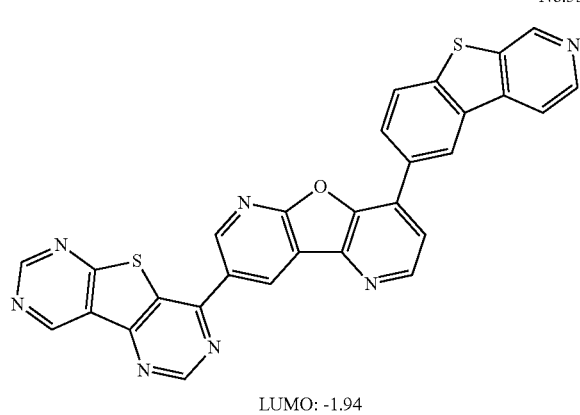
LUMO: -1.94
No.56
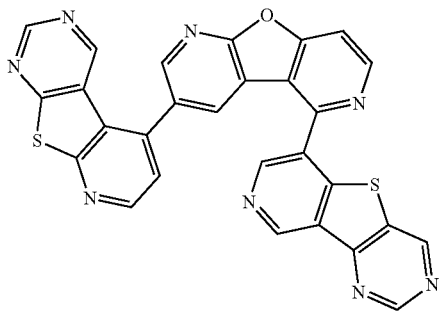
LUMO: -1.92
No.57
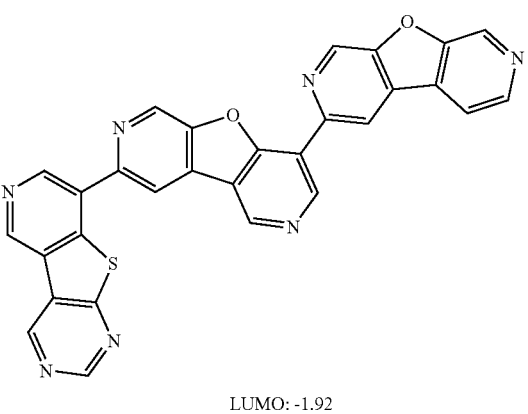
LUMO: -1.92

No.58
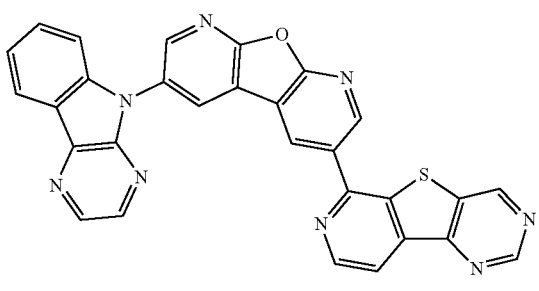
LUMO: -2.03
[Formula 21]
No.59
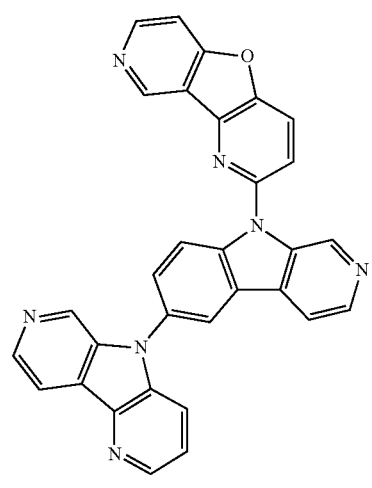
LUMO: -1.95
No.60
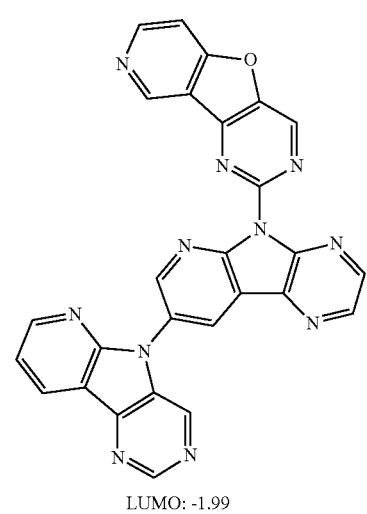
LUMO: -1.99
No.61
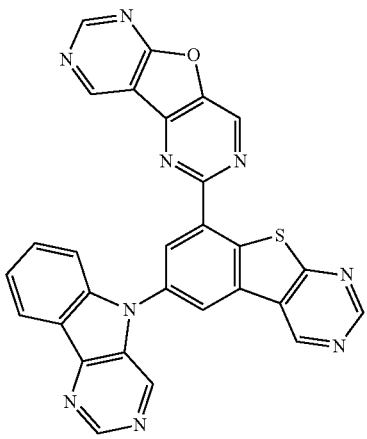
LUMO: -1.99
No.62
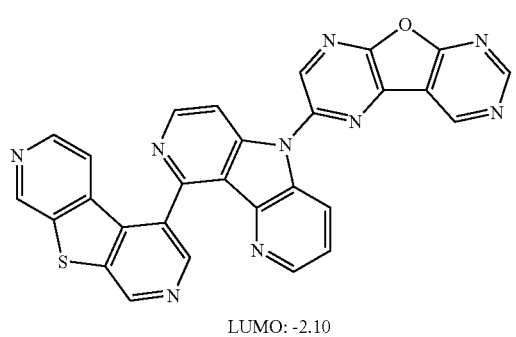
LUMO: -2.10
No.63
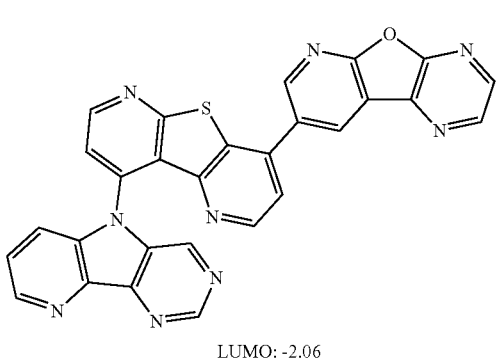
LUMO: -2.06
No.64
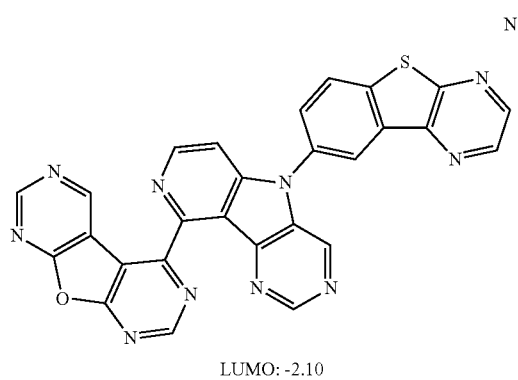
LUMO: -2.10

No.65
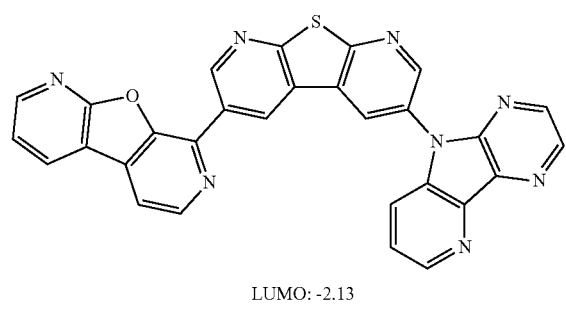
LUMO: -2.13
No.66
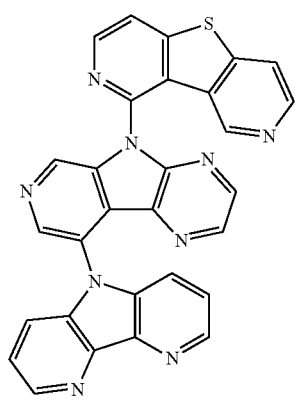
LUMO: -2.12
No.67
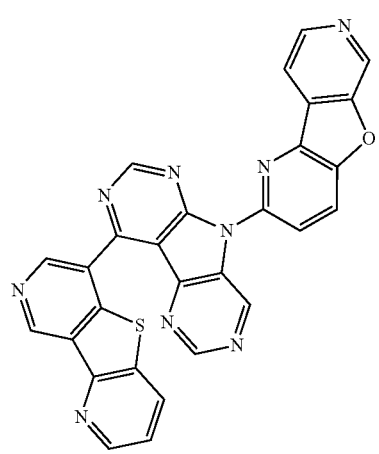
LUMO: -2.14
[Formula 22]
No.68
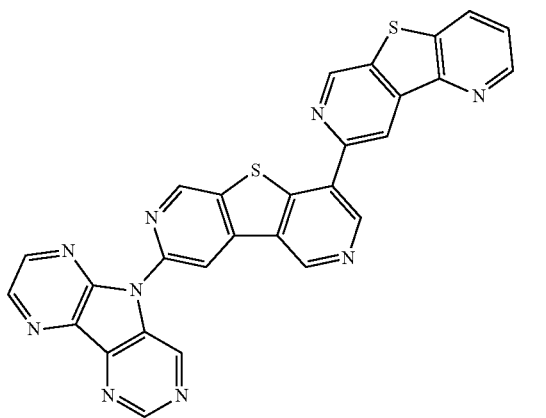
LUMO: -2.18
No.69
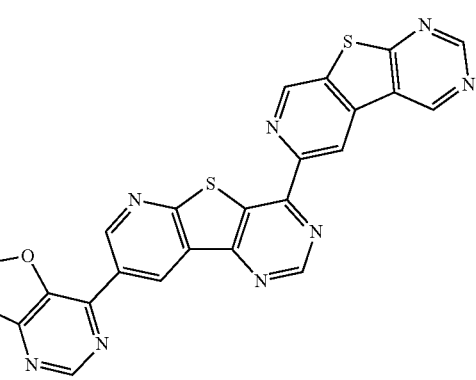
LUMO: -2.17
No.70
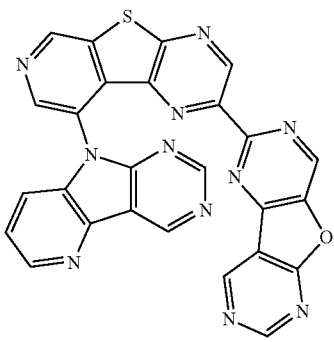
LUMO: -2.19

No. 71
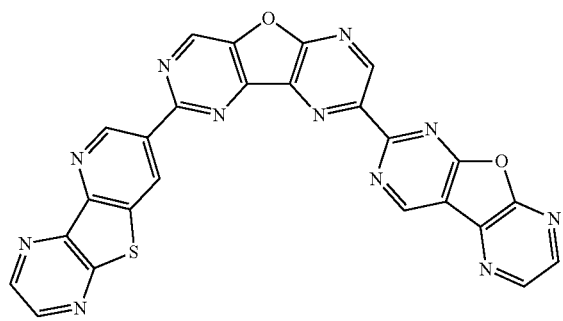
LUMO: -2.14
No. 72
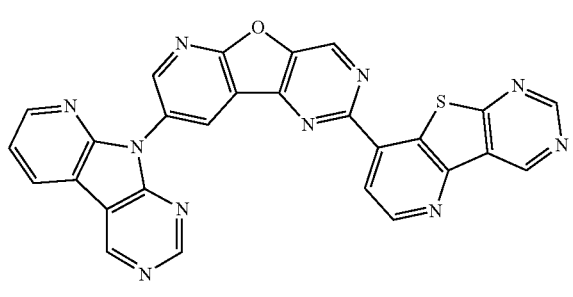
LUMO: -2.16
No. 73
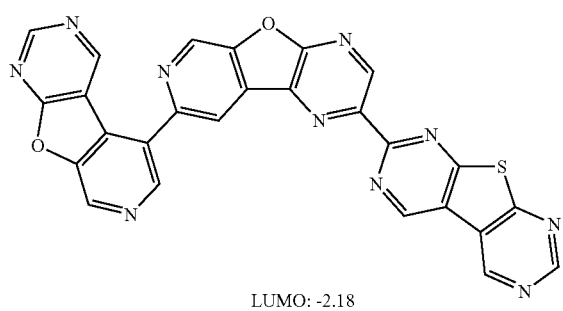
LUMO: -2.18
No. 74
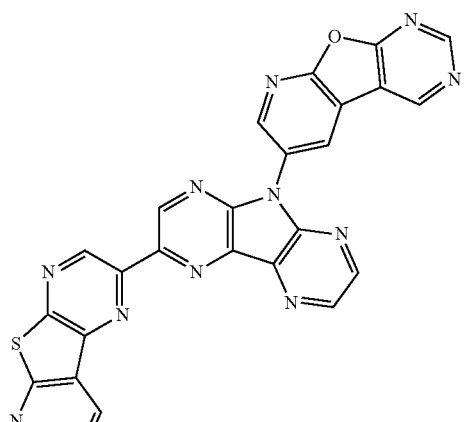
LUMO: -2.16
No. 75
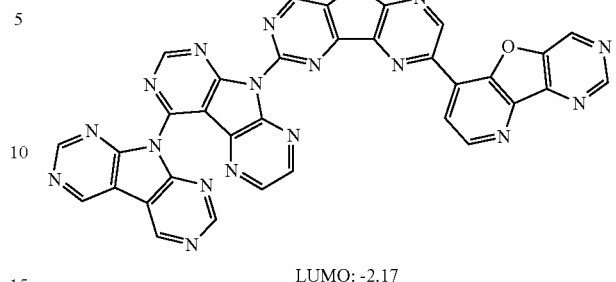
LUMO: -2.17
[Formula 23]
No. 76
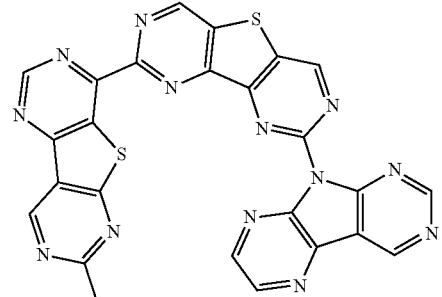
LUMO: -2.18
No. 77
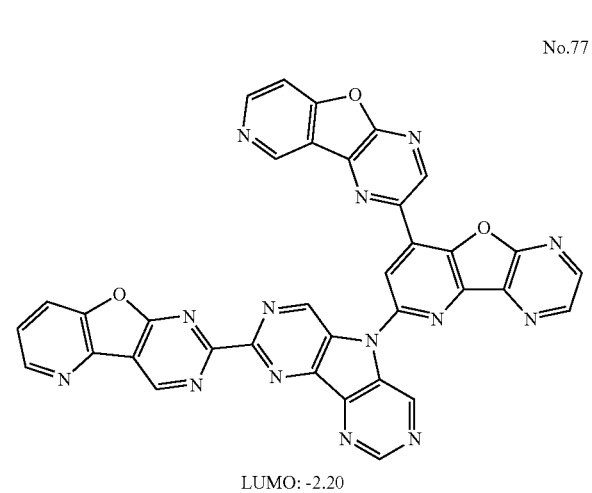
LUMO: -2.20

-continued
No. 78
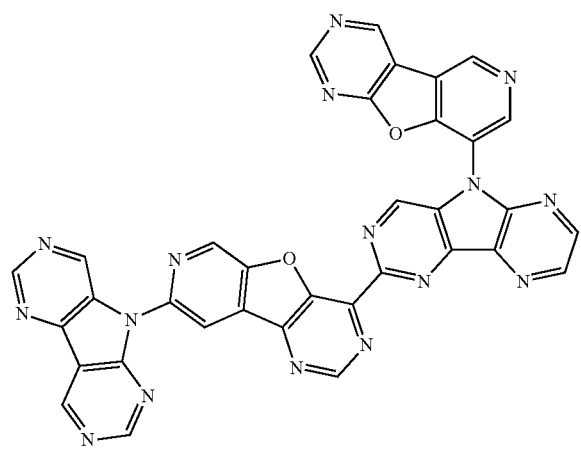
LUMO: -2.20
No. 79
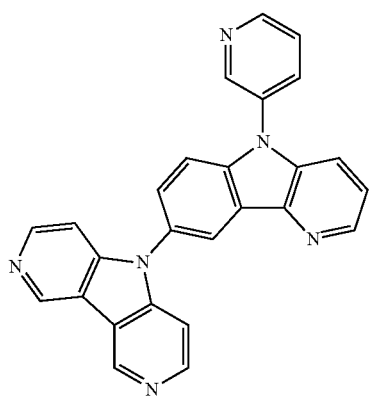
LUMO: -1.62
No. 80
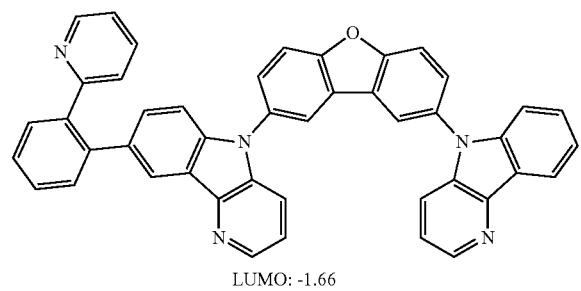
LUMO: -1.66
No. 81
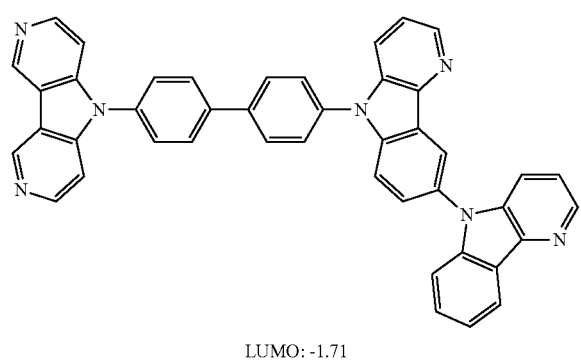
LUMO: -1.71
-continued
[Formula 24]
No. 82
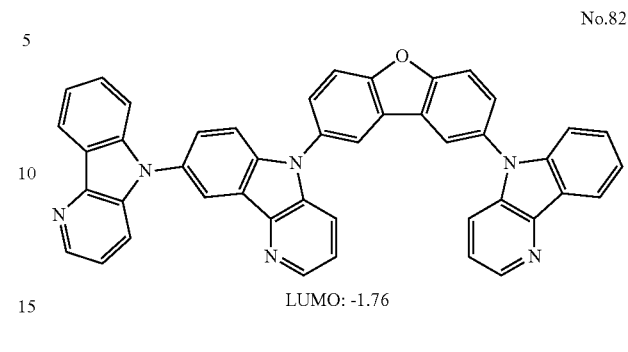
LUMO: -1.76
No. 83
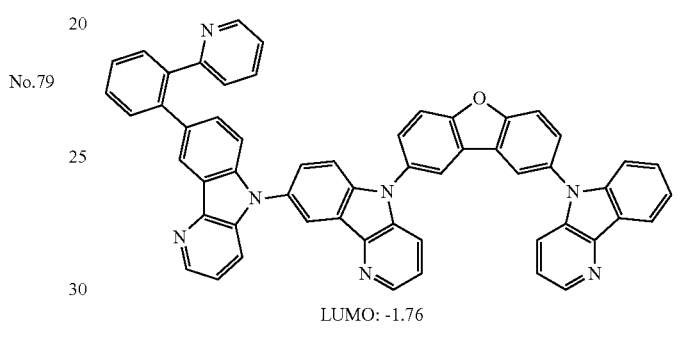
LUMO: -1.76
No. 84
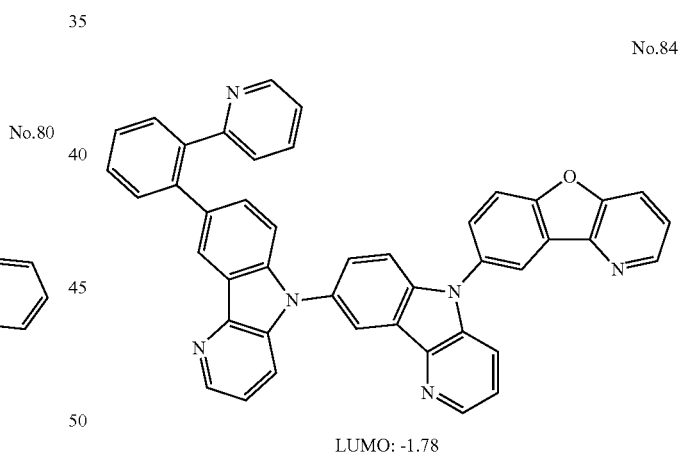
LUMO: -1.78
No. 85
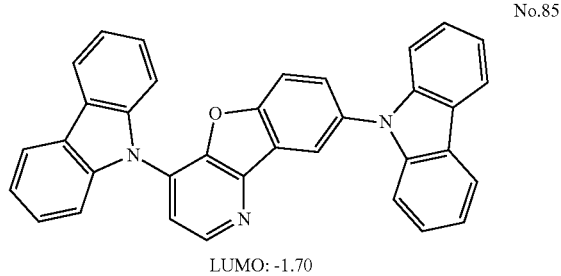
LUMO: -1.70

-continued
No.86
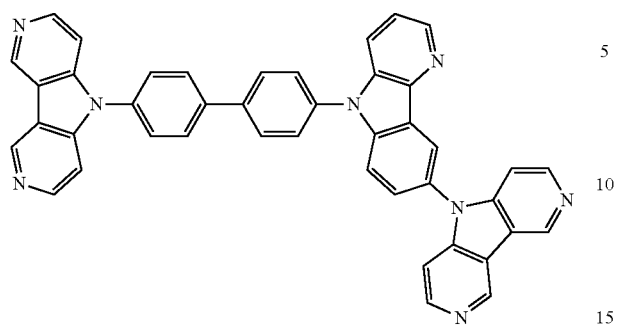
LUMO: -1.78
No.87
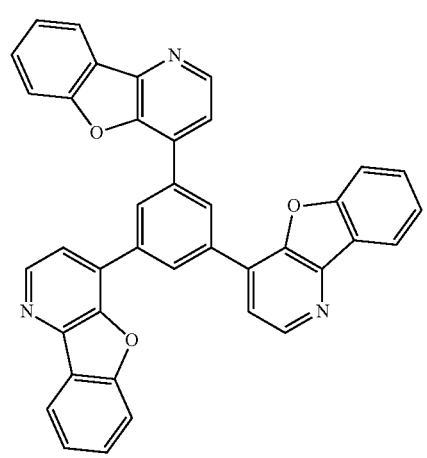
LUMO: -1.78
[Formula 25]
No.88
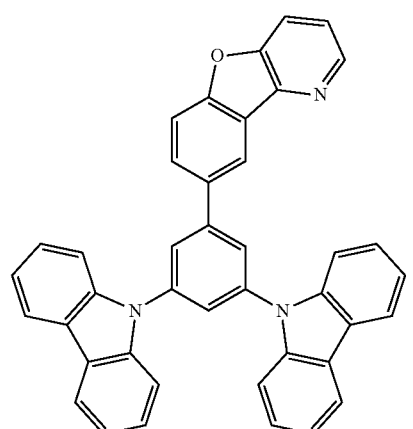
LUMO: -1.84
-continued
No.89
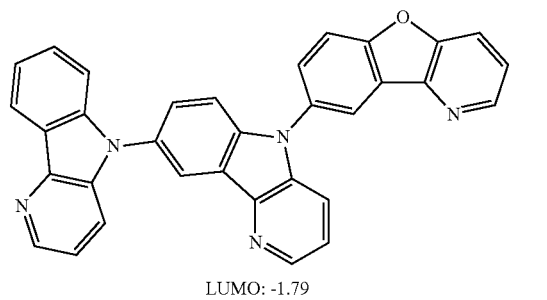
LUMO: -1.79
No.90
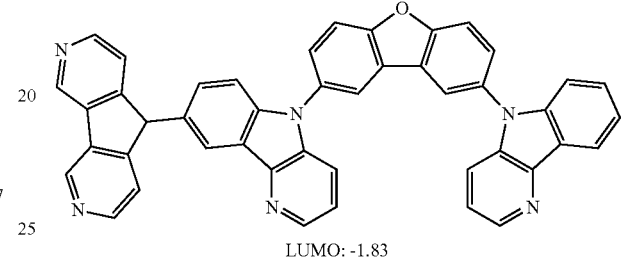
LUMO: -1.83
No.91
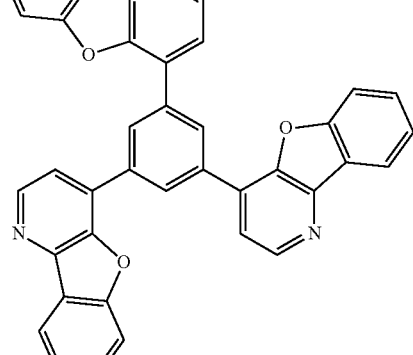
LUMO: -1.86
No.92
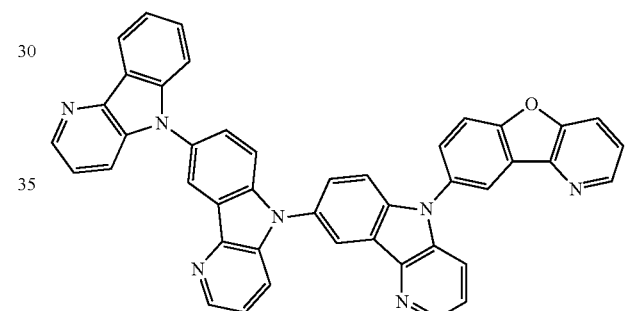
LUMO: -1.86
No.93
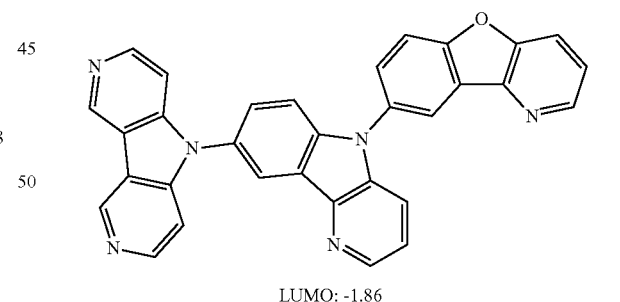
LUMO: -1.91

-continued

No.94

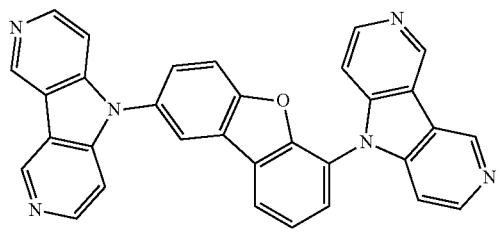

LUMO: -1.91

No.95

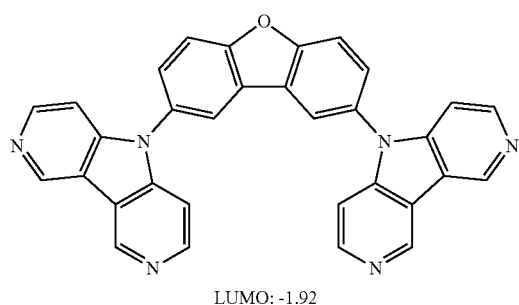

LUMO: -1.92

[Formula 26]

No.96

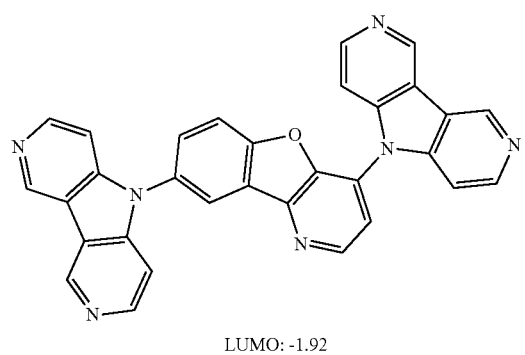

LUMO: -1.92

No.97

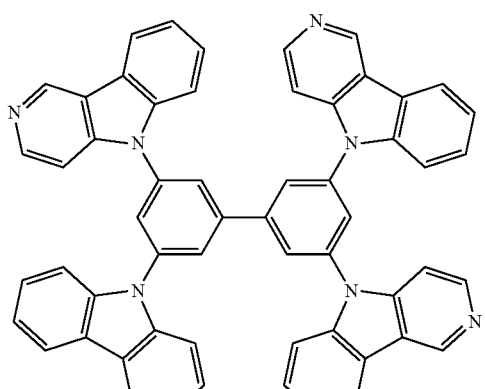

LUMO: -1.82

-continued

No.98

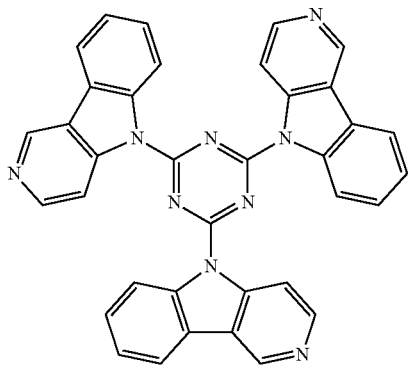

LUMO: -1.87

No.99

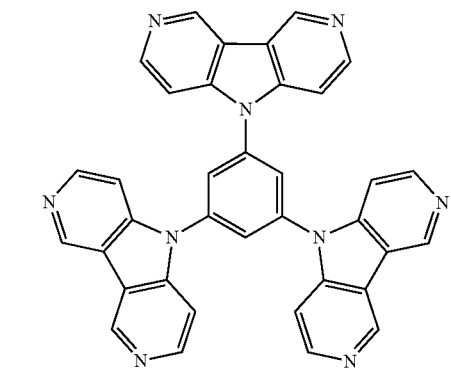

LUMO: -2.01

No. 100

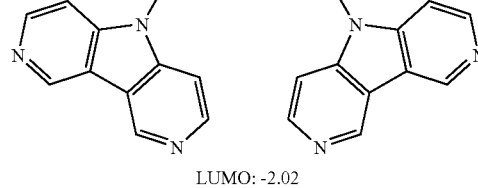

LUMO: -2.02

The organic compound according to the present invention can be easily synthesized according to a conventionally known synthesis method.

(Effective Action Energy ΔEef)

In the transparent electrode of the present invention, the organic compound contained in the metal affinity layer is preferably a compound having a heterocyclic ring containing a nitrogen atom as a heteroatom, and having an effective action energy ΔEef value with silver represented by the following expression (1) that satisfies the condition defined by the following expression (2):

$$\Delta Eef = n \times \Delta E/s \quad \text{Expression (1)}$$

wherein n represents the number of nitrogen atoms (N) in a compound that are stably bound to silver (Ag), ΔE represents an interaction energy between a nitrogen atom (N) and silver (Ag), and s represents the surface area of the compound, $$-0.50 \leq \Delta Eef \leq -0.10 [kcal/mol \cdot Å^2].\quad \text{Expression (2)}$$

The number [n] of nitrogen atoms in the compound that are stably bound to silver is the number obtained by selecting and counting, of all the nitrogen atoms contained in the organic compound, just the nitrogen atoms that are stably bound to silver as specific nitrogen atoms. The nitrogen atoms that may be selected are all the nitrogen atoms contained in the compound, and are not limited to the nitrogen atoms constituting the heterocyclic ring.

The selection of the specific nitrogen atoms from among all the nitrogen atoms contained in such a compound can be carried out as follows by using as an index, for example, the bond distance [r(Ag·N)] between silver and the nitrogen atoms in the compound, or the angle formed by the nitrogen atoms and silver with respect to the nitrogen atom-containing ring in the compound, that is, the dihedral angle [D], calculated by a molecular orbital calculation method. The molecular orbital calculation is performed using, for example, Gaussian 03 (Gaussian, Inc., Wallingford, Conn., 2003).

First, when the bond distance [r(Ag·N)] is used as the index, while considering the steric structure of each compound, the distance at which the nitrogen atom and silver stably bond in the compound is set as "stable bond distance". Then, for each nitrogen atom contained in the compound, the bond distance [r(Ag·N)] is calculated using the molecular orbital calculation method. Then, as a specific nitrogen atom, a nitrogen atom whose calculated bond distance [r(Ag·N)] shows a value close to the "stable bond distance" is selected. This selection of a nitrogen atom is applied to compounds including a large number of nitrogen atoms constituting a heterocyclic ring and to compounds including a large number of nitrogen atoms not constituting a heterocyclic ring.

In addition, when the dihedral angle [D] is used as the index, the dihedral angle [D] described above is calculated using the molecular orbital calculation method. Then, a nitrogen atom whose calculated dihedral angle [D] is D<10 degrees is selected as a specific nitrogen atom. This selection of a nitrogen atom is applied to compounds containing a large number of nitrogen atoms constituting a heterocycle.

The interaction energy [ΔE] between silver (Ag) and nitrogen (N) in the compound, which can be calculated by the molecular orbital calculation method, is the interaction energy between the nitrogen selected in the manner described above and silver.

Further, the surface area [s] is calculated with respect to the optimized structure using Tencube/WM (Ten Cube, Inc.).

The effective action energy ΔEef with the silver of the compound having a partial structure represented by the general formula (I) is preferably within the above range because this reduces the sheet resistance value (Ω/sq.) as a metal layer. A preferable range for the effective action energy ΔEef is −0.15 or less, and more preferable is −0.20 or less.

The effective action energy ΔEef of Example Compound Nos. 3 to 7, No. 14, No. 15, and No. 27 as representative examples of the organic compound according to the present invention is shown below in the following Table II.

TABLE II

| Example Compound No. | n [number] | ΔE [kcal/mol] | s [Å²] | ΔEef [n · Kcal/mol/Å²] |
|---|---|---|---|---|
| No. 3 | 2 | −49.4 | 666 | −0.148 |
| No. 4 | 2 | −48.9 | 666 | −0.147 |
| No. 5 | 3 | −36.4 | 981 | −0.111 |
| No. 6 | 3 | −43.8 | 821 | −0.160 |
| No. 7 | 4 | −42.0 | 729 | −0.230 |
| No. 14 | 4 | −57.3 | 634 | −0.362 |
| No. 15 | 2 | −57.0 | 479 | −0.238 |
| No. 27 | 4 | −45.0 | 723 | −0.249 |

[La Metal]

The La metal (also referred to as a lanthanoid or a lanthanide) according to the present invention represents a transition metal contained in the sixth period, third group in the periodic table of elements. Specific examples thereof include lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu). It is noted that although promethium (Pm) is also included in lanthanoids, there is a problem in terms of safety since promethium only exists as radioactive isotopes, and hence it is not suitable for the present invention. As is known, the outermost electron shell of La metals is full, and hence the properties of each element are similar. However, it is known that lanthanoids exhibit interesting properties, such as lanthanoid contraction. In the present application, the La metal is not particularly limited as long as it is a lanthanoid, but from the viewpoint of suitability for vapor deposition, Sm, Eu, and Yb are preferable, and Sm or Yb is more preferable.

[Conductive Layer]

The fact that the conductive layer (1b) constituting the transparent electrode of the present invention is a layer composed mainly of silver and is formed on the metal affinity layer (1a) is as stated above. As used herein, "composed of silver as a main component" means that the proportion of silver in the material components constituting the conductive layer is 60% by mass or more, preferably 70% by mass or more, more preferably 80% by mass or more, even more preferably 90% by mass or more, and particularly preferably 99% by mass or more, as described above.

Examples of the deposition method of such a conductive layer (1b) may include methods using a wet process, such as an application method, an inkjet method, a coating method, and a dipping method, and methods using a dry process, such as a vapor deposition method (a resistance heating method, an EB method, etc.), a sputtering method, a CVD method, and the like. Of these, a vapor deposition method is preferably employed.

Further, the conductive layer (1b) is deposited on the above-mentioned metal affinity layer (1a), and as a result it is characterized by having sufficient conductivity even without a high-temperature annealing treatment (e.g., a heating process at 150° C. or higher) or the like after depositing the conductive layer. However, the conductive layer (1b) may optionally be subjected to a high-temperature annealing treatment after deposition.

The conductive layer (1b) may be composed of an alloy containing silver (Ag). Examples of such an alloy include silver magnesium (Ag—Mg), silver copper (Ag—Cu), silver palladium (Ag—Pd), silver palladium copper (Ag—Pd—Cu), silver indium (Ag—In), and the like.

The above-mentioned conductive layer (1b) may have a structure in which the layer composed of silver as a main component is stacked by dividing it into a plurality of layers as necessary.

Further, the conductive layer (1b) preferably has a thickness in the range of 5 to 20 nm, and more preferably in the range of 5 to 12 nm.

When the thickness of the conductive layer (1b) is 20 nm or less, the absorbing component or the reflecting component is reduced, which is preferable from the perspective that the transmittance of the transparent electrode improves. Further, from the perspective of sufficient conductivity, the thickness is preferably 5 nm or more.

The sheet resistance value of the transparent electrode is preferably several hundred Ω/sq. or less, and more preferably 100 Ω/sq. or less. In order to increase the electrode area, the sheet resistance value is preferably 50 Ω/sq. or less, and particularly preferably 20 Ω/sq. or less.

In the transparent electrode (1) having such a stacked structure composed of the metal affinity layer (1a) and the conductive layer (1b) deposited on an upper portion thereof, the upper portion of the conductive layer (1b) may be further covered with a protective film, and another conductive layer may also be stacked. In this case, it is preferable that the protective film and the other conductive layer have a desired light-transmitting property so as not to impair the light-transmitting property of the transparent electrode (1). Further, a structural layer may also optionally be provided at a lower portion of the metal affinity layer (1a), that is, between the metal affinity layer (1a) and the base material (11).

[Effects of Transparent Electrode]

The transparent electrode (1) having a structure such as the above is a structure provided with the conductive layer (1b), which has silver as a main component, on the metal affinity layer (1a), which is constituted using a lanthanoid and an organic compound including a heteroatom having an unshared electron pair in the molecule. As a result, when depositing the conductive layer (1b) on the upper portion of the metal affinity layer (1a), the silver atoms constituting the conductive layer (1b) interact with the compound including in the molecule a heteroatom having an unshared electron pair constituting the metal affinity layer (1a), causing the diffusion distance of the silver atoms on the surface of the metal affinity layer (1a) to decrease, thereby suppressing silver aggregation, which enables a layer with a uniform structure to be formed.

As described above, in the deposition of the conductive layer which is generally composed of silver as a main component, because thin film growth occurs based on an island-like growth type (VW type), the silver particles tend to be isolated in the form of islands. When the layer is thin, it is difficult to obtain conductivity, and the sheet resistance value increases.

Therefore, it is necessary to increase the thickness of the layer to ensure conductivity. However, if the thickness of the layer is increased, the light transmittance is decreased, which is not suitable for a transparent electrode.

However, according to the transparent electrode (1) having the constitution of the present invention, since aggregation of silver is suppressed on the metal affinity layer (1a) as described above, during deposition of the conductive layer (1b) having silver as a main component, a thin film is grown based on a layered growth type (FM type).

Further, as described above, the term "transparent" in the transparent electrode (1) of the present invention means that the light transmittance at a wavelength of 500 nm is 50% or more. The metal affinity layer (1a) constituted using each material described above forms a layer having better light-transmitting property than the conductive layer (1b), which has silver as a main component. On the other hand, the conductivity of the transparent electrode (1) is mainly secured by the conductive layer (1b). Therefore, as described above, since the conductivity of the conductive layer (1b), which is composed of silver as a main component, is ensured with a thinner layer thickness, it is possible to improve the conductivity of the transparent electrode (1) while also improving light-transmitting property.

<Application Field of Transparent Electrode>

The transparent electrode (1) of the present invention is characterized by being used in various electronic devices.

Examples of the electronic devices include an organic EL device, a light-emitting diode (LED), a liquid crystal device, a solar cell, a touch panel, and the like. In these electronic devices, the transparent electrode (1) of the present invention can be used as an electrode member requiring a light-transmitting property. Among these electronic devices, the transparent electrode of the present invention is particularly preferably applied to an organic EL device.

Hereinafter, as examples of the application field, embodiments of organic EL devices using the transparent electrode (1) of the present invention will be described.

Application Example 1 to Organic EL Device

[Structure of Organic EL Device]

Figure 2:
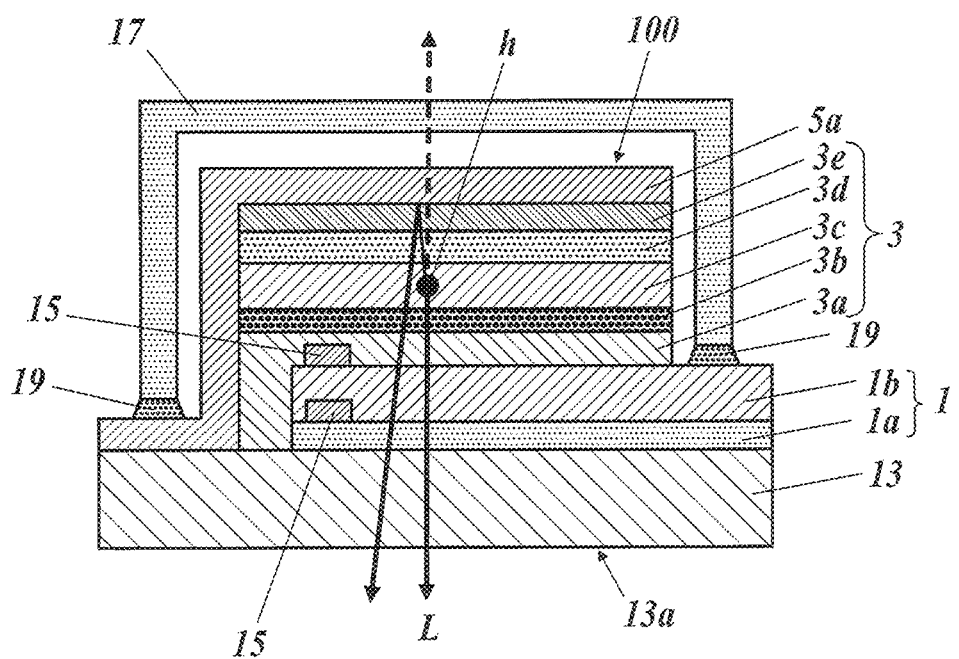
FIG. 2 is a schematic cross-sectional view showing a first example of a structure of an organic EL device using the transparent electrode of the present invention.

FIG. 2 is a schematic cross-sectional view showing an application example 1 of the transparent electrode (1) of the present invention to the organic EL device as a structural example of the electronic device of the present invention.

The structure of the organic EL device will be described with reference to FIG. 2.

As shown in FIG. 2, an organic EL device (100) is provided on a transparent substrate (base material, 13). Then, sequentially from the transparent substrate (13) side, a light-emitting function layer unit (3) constituted using a transparent electrode (1), an organic material, and the like and a counter electrode (5a) are stacked thereon in that order.

In the organic EL device (100), the transparent electrode (1) of the present invention described above is used as the transparent electrode (1). For this reason, the organic EL device (100) is configured such that the light generated from a luminous point (h) (hereinafter referred to as emission light (L)) is extracted from at least the transparent substrate (13).

Further, the layer structure of the organic EL device (100) is not limited to the example described below, and may be a typical layer structure. Here, an example in which the transparent electrode (1) functions as an anode (i.e., a positive electrode) and the counter electrode (5a) functions as a cathode (i.e., a negative electrode) is illustrated. In this case, for example, an example is illustrated in which the light-emitting function layer unit (3) includes a hole injection layer (3a)/hole transport layer (3b)/light-emitting layer (3c)/electron transport layer (3d)/electron injection layer (3e) stacked in order from the transparent electrode (1), which is the anode, side. Among these layers, it is essential to have at least the light-emitting layer (3c) constituted using an organic material. The hole injection layer (3a) and the hole transport layer (3b) may be provided as a hole transport/injection layer. In addition, the electron transport layer (3d) and the electron injection layer (3e) may be provided as an electron transport/injection layer. Among these light-emitting function layer units (3), for example, the electron injection layer (3e) may be composed of an inorganic material.

The light-emitting function layer unit (3) may have a structure in which, in addition to these layers, a hole blocking layer, an electron blocking layer, or the like are optionally stacked at required places. Further, the light-emitting layer (3c) may have a stacked structure in which various color light-emitting layers for generating emission light in each wavelength region are stacked via a non-light-emitting auxiliary layer. The auxiliary layer may also function as a hole blocking layer or an electron blocking layer. Further, the counter electrode (5a), which is a cathode, may optionally have a stacked structure. In such a structure, only the portion where the light-emitting function layer unit (3) is sandwiched between the transparent electrode (1) and the counter electrode (5a) is a light-emitting region in the organic EL device (100).

In addition, in a layer structure such as the above, for the purpose of lowering the resistance of the transparent electrode (1), an auxiliary electrode (15) may be provided in contact with the conductive layer (1b) of the transparent electrode (1).

As shown in FIG. 2, for the purpose of preventing deterioration of the light-emitting function layer unit (3) constituted using an organic material or the like, the organic EL device (100) having a structure such as the above is sealed with a sealing material (17) (described later) on the transparent substrate (13). The sealing material (17) is fixed to the transparent substrate (13) side via an adhesive agent (19). However, the terminal portions of the transparent electrode (1) and the counter electrode (5a) are exposed from the sealing material (17) while still being insulated from each other by the light-emitting function layer unit (3) on the transparent substrate (13).

Next, details of the principal elements constituting the above-mentioned organic EL device (100) will be described in order of the transparent substrate (13), the transparent electrode (1), the counter electrode (5a), the light-emitting layer (3c) of the light-emitting function layer unit (3), the other layers of the light-emitting function layer unit (3), the auxiliary electrode (15), and the sealing material (17).

(Transparent Substrate)

The transparent substrate (13) is a base material (11) on which the transparent electrode (1) of the present invention described with reference to FIG. 1 is provided. Of the base materials (11) described for the transparent electrode, a transparent base material that has a light-transmitting property is used.

(Transparent Electrode: Anode)

The transparent electrode (1) is the transparent electrode (1) of the present invention described above, and has a structure in which the metal affinity layer (1a) and the conductive layer (1b) are deposited in that order from the transparent substrate (13) side. Here, in particular, the transparent electrode (1) functions as an anode (positive electrode), and the conductive layer (1b) serves as a substantive anode.

(Counter Electrode: Cathode)

The counter electrode (5a) is an electrode film that functions as a cathode supplying electrons to the light-emitting function layer unit (3). The counter electrode (5a) is made of a metal, an alloy, an organic or inorganic conductive compound, a mixture thereof, or the like. Specifically, examples of materials that can be used include aluminum, silver, magnesium, lithium, a magnesium/copper mixture, a magnesium/silver mixture, a magnesium/aluminum mixture, a magnesium/indium mixture, indium, a lithium/aluminum mixture, a rare earth metal, an oxide semiconductor such as ITO, ZnO, $TiO_2$, or $SnO_2$, and the like.

The counter electrode (5a) can be manufactured by forming a thin film of these conductive materials by a method such as vapor deposition or sputtering. Further, the sheet resistance value as the counter electrode (5a) is preferably several hundred Ω/sq. or less, and the thickness is usually in the range of 5 nm to 5 μm, and preferably selected in the range of 5 to 200 nm.

When the organic EL device (100) is a type configured to extract the emission light (L) also from the counter electrode (5a) side, the counter electrode (5a) may be constituted by selecting a conductive material having a good light-transmitting property from among the above-mentioned conductive materials.

(Light-Emitting Layer)

The light-emitting layer (3c) used in the present invention contains a light-emitting material. It is preferred that the light-emitting layer (3c) contain a phosphorescence light-emitting compound (a phosphorescent light-emitting material, a phosphorescent light-emitting compound, a phosphorus compound) as the light-emitting material.

This light-emitting layer (3c) is a layer that emits light through the recombination of electrons injected from an electrode or the electron transport layer (3d) and holes injected from the hole transport layer (3b). The luminous point (h) may be within the layer of the light-emitting layer (3c) or at an interface region between the light-emitting layer (3c) and an adjacent layer.

The structure of the light-emitting layer (3c) is not particularly limited as long as the included light-emitting material satisfies the light emission requirement. Further, there may be a plurality of layers having the same emission spectrum or emission maximum wavelength. In this case, it is preferable to have a non-light-emitting auxiliary layer (intermediate layer) between the respective light-emitting layers (3c).

The total thickness of the light-emitting layer (3c) is preferably in the range of 1 to 100 nm, and from the viewpoint of enabling a lower driving voltage to be obtained, is more preferably in the range of 1 to 30 nm. When a non-light-emitting auxiliary layer is present between light-emitting layers (3c), the total thickness of the light-emitting layer (3c) is the total thickness including the auxiliary layer.

In the case of a light-emitting layer (3c) having a structure in which a plurality of layers are stacked, the thickness of each light-emitting layer is preferably adjusted to within a range of 1 to 50 nm, and more preferably adjusted to within a range of 1 to 20 nm. When the plurality of stacked light-emitting layers respectively correspond to the emission colors of blue, green, and red, the relationship between the thicknesses of each of the blue, green, and red light-emitting layers is not particularly limited.

The light-emitting layer (3c) having the above structure can be formed by depositing the light-emitting material and host compound, which will be described later, by applying a known thin film forming method, such as a vacuum evaporation method, a spin coating method, a casting method, an LB method, and an inkjet method.

In addition, the light-emitting layer (3c) may be formed by mixing a plurality of light-emitting materials. Further, the light-emitting layer (3c) may also be formed by mixing a phosphorescence light-emitting compound and a fluorescent compound (fluorescent light-emitting material, fluorescent dopant).

The structure of the light-emitting layer (3c) contains a host compound (light-emitting host) and a light-emitting material (light-emitting dopant compound), and emits light from the light-emitting material.

<Host Compound>

The host compound contained in the light-emitting layer (3c) is preferably a compound having a phosphorescence quantum yield of phosphorescence at room temperature (25° C.) of less than 0.1, and more preferably a phosphorescence quantum yield of less than 0.01. Further, among the compounds contained in the light-emitting layer 3c, the volume ratio thereof in the layer is preferably 50% or more.

As the host compound, a known host compound may be used alone, or a plurality of kinds of host compounds may be used in combination. By using a plurality of kinds of host compounds, it is possible to adjust the migration of charges, and to improve the efficiency of the organic EL device. Further, by using a plurality of kinds of light-emitting materials (described later), it is possible to mix different emissions, and as a result arbitrary light emission colors can be obtained.

Host compounds that can be applied may be a conventionally known low molecular weight compound, a polymer compound having a repeating unit, or a low molecular weight compound having a polymerizable group such as a vinyl group or an epoxy group (vapor deposition polymerizable light-emitting host).

As a known host compound, a compound that prevents emission of longer wavelengths and that has a high Tg (glass transition temperature), while maintaining a hole transporting ability and an electron transporting ability, is preferable.

The glass transition temperature referred to here is a value obtained by a method in accordance with JIS K 7121 using DSC (Differential Scanning calorimetry).

As specific examples of known host compounds, the compounds described in the following literature may be used. For example, Japanese Patent Laid-Open Nos. 2001-257076, 2002-308855, 2001-313179, 2002-319491, 2001-357977, 2002-334786, 2002-8860, 2002-334787, 2002-15871, 2002-334788, 2002-43056, 2002-334789, 2002-75645, 2002-338579, 2002-105445, 2002-343568, 2002-141173, 2002-352957, 2002-203683, 2002-363227, 2002-231453, 2003-3165, 2002-234888, 2003-27048, 2002-255934, 2002-260861, 2002-280183, 2002-299060, 2002-302516, 2002-305083, 2002-305084, and 2002-308837, US Patent Application Publication No. 2003/0175553, U.S. Patent Application Publication No. 2006/0280965, U.S. Patent Application Publication No. 2005/0112407, U.S. Patent Application Publication No. 2009/0017330, U.S. Application Publication No. 2009/0030202, and U.S. Patent Application Publication No. 2005/0238919, International Publication No. 2001/039234, International Publication No. 2009/021126, International Publication No. 2008/056746, International Publication No. 2004/093207, International Publication No. 2005/089025, International Publication No. 2007/063796, International Publication No. 2007/063754, International Publication No. 2004/107822, International Publication No. 2005/030900, International Publication No. 2006/114966, International Publication No. 2009/086028, International Publication No. 2009/003898, International Publication No. 2012/023947, Japanese Patent Laid-Open No. 2008-074939, Japanese Patent Laid-Open No. 2007-254297, European Patent No. 2034538, and the like.

<Light-Emitting Material>

(1) Phosphorescence Light-Emitting Compound

Representative examples of the light-emitting material that can be used in the present invention include phosphorescence light-emitting compounds.

This phosphorescence light-emitting compound is defined as being a compound for which light emitted from an excited triplet is observed, specifically, a compound that emits phosphorescence at room temperature (25° C.) and that has a phosphorescence quantum yield at 25° C. of 0.01 or more. A preferred phosphorescence quantum yield is 0.1 or more.

The phosphorescence quantum yield can be measured by a method described on page 398 of Spectroscopy II of the 4th edition Experimental Chemistry Course 7 (Maruzen, 1992 edition). The phosphorescence quantum yield in solution can be measured using various types of solvents. However, in the present invention, when using a phosphorescence light-emitting compound, the above-mentioned phosphorescence quantum yield (0.01 or more) may be achieved in any solvent.

As the principle of the light emission of the phosphorescence light-emitting compound, the following two types can be mentioned.

One is an energy migration type, in which carriers are recombined on the host compound to which carriers are transported, thereby producing an excited state of the host compound. The generated energy is transferred to the phosphorescence light-emitting compound, and light is emitted from the phosphorescence light-emitting compound.

The other is a carrier trap type, in which a phosphorescence light-emitting compound is a carrier trap, carriers are recombined on the phosphorescence light-emitting compound, and light is emitted from the phosphorescence light-emitting compound.

In either case, the energy of the excited state of the phosphorescence light-emitting compound is required to be lower than the energy of the excited state of the host compound.

The phosphorescence light-emitting compound can be appropriately selected and used from among known phosphorescence light-emitting compounds used for the light-emitting layer of a general organic EL device. However, preferably, the phosphorescence light-emitting compound is a complex compound containing a metal from Groups 8 to 10 in the periodic table of elements, and more preferably an iridium compound, an osmium compound, a platinum compound (platinum complex compound), or a rare earth complex, and most preferably an iridium compound.

In the present invention, two or more kinds of phosphorescence light-emitting compounds may be contained in one light-emitting layer (3c), and the light-emitting layer (3c) may have a gradient structure in which the concentration ratio of the phosphorescence light-emitting compound changes in the thickness direction of the light-emitting layer (3c).

The phosphorescence light-emitting compound is preferably 0.1% by volume or more and less than 30% by volume based on the total amount of the light-emitting layer (3c).

Specific examples of known phosphorescence light-emitting compounds that can be used in the present invention include the compounds described in the following documents and the like.

Nature 395, 151 (1998), Appl. Phys. Left. 78, 1622 (2001), Adv. Mater. 19, 739 (2007), Chem. Mater. 17, 3532 (2005), Adv. Mater. 17, 1059 (2005), International Publication No. 2009/100991, International Publication No. 2008/101842, International Publication No. 2003/040257, U.S.

Patent Application Publication No. 2006/835469, U.S. Patent Application Publication No. 2006/0202194, U.S. Patent Application Publication No. 2007/0087321, U.S. Patent Application Publication No. 2005/0244673, Inorg. Chem. 40, 1704 (2001), Chem. Mater. 16, 2480 (2004), Adv. Mater. 16, 2003 (2004), Angew. Chem. Int. Ed. 2006, 45, 7800, Appl. Phys. Lett. 86, 153505 (2005), Chem. Lett. 34, 592 (2005), Chem. Commun. 2906 (2005), Inorg. Chem. 42, 1248 (2003), International Publication No. 2009/050290, International Publication No. 2002/015645, International Publication No. 2002/015645, International Publication No. 2009/000673, U.S. Patent Application Publication No. 2002/0034656, U.S. Pat. No. 7,332,232, U.S. Patent Application Publication No. 2009/0108737, U.S. Patent Application Publication No. 2009/0039776, U.S. Pat. Nos. 6,921,915, 6,687,266, U.S. Patent Application Publication No. 2007/0190359, U.S. Patent Application Publication No. 2006/0008670, U.S. Patent Application Publication No. 2009/0165846, U.S. Patent Application Publication No. 2008/0015355, U.S. Pat. Nos. 7,250,226, 7,396,598, U.S. Patent Application Publication No. 2006/0263635, U.S. Patent Application Publication No. 2003/0138657, U.S. Patent Application Publication No. 2003/0152802, U.S. Pat. No. 7,090,928, Angew. Chem. Int. Ed. 47, 1 (2008), Chem. Mater. 18, 5119 (2006), Inorg. Chem. 46, 4308 (2007), Organometallics 23, 3745 (2004), Appl. Phys. Lett. 74, 1361 (1999), International Publication No. 2002/002714, International Publication No. 2006/009024, International Publication No. 2006/056418, International Publication No. 2005/019373, International Publication No. 2005/123873, International Publication No. 2005/123873, International Publication No. 2007/004380, International Publication 2006/082742, U.S. Patent Application Publication No. 2006/0251923, U.S. Patent Application Publication No. 2005/0260441, U.S. Pat. Nos. 7,393,599, 7,534,505, and 7,445,855 U.S. Patent Application Publication No. 2007/0190359, U.S. Patent Application Publication No. 2008/0297033, U.S. Pat. No. 7,338,722, U.S. Patent Application Publication No. 2002/0134984, U.S. Pat. No. 7,279,704, U.S. Patent Application Publication No. 2006/098120, U.S. Patent Application Publication No. 2006/103874, International Publication No. 2005/076380, International Publication No. 2010/032663, International Publication No. 2008/140115, International Publication No. 2007/052431, International Publication No. 2011/134013, International Publication No. 2011/157339, International Publication No. 2010/086089, International Publication No. 2009/113646, International Publication No. 2012/020327, International Publication No. 2011/051404, International Publication No. 2011/004639, International Publication No. 2011/073149, U.S. Patent Application Publication No. 2012/228583, U.S. Patent Application Publication No. 2012/212126, Japanese Patent Laid-Open No. 2012-069737, Japanese Patent Laid-Open No. 2011-181303, Japanese Patent Laid-Open No. 2009-114086, Japanese Patent Laid-Open No. 2003-81988, Japanese Patent Laid-Open No. 2002-302671, Japanese Patent Laid-Open No. 2002-363552, and the like.

Among these, examples of preferable phosphorescent dopants include an organometallic complex having Ir as a central metal. More preferably, a complex containing at least one coordination mode of a metal-carbon bond, a metal-nitrogen bond, a metal-oxygen bond, and a metal-sulfur bond is preferable.

The above-mentioned phosphorescence light-emitting compounds (also referred to as a phosphorescence light-emitting metal complexes etc.) can be synthesized by appropriately selecting and applying the methods described in, for example, Organic Letter, vol. 13, No. 16, pp. 2579-2581 (2001), Inorganic Chemistry, Vol. 30, No. 8, pp. 1685-1687 (1991), J. Am. Chem. Soc. Vol. 123, p. 4304 (2001), Inorganic Chemistry, Vol. 40, No. 7, pp. 1704-1711 (2001), Inorganic Chemistry, Vol. 41, No. 12, pp. 3055-3066 (2002), New Journal of Chemistry., Vol. 26, p. 1171 (2002), European Journal of Organic Chemistry, Vol. 4, pp. 695-709 (2004), and the references described in these documents.

(2) Fluorescent Compound

Examples of the fluorescent compound include a coumarin dye, a pyran dye, a cyanine dye, a croconium dye, a squarylium dye, an oxobenzanthracene dye, a fluorescein dye, a rhodamine dye, a pyrylium dye, a perylene dye, a stilbene dye, a polythiophene dye, a rare earth complex fluorescent material, and the like.

[Injection Layers: Hole Injection Layer and Electron Injection Layer]

The injection layers are layers provided between the electrodes and the light-emitting layer (3c) for the purpose of lowering the driving voltage and improving the light emission luminance. The injection layers are described in detail in "Organic EL Devices and Their Industrialization Frontier" (published on Nov. 30, 1998, by NTS, Inc), second edition, chapter 2, "Electrode Materials" (pp. 123 to 166). The injection layers are the hole injection layer (3a) and the electron injection layer (3e).

The injection layer can be provided as required, and in the case of the hole injection layer (3a), this layer may be between the anode and the light-emitting layer (3c) or the hole transport layer (3b). In the case of the electron injection layer (3e), this layer may be between the cathode and the light-emitting layer (3c) or the electron transport layer (3d).

The details of the hole injection layer (3a) are also described in Japanese Patent Laid-Open Nos. 9-45479, 9-260062, 8-288069, and the like. Specific examples thereof include a phthalocyanine layer represented by copper phthalocyanine, a metal oxide layer represented by vanadium oxide, an amorphous carbon layer, a polymer layer using a conductive polymer such as polyaniline (emeraldine) or polythiophene, and the like.

The details of the electron injection layer (3e) are also described in Japanese Patent Laid-Open Nos. 6-325871, 9-17574, 10-74586, and the like. Specific examples thereof include a metal layer represented by strontium, aluminum, and the like, an alkali metal halide layer represented by potassium fluoride, an alkaline earth metal compound layer represented by magnesium fluoride, a metal oxide layer represented by molybdenum oxide, and the like. In the present invention, it is desirable that the electron injection layer (3e) be a very thin layer. Although the thickness of that layer depends on the constituent material, preferably the thickness is in the range of 1 nm to 10 μm.

(Hole Transport Layer)

The hole transport layer (3b) is composed of a hole transport material having a function of transporting holes. In a broad sense, the hole transport layer (3b) includes the hole injection layer (3a), the electron blocking layer, and the hole transport layer (3b). The hole transport layer (3b) can be provided as a single layer or a plurality of layers.

The hole transport material constituting the hole transport layer (3b), which has a function of injecting or transporting holes, or a function of blocking electrons, may be either an organic substance or an inorganic substance. Examples thereof include triazole derivatives, oxadiazole derivatives, imidazole derivatives, polyarylalkane derivatives, pyrazoline derivatives and pyrazolone derivatives, phenylenediamine derivatives, arylamine derivatives, amino-substituted chalcone derivatives, oxazole derivatives, styrylanthracene derivatives, fluorenone derivatives, hydrazone derivatives, stilbene derivatives, silazane derivatives, aniline copolymers, conductive polymer oligomers (e.g., thiophene oligomers), and the like.

As the hole transport material, the above compounds can be used, but it is more preferable to use a porphyrin compound, an aromatic tertiary amine compound, or a styrylamine compound, and in particular an aromatic tertiary amine compound.

Representative examples of aromatic tertiary amine compounds and styrylamine compounds include, for example, N,N,N',N'-tetraphenyl-4,4'-diaminophenyl, N,N-diphenyl-N,N-bis(3-methylphenyl)-[1,1'-biphenyl]-4,4'-diamine (abbreviation: TPD), 2,2-bis(4-di-p-tolylaminophenyl)propane, 1,1-bis(4-di-p-tolylaminophenyl)cyclohexane, N,N,N',N'-tetra-p-tolyl-4,4'-diaminobiphenyl, 1,1-bis(4-di-p-tolylaminophenyl)-4-phenylcyclohexane, bis(4-dimethylamino-2-methylphenyl)phenylmethane, bis(4-di-p-tolylaminophenyl)phenylmethane, N,N'-diphenyl-N,N'-di(4-methoxyphenyl)-4,4'-diaminobiphenyl, N,N,N',N'-tetraphenyl-4,4'-diaminodiphenyl ether, 4,4'-bis(diphenylamino)quadriphenyl, N,N,N-tri (p-tolyl)amine; 4-(di-p-tolylamino)-4'-[4-(di-p-tolylamino)styryl]stilbene, 4-N,N-diphenylamino-(2-diphenylvinyl)benzene, 3-methoxy-4'-N,N-diphenylaminostylbenzene, N-phenylcarbazole, and the like.

Further examples include compounds having two condensed aromatic rings in the molecule as described in U.S. Pat. No. 5,061,569, for example, 4,4'-bis[N-(1-naphthyl)-N-phenylamino]biphenyl (abbreviation: NPD), the 4,4',4"-tris[N-(3-methylphenyl)-N-phenylamino])triphenylamine (abbreviation: MTDATA) in which a triphenyl amine unit is linked to a three star-burst type triphenylamine described in Japanese Patent Laid-Open No. 4-308688, and the like.

Further, these materials may be introduced into a polymer chain, or a polymer material having these materials as the main chain of a polymer may be used. In addition, inorganic compounds such as p-type Si and p-type-SiC can also be used as the hole injection material and the hole transport material.

In addition, so-called p-type hole transport materials, such as those described in Japanese Patent Laid-Open No. 11-251067, and J. Huang et. al., Applied Physics Letters, 80 (2002), p. 139, can also be used. In the present invention, it is preferable to use these materials, since a more efficient light-emitting device can be obtained.

The hole transport layer (3b) can be formed by reducing the thickness of the hole transport material by a known method such as a vacuum deposition method, a spin coating method, a casting method, a printing method including an ink jet method, an LB method, and the like. The thickness of the hole transport layer (3b) is not particularly limited, but is usually about 5 nm to 5 µm, and preferably in the range of 5 to 200 nm. The hole transport layer (3b) may have a single layer structure composed of one kind or two or more kinds of the above materials.

Further, it is possible to increase the p-property by doping the constituent material of the hole transport layer (3b) with impurities. Examples thereof include those described in Japanese Patent Laid-Open No. 4-297076, Japanese Patent Laid-Open No. 2000-196140, Japanese Patent Laid-Open No. 2001-102175, J. Appl. Phys., 95, 5773 (2004), and the like.

It is preferable to increase the p-property of the hole transport layer (3b) in this way because an organic EL device having lower power consumption can be manufactured.

(Electron Transport Layer)

The electron transport layer (3d) is composed of a material having a function of transporting electrons. In a broad sense, the electron transport layer (3d) also includes the electron injection layer (3e) and the hole blocking layer. The electron transport layer (3d) can be provided as a single layer structure or as a stacked structure of a plurality of layers.

In an electron transport layer (3d) having a single layer structure and an electron transport layer (3d) having a stacked structure, the electron transport material (also serving as a hole blocking material) constituting the layer portion adjacent to the light-emitting layer (3c) may have a function of transmitting electrons injected from the cathode to the light-emitting layer (3c). As a material having such a function, an arbitrary material can be selected and used from among conventionally known compounds. Examples thereof include a nitro-substituted fluorene derivative, a diphenylquinone derivative, a thiopyran dioxide derivative, a carbodiimide, a fluorenylidenemethane derivative, an anthraquinodimethane, an anthrone derivative, an oxadiazole derivative, and the like. Further, as the material of the electron transport layer (3d), a thiadiazole derivative in which, in the oxadiazole derivative, the oxygen atom of the oxadiazole ring is substituted with a sulfur atom, and a quinoxaline derivative having a quinoxaline ring known as an electron withdrawing group are also be used. In addition, these materials may be introduced into a polymer chain, or a polymer material having these materials as the main chain of a polymer may be used.

Further, metal complexes of 8-quinolinol derivatives, such as tris(8-quinolinol)aluminum (abbreviation: Alq$_3$), tris(5,7-dichloro-8-quinolinol)aluminum, tris(5,7-dibromo-quinolinol)aluminum, tris(2-methyl-8-quinolinol)aluminum, tris(5-methyl-8-quinolinol)aluminum, bis 8-quinolinol)zinc (abbreviation: Znq), and the like, and metal complexes in which the central metal of those metal complexes is substituted with In, Mg, Cu, Ca, Sn, Ga, or Pb, can also be used as a constituent material of the electron transport layer (3d).

In addition, metal free or metal phthalocyanine, or such materials whose terminals are substituted with an alkyl group, a sulfonic acid group, or the like can also be preferably used as a constituent material of the electron transport layer (3d). Further, a distyrylpyrazine derivative also used as a constituent material of the light-emitting layer (3c) can also be used as a constituent material of the electron transport layer (3d). Similar to the hole injection layer (3a) and the hole transport layer (3b), inorganic semiconductors such as n-type Si and n-type SiC can also be used as a constituent material of the electron transport layer (3d).

The electron transport layer (3d) may be formed by reducing the thickness of the above-mentioned materials by a known method, such as a vacuum deposition method, a spin coating method, a casting method, a printing method including an inkjet method, an LB method, and the like. The thickness of the electron transport layer (3d) is not particularly limited, but it is usually in the range of 5 nm to 5 µm, and preferably in the range of 5 to 200 nm. The electron transport layer (3d) may have a single layer structure composed of one kind or two or more kinds of the above materials.

Further, it is possible to increase the n-property by doping the constituent material of the electron transport layer (3d) with impurities. Examples thereof include those described in Japanese Patent Laid-Open No. 4-297076, Japanese Patent Laid-Open No. 10-270172, Japanese Patent Laid-Open No. 2000-196140, Japanese Patent Laid-Open No. 2001-

102175, J. Appl. Phys., 95, 5773 (2004), and the like. Further, it is preferable for the electron transport layer (3d) to contain potassium, a potassium compound, or the like. As the potassium compound, for example, potassium fluoride or the like can be used. By increasing the n-property of the electron transport layer (3d) in this manner, an organic EL device having lower power consumption can be manufactured.

In addition, a compound including a heteroatom having an unshared electron pair constituting the metal affinity layer (1a) according to the present invention in the molecule may be used as a constituent material (electron transport compound) of the electron transport layer (3d). This also applies to the electron transport layer (3d) when it also serves as the electron injection layer (3e), in which a compound including a heteroatom having an unshared electron pair constituting the metal affinity layer (1a) according to the present invention may also be used.

(Blocking Layers: Hole Blocking Layer and Electron Blocking Layer)

The blocking layers are layers optionally provided in addition to the above-mentioned basic constituent layers of the light-emitting function layer unit (3). For example, examples of hole blocking layers and electron blocking layers are described in Japanese Patent Laid-Open Nos. 11-204258 and 11-204359, and on page 237 of "Organic EL Device and Their Industrialization Frontier" (published on Nov. 30, 1998, by NTS, Inc).

In a broad sense, a hole blocking layer has the function of the electron transport layer (3d). The hole blocking layer is composed of a hole blocking material having a function of transporting electrons while also having a remarkably low ability to transport holes. The hole blocking layer is capable of improving the probability of electrons and holes recombining by blocking holes while transporting electrons. Further, the electron transport layer (3d) structure can be used as a hole blocking layer as necessary. The hole blocking layer is preferably provided adjacent to the light-emitting layer (3c).

On the other hand, in a broad sense, an electron blocking layer has the function of the hole transport layer (3b). The electron blocking layer is composed of an electron blocking material having a function of transporting holes while also having a remarkably low ability to transport electrons. The electron blocking layer is capable of improving the probability of electrons and holes recombining by blocking electrons while transporting holes. Further, the hole transport layer (3b) structure can be used as an electron blocking layer as necessary. The thickness of the hole blocking layer is preferably in the range of 3 to 100 nm, and more preferably in the range of 5 to 30 nm.

(Auxiliary Electrode)

The auxiliary electrode (15) is provided for the purpose of lowering the resistance of the transparent electrode (1), and is provided in contact with the conductive layer (1b) of the transparent electrode (1). The material for forming the auxiliary electrode (15) is preferably a metal having a low electrical resistance, such as gold, platinum, silver, copper, aluminum, or the like. Since these metals have a low light-transmitting property, they are pattern-formed in a size range that does not influence the extraction of the emission light (L) from the light extraction surface (13a). Examples of a method of manufacturing such an auxiliary electrode (15) include a vapor deposition method, a sputtering method, a printing method, an ink jet method, an aerosol jet method, and the like. The line width of the auxiliary electrode (15) is preferably 50 μm or less from the viewpoint of the aperture ratio in the region from which light is extracted. The thickness of the auxiliary electrode (15) is preferably 1 μm or more from the viewpoint of conductivity.

(Sealing Material)

As shown in FIG. 2, the sealing material (17) covers the entire organic EL device (100). The sealing material (17) may be a plate-shaped (film-like) sealing member side that is fixed to the transparent substrate (13) side by the adhesive agent (19), or may be a sealing film. Such a sealing material (17) is provided in a state in which the terminal portions of the transparent electrode (1) and the counter electrode (5a) in the organic EL device (100) are exposed, and in which at least the light-emitting function layer unit (3) is covered. In addition, electrodes may be provided on the sealing material (17) so as to electrically connect to the terminal portions of the transparent electrode (1) and the counter electrode (5a) of the organic EL device (100).

Specific examples of the plate-like (film-like) sealing material (17) include a glass substrate, a polymer substrate, a metal substrate, and the like, and these substrate materials may also be used in a thin film form. Examples of the glass substrate include, in particular, soda-lime glass, barium strontium-containing glass, lead glass, aluminosilicate glass, borosilicate glass, barium borosilicate glass, quartz, and the like. Examples of the polymer substrate include polycarbonate, acrylic, polyethylene terephthalate, polyethersulfide, polysulfone, and the like. Examples of the metal substrate include substrates composed of one or more metals or alloys selected from the group consisting of stainless steel, iron, copper, aluminum, magnesium, nickel, zinc, chromium, titanium, molybdenum, silicon, germanium, and tantalum.

Among those, a polymer substrate or a metal substrate formed in a thin film shape can be preferably used as the sealing material as such substrates enable the organic EL device to be thinner.

In addition, the film-like polymer substrate preferably has an oxygen permeability of $1 \times 10^{-3}$ mL/(m²·24 h·atm) or less as measured by a method in accordance with JIS K 7126-1987 and a water vapor permeability (25±0.5° C., relative humidity 90±2% RH) measured by a method in accordance with JIS K 7129-1992 of $1 \times 10^{-3}$ g/(m²·24 h) or less.

Further, the substrate material such as described above may be used as the sealing material (17) by working it into a concave plate shape. In this case, the substrate material is subjected to processing such as sand blasting or chemical etching to form a concave shape.

The adhesive agent (19) for fixing such a plate-shaped sealing material (17) to the transparent substrate (13) side is used as a sealing agent for sealing the organic EL device (100) sandwiched between the sealing material (17) and the transparent substrate (13). Specific examples of the adhesive agent (19) include photocurable and thermosetting adhesive agents having a reactive vinyl group of an acrylic acid type oligomer or a methacrylic acid type oligomer, and moisture-curable adhesive agents such as a 2-cyanoacrylic acid ester.

Further, examples may also include thermosetting or chemically curing (two-pot mixing) adhesive agents such as epoxies, hot melt type polyamides, polyesters, polyolefins, and cation-curing type UV-curable epoxy resin adhesive agents.

Note that the organic materials constituting the organic EL device (100) may be degraded by heat treatment. Therefore, it is preferable that the adhesive agent (19) to be applied can be adhesively cured within a temperature range from room temperature to 80° C. Further, a desiccant may be dispersed in the adhesive agent (19).

The coating of the adhesive agent (19) onto the bonding portion between the sealing material (17) and the transparent substrate (13) may be carried out using a commercially available dispenser or by printing like in screen printing.

Further, when a gap (space) is to be formed between the plate-shaped sealing material (17), the transparent substrate (13), and the adhesive agent (19), in the gas phase or in the liquid phase, an inert gas such as nitrogen or argon, or an inert liquid such as a fluorohydrocarbon or silicone oil, can be injected. It is also possible to turn this gap into a vacuum. In addition, a hygroscopic compound can be sealed inside.

Examples of the hygroscopic compound include metal oxides (e.g., sodium oxide, potassium oxide, calcium oxide, barium oxide, magnesium oxide, aluminum oxide, etc.), sulfates (e.g., sodium sulfate, calcium sulfate, magnesium sulfate, cobalt sulfate, etc.), metal halides (e.g., calcium chloride, magnesium chloride, cesium fluoride, tantalum fluoride, cerium bromide, magnesium bromide, barium iodide, magnesium iodide, etc.), perchloric acids (e.g., barium perchlorate, magnesium perchlorate, etc.), and the like. In the case of sulfates, metal halides and perchloric acids, it is preferable to use an anhydrous salt thereof.

On the other hand, when a sealing film is used for the sealing material (17), the sealing film is provided on the transparent substrate (13) in a state in which the light-emitting function layer unit (3) in the organic EL device (100) is completely covered and the terminal portions of the transparent electrode (1) and the counter electrode (5a) in the organic EL device (100) are exposed.

Such a sealing film is constituted using an inorganic material or an organic material. In particular, the sealing film is preferably constituted from a material having a function of suppressing (acting as a barrier against) the infiltration of substances causing degradation of the light-emitting function layer unit (3) in the organic EL device (100), such as moisture and oxygen. As such a material, for example, an inorganic material such as silicon oxide, silicon dioxide, silicon nitride or the like is used. Further, in order to improve the brittleness of the sealing film, a hybrid structure obtained by alternately stacking a plurality of layers of a film composed of an organic material and a film composed of such inorganic materials may be employed.

Examples of methods that can be used to manufacture these sealing films include, but are not particularly limited to, a vacuum deposition method, a sputtering method, a reactive sputtering method, a molecular beam epitaxy method, a cluster ion beam method, an ion plating method, a plasma polymerization method, an atmospheric pressure plasma polymerization method, a plasma CVD method, a laser CVD method, a thermal CVD method, a coating method, and the like.

(Protective Film and Protective Plate)

A protective film or a protective plate may be provided together with the transparent substrate (13) so as to sandwich the organic EL device (100) and the sealing material (17). The protective film or protective plate is for mechanically protecting the organic EL device (100). In particular, when the sealing material (17) is a sealing film, since the mechanical protection of the organic EL device (100) is not sufficient, it is preferable to provide such a protective film or protective plate.

As the above-mentioned protective film or protective plate, a glass plate, a polymer plate, an even thinner polymer film, a metal plate, an even thinner metal film, a polymer material film, or a metal material film is applied. Of these, it is particularly preferable to use a polymer film because it is lightweight and thin.

[Manufacturing Method of Organic EL Device]

A method of manufacturing the organic EL device (100) having the structure shown in FIG. 2 will now be described as an example of the method of manufacturing the organic EL device.

First, the metal affinity layer (1a) according to the present invention, which contains a lanthanoid and an organic compound including a heteroatom having an unshared electron pair in the molecule, is formed on the transparent substrate (13) so as to have a thickness of 1 µm or less, and preferably 10 to 100 nm, by a known thin film forming method, such as a vapor deposition method. Next, the conductive layer (1b), which has silver (or an alloy containing silver) as a main component, is formed on the metal affinity layer (1a) so as to have a thickness in the range of 5 to 20 nm, and preferably 5 to 12 nm, by a known thin film forming method, such as a vapor deposition method, to manufacture a transparent electrode (1) to serve as an anode.

Next, the hole injection layer (3a), the hole transport layer (3b), the light-emitting layer (3c), the electron transport layer (3d), and the electron injection layer (3e) are deposited in that order on the transparent electrode (1) to form the light-emitting function layer unit (3). For the deposition of each of these layers, a spin coating method, a casting method, an inkjet method, a vapor deposition method, a printing method, or the like can be applied, but from the viewpoints that a homogeneous film is easily obtained, pinholes are less likely to occur, and the like, a vapor deposition or spin coating method is particularly preferred. Further, a different deposition method may be applied for each layer. In the case of employing a vapor deposition method for the deposition of each of these layers, although the vapor deposition conditions depend on the type of the compound to be used and the like, in general, it is preferable to appropriately select the respective conditions within a range of a boat heating temperature of 50 to 450° C., a degree of vacuum of $1\times10^{-6}$ to $1\times10^{-2}$ Pa, a deposition rate of 0.01 to 50 nm/sec, a substrate temperature of −50 to 300° C., and a thickness of 0.1 to 5 µm.

After the light-emitting function layer unit (3) is formed as described above, the counter electrode (5a) to serve as a cathode is formed on an upper portion thereof by a known thin film forming method, such as a vapor deposition method or a sputtering method. At this time, while keeping the counter electrode (5a) insulated from the transparent electrode (1) via the light-emitting function layer unit (3), the counter electrode (5a) is pattern-formed on the peripheral edge of the transparent substrate (13) from above the light-emitting function layer unit (3) in a shape in which the terminal portion is drawn out. As a result, the organic EL device (100) is obtained. Then, the sealing material (17) covering at least the light-emitting function layer unit (3) is provided such that the terminal portions of the transparent electrode (1) and counter electrode (5a) in the organic EL device (100) have been exposed.

In this way, an organic EL device (100) having a desired configuration on the transparent substrate (13) is obtained. In the manufacture of such an organic EL device (100), it is preferable to consistently manufacture from the light-emitting function layer unit (3) to the counter electrode (5a) with one evacuation, but the organic EL device (100) may also be manufactured by removing the transparent substrate (13) from the vacuum atmosphere during the manufacturing process and carrying out a different deposition method. At that time, care should be taken to ensure that the operation is carried out under a dry inert gas atmosphere.

When a direct voltage is applied to the organic EL device (100) thus obtained, taking the polarity of the transparent electrode (1) as the anode to be "+" and the polarity of the counter electrode (5a) as the cathode to be "−", light emission can be observed by applying the direct voltage in the voltage range of 2 to 40 V. Alternatively, an alternating voltage may be applied. The waveform of the applied alternating current may be arbitrary.

[Effects of Organic EL Device]

In the above-mentioned organic EL device (100), the transparent electrode (1) of the present invention having both conductivity and a light-transmitting property is used as an anode, and the light-emitting function layer unit (3) and the counter electrode (5a) serving as the cathode are provided on an upper portion thereof. For this reason, while realizing high luminance emission as the organic EL device (100) by applying a sufficient voltage between the transparent electrode (1) and the counter electrode (5a), high luminance can be achieved by improving the extraction efficiency of the emission light (L) from the transparent electrode (1) side. In addition, it is possible to lower the driving voltage for obtaining a predetermined luminance, and also to improve emission life.

Application Example 2 to Organic EL Device

[Structure of Organic EL Device]

Figure 3:
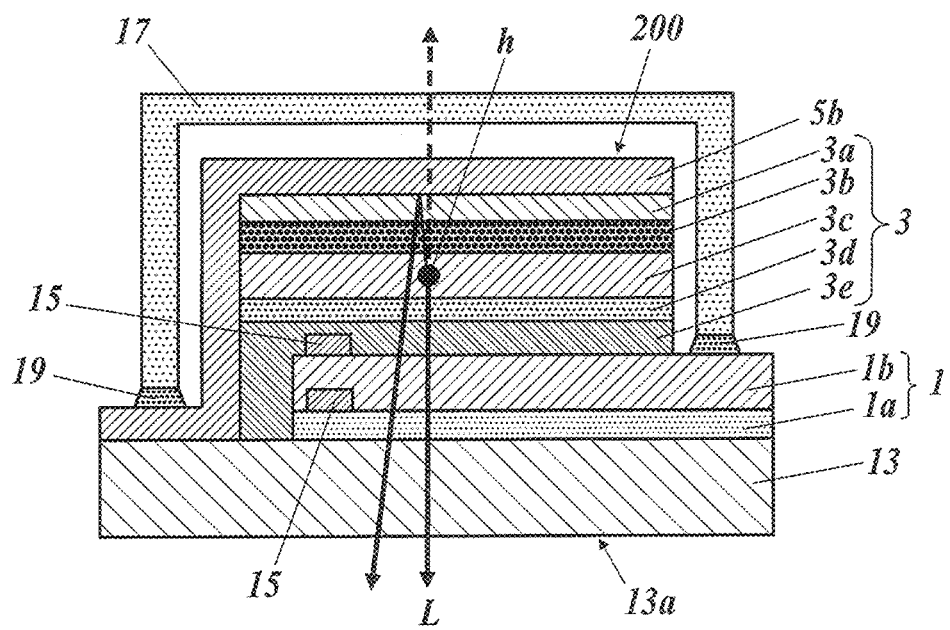
FIG. 3 is a schematic cross-sectional view showing a second example of a structure of an organic EL device using the transparent electrode of the present invention.

FIG. 3 is a schematic cross-sectional view showing an application example 2 of the organic EL device using the transparent electrode (1) of the present invention as an example of the electronic device of the present invention.

The difference between the organic EL device (100) of the application example 1 shown in FIG. 2 described above and the organic EL device (200) of the application example 2 shown in FIG. 3 is that the organic EL device (200) uses the transparent electrode (1) as the cathode (negative electrode). In the following, a redundant detailed description of constituent elements that are the same as those in the application example 1 shown in FIG. 2 is omitted, and just the characteristic features of the organic EL device (200) of the application example 2 are described.

As shown in FIG. 3, the organic EL device (200) is provided on the transparent substrate (13). Similar to the application example 1 shown in FIG. 2, the transparent electrode (1) of the present invention described above is used as the transparent electrode (1) on the transparent substrate (13). Therefore, the organic EL device (200) is configured such that the emission light (L) can be extracted from at least the transparent substrate (13) side. However, this transparent electrode (1) is used as the cathode (negative electrode). Therefore, the counter electrode (5b) is used as the anode (positive electrode).

The layer structure of the organic EL device (200) configured in this way is not limited to the example described below. As with the application example 1, the layer structure may also be a typical layer structure.

An example of the application example 2 shown in FIG. 3 is a structure in which the electron injection layer (3e)/electron transport layer (3d)/light-emitting layer (3c)/hole transport layer (3b)/hole injection layer (3a) are stacked in that order on an upper portion of the transparent electrode (1) serving as the cathode. However, among these layers, it is essential to have at least the light-emitting layer (3c) constituted using an organic material.

In addition to these layers, similar to the case described in application example 1, the light-emitting function layer unit (3) can also optionally employ various other constituent layers. In such a configuration, the fact that only the portion where the light-emitting function layer unit (3) is sandwiched between the transparent electrode (1) and the counter electrode (5b) serves as a light-emitting region in the organic EL device (200) is the same as application example 1.

Further, in the layer structure as described above, the point that an auxiliary electrode (15) may be provided in contact with the conductive layer (1b) of the transparent electrode (1) for the purpose of lowering the resistance of the transparent electrode (1) is the same as in the application example 1 shown in FIG. 2.

Here, the counter electrode (5b) used as the anode is made of a metal, an alloy, an organic or inorganic conductive compound, a mixture thereof, or the like. Specific examples include metals such as gold (Au), oxide semiconductors such as copper iodide (Cue, ITO, ZnO, $TiO_2$, $SnO_2$, and the like.

The counter electrode (5b) configured as described above can be manufactured by forming a thin film of these conductive materials by a method such as vapor deposition or sputtering. Further, the sheet resistance value as the counter electrode (5b) is several hundred Ω/sq. or less, and the thickness is usually in the range of 5 nm to 5 μm, and preferably selected in the range of 5 to 200 nm.

If the organic EL device (200) is configured so that the emission light (L) is also extracted from the counter electrode (5b) side, as the material constituting the counter electrode (5b), a conductive material having a good light-transmitting property is selected and used from among the above-mentioned conductive materials.

The organic EL device (200) having such a structure is sealed with the sealing material (17) in the same manner as in the application example 1 for the purpose of preventing degradation of the light-emitting function layer unit (3).

Of the main layers constituting the organic EL device (200) described above, the details of the constituent elements other than the counter electrode (5b) used as the anode, and the method of manufacturing the organic EL device (200), are the same as those of the application example 1, and hence a detailed description thereof is omitted here.

[Effects of Organic EL Device]

In the above-mentioned organic EL device (200), the transparent electrode (1) of the present invention having both conductivity and a light-transmitting property is used as a cathode (negative electrode), and the light-emitting function layer unit (3) and the counter electrode (5b) serving as the anode are provided on an upper portion thereof. For this reason, in the same manner as in application example 1, while realizing high luminance emission as the organic EL device (200) by applying a sufficient voltage between the transparent electrode (1) and the counter electrode (5b), high luminance can be achieved by improving the extraction efficiency of the emission light (L) from the transparent electrode (1) side. In addition, it is possible to lower the driving voltage for obtaining a predetermined luminance, and also to improve emission life.

Application Example 3 of Organic EL Device

[Structure of Organic EL Device]

Figure 4:
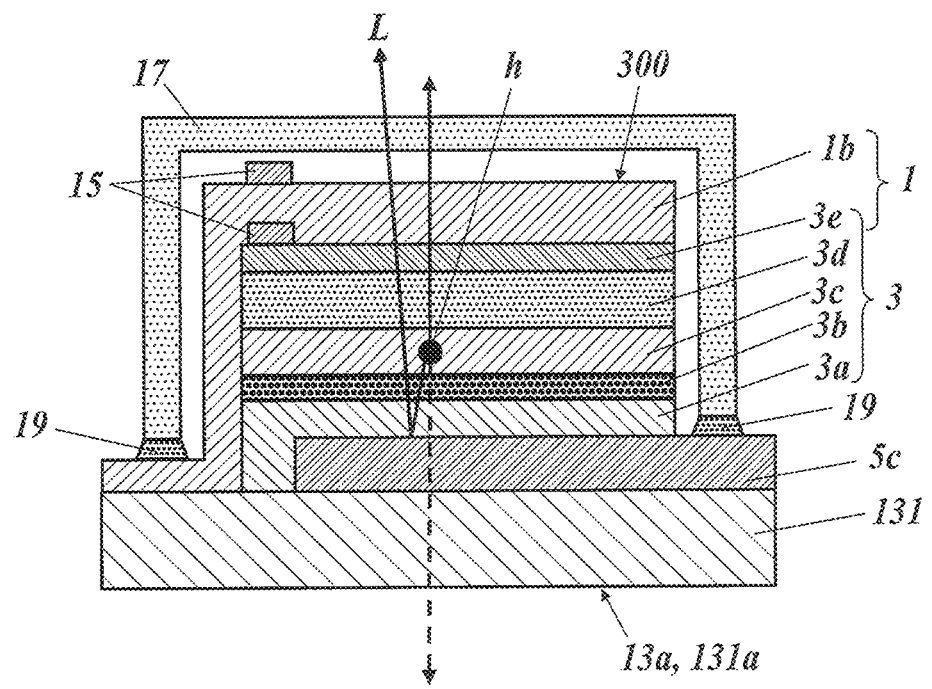
FIG. 4 is a schematic cross-sectional view showing a third example of a structure of an organic EL device using the transparent electrode of the present invention.

FIG. 4 is a schematic cross-sectional view showing an application example 3 of the organic EL device using the transparent electrode (1) of the present invention as an example of the electronic device of the present invention.

The difference between the organic EL device (100) of the application example 1 shown in FIG. 2 and the organic EL device (300) of the application example 3 shown in FIG. 4 is that, in the organic EL device (300), a counter electrode (5c) is provided on a substrate (131) side, and the light-emitting function layer unit (3) and the transparent electrode (1) are stacked in that order on an upper portion thereof. In the following, a redundant detailed description of constituent elements that are the same as those in the application example 1 is omitted, and only the characteristic features of the organic EL device (300) of the application example 3 are described.

The organic EL device (300) shown in FIG. 4 is provided on the substrate (131). The counter electrode (5c) serving as the anode, the light-emitting function layer unit (3), and the transparent electrode (1) serving as the cathode are stacked in that order from the substrate (131) side. Among these layers, the transparent electrode (1) of the present invention described above is used as the transparent electrode (1). As a result, the organic EL device (300) is configured such that the emission light (L) is extracted from at least the transparent electrode (1) side, which is opposite to the substrate (131).

The layer structure of the organic EL device (300) configured in this way is not limited to the example described below. As with the application example 1, the layer structure may also be a typical layer structure.

An example of the application example 3 shown in FIG. 4 is a structure in which the hole injection layer (3a)/hole transport layer (3b)/light-emitting layer (3c)/electron transport layer (3d)/electron injection layer (3e) are stacked in that order on an upper portion of the counter electrode (5c) functioning as the anode. However, among these layers, it is essential to have at least the light-emitting layer (3c) constituted using an organic material.

In particular, the characteristic feature of the organic EL device (300) of the application example 3 is that the electron injection layer (3e) having an electron injection property functions as a metal affinity layer in the transparent electrode (1). Specifically, in the application example 3, the transparent electrode (1) used as the cathode is constituted from a metal affinity layer that also serves as the electron injection layer (3e) having an electron injection property, and the conductive layer (1b) provided on an upper portion thereof.

Such an electron injection layer (3e) is constituted using the material constituting the metal affinity layer (1a) of the transparent electrode (1) of the present invention described above.

In addition to these layers, similar to the case described in application example 1, the light-emitting function layer unit (3) can also optionally employ various other constituent layers. However, an electron injection layer or a hole blocking layer are not provided between the electron injection layer (3e), which also serves as the metal affinity layer (1a) of the transparent electrode (1), and the conductive layer (1b) of the transparent electrode (1). In such a configuration, the fact that only the portion where the light-emitting function layer unit (3) is sandwiched between the transparent electrode (1) and the counter electrode (5c) serves as a light-emitting region in the organic EL device (300) is the same as application example 1.

Further, in the layer structure as described above, the point that an auxiliary electrode (15) may be provided in contact with the conductive layer (1b) of the transparent electrode (1) for the purpose of lowering the resistance of the transparent electrode (1) is the same as in the application example 1.

In addition, the counter electrode (5c) used as the anode is made of a metal, an alloy, an organic or inorganic conductive compound, a mixture thereof, or the like. Specific examples include metals such as gold (Au), oxide semiconductors such as copper iodide (Cup, ITO, ZnO, $TiO_2$, $SnO_2$, and the like.

The counter electrode (5c) configured as described above can be manufactured by forming a thin film of these conductive materials by a method such as vapor deposition or sputtering. Further, the sheet resistance value as the counter electrode (5c) is several hundred Ω/sq. or less, and the thickness is usually 5 nm to 5 μm, and preferably selected in the range of 5 to 200 nm.

If the organic EL device (300) is configured so that the emission light (L) is also extracted from the counter electrode (5c) side, as the material constituting the counter electrode (5c), a conductive material having a good light-transmitting property is selected and used from among the above-mentioned conductive materials. In this case, as the substrate (131), the same substrate as the transparent substrate (13) described in the application example 1 is used, and the surface facing the outside of the substrate (131) is a light extraction surface (131a).

[Effects of Organic EL Device]

In the organic EL device (300) described above, an electron transport layer (3d) having an electron injection property constituting the uppermost portion of the light-emitting function layer unit (3) is provided as the metal affinity layer (1a), and the conductive layer (1b) is provided on an upper portion thereof. As a result, the transparent electrode (1) composed of the metal affinity layer (1a) and the conductive layer (1b) on an upper portion thereof serves as the cathode. Therefore, similar to the application example 1 and the application example 2, while realizing high luminance emission as the organic EL device (300) by applying a sufficient voltage between the transparent electrode (1) and the counter electrode (5c), high luminance can be achieved based on an improvement in the extraction efficiency of the emission light (L) from the transparent electrode (1) side. In addition, it is possible to lower the drive voltage for obtaining a predetermined luminance, and also to improve emission life. Further, when the counter electrode (5c) has a light-transmitting property, the emission light (L) can also be extracted from the counter electrode (5c), as indicated by the dashed line.

For the application example 3 shown in FIG. 4, the metal affinity layer (1a) of the transparent electrode (1) has been described as also serving as the electron transport layer (3d) having an electron injection property. However, this application example is not limited to that configuration, and the metal affinity layer (1a) may also serve as an electron transport layer (3d) that does not have an electron injection property, or the metal affinity layer (1a) serve as an electron injection layer instead of an electron transport layer. In addition, the metal affinity layer (1a) may be formed as an extremely thin film to the extent that such a thickness does not affect the light-emitting function of the organic EL device. In this case, the metal affinity layer (1a) does not have an electron transport property or an electron injection property.

Furthermore, when the metal affinity layer (1a) of the transparent electrode (1) is formed as an extremely thin film to the extent that its thickness does not affect the light-emitting function of the organic EL device, the counter electrode (5c) on the substrate (131) side may serve as the cathode and the transparent electrode (1) on the light-emitting function layer unit (3) may serve as the anode. In this case, for example, the light-emitting function layer unit (3) is formed by stacking, in order from the counter electrode (cathode, 5c) side on the substrate (131), in order, the electron injection layer (3e)/electron transport layer (3d)/light-emitting layer (3d)/light-emitting layer (3c)/hole transport layer (3b)/hole injection layer (3a). A transparent electrode (1) composed of a stacked structure of the extremely thin metal affinity layer (1a) and the conductive layer (1b) is provided on an upper portion thereof as an anode.

Application Example 4 of Organic EL Device

Figure 5:
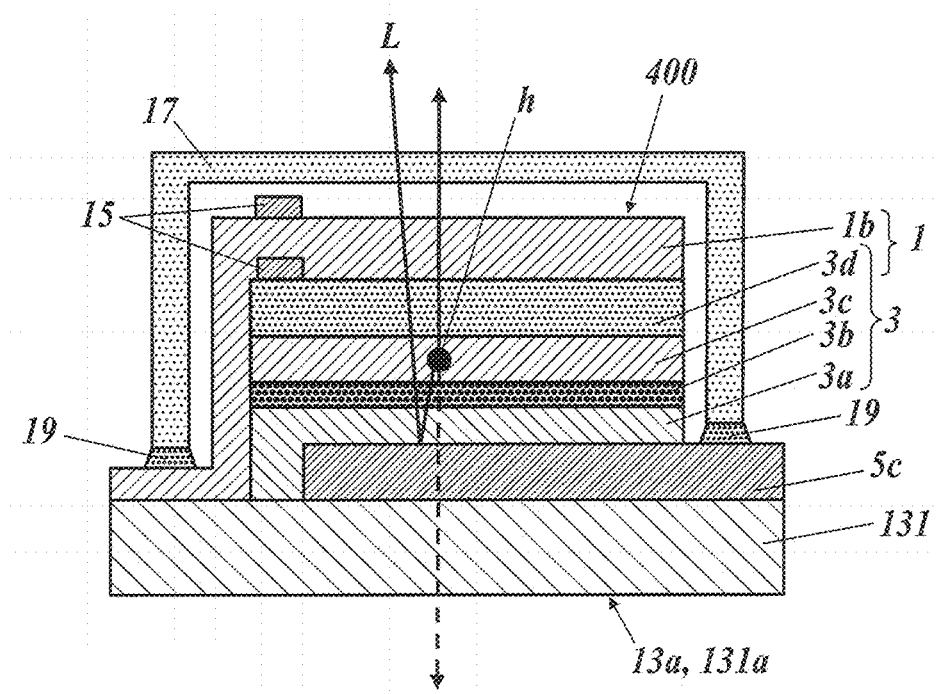
FIG. 5 is a schematic cross-sectional view showing a fourth example of a structure of an organic EL device using the transparent electrode of the present invention.

[Structure of Organic EL Device]
FIG. 5 is a schematic cross-sectional view showing an application example 4 of the organic EL device using the transparent electrode (1) of the present invention as an example of the electronic device of the present invention.

The difference between the organic EL device (400) of the application example 4 shown in FIG. 5 and the organic EL device (300) of the application example 3 shown in FIG. 4 is the structure in which the hole injection layer (3a)/hole transport layer (3b)/light-emitting layer (3c)/electron transport layer (3d) are stacked in that order on an upper portion of the counter electrode (5c) functioning as the anode. However, among these layers, it is essential to have at least the light-emitting layer (3c) constituted using an organic material. Here, the electron transport layer (3d) also serves as the electron injection layer (3e), and is provided as an electron transport layer (3d) having an electron injection property.

In particular, the characteristic feature of the organic EL device (400) of the application example 4 is that the electron transport layer (3d) having an electron injection property functions as the metal affinity layer (1a) in the transparent electrode (1). Specifically, in the application example 4, the transparent electrode (1) used as the cathode is constituted from a metal affinity layer (1a) that also serves as the electron transport layer (3d) having an electron injection property, and the conductive layer (1b) provided on an upper portion thereof.
Is not.

<Organic EL Device Applications>
The organic EL devices with the various configurations as described above are each surface light-emitters, and hence can be used as various types of emission light sources. Examples thereof may include lighting devices such as household lighting and automobile interior lighting, backlights of watches and liquid crystal display devices, signboard advertising light sources, traffic signal light sources, optical storage media light sources, electrophotographic copying machine light sources, optical communication processing machine light sources, optical sensor light sources, and the like. In particular, these organic El device can be effectively used in applications as a backlight of a liquid crystal display device combined with a color filter, and as a lighting light source.

Further, the organic EL device of the present invention may be used as a kind of lamp for lighting or for an exposure light source, or may be used as a projection device of a type that projects an image or a display device (display) of a type for directly viewing a still image or a moving image. In this case, with the increase in recent years of the size of the lighting device and displays, the surface area of the light-emitting surface may be increased by so-called tiling, in which light-emitting panels provided with an organic El device are joined together in a plane.

When used as a display device for playing back moving images, the driving method may be either a simple matrix (passive matrix) method or an active matrix method. It is also possible to manufacture a color or full color display device by using two or more kinds of organic EL devices of the present invention having different light emission colors.

Hereinafter, a lighting device is described as an example of an application, after which a lighting device having a larger light-emitting surface area as a result of tiling will be described.

[Lighting Device]
The lighting device according to the present invention can comprise the organic EL device of the present invention.

The organic EL device used for the lighting device according to the present invention may be designed such that each organic EL device configured as described above has a resonator structure. Examples of uses of the organic EL device configured so as to have a resonator structure, include, but are not limited to, being used as an optical storage media light source, an electrophotographic copying machine light source, an optical communication processor light source, an optical sensor light source, and the like. However, such an organic EL device may be used for the above-mentioned applications by causing laser oscillation.

Note that the materials used for the organic EL device of the present invention can be applied to an organic EL device (white organic EL device) that produces substantially white light emission. For example, white light emission can be obtained from a mixture of colors causing a plurality of light emitting materials to emit a plurality of light emission colors at the same time. The combination of a plurality of light emission colors may be a combination of three emission maximum wavelengths of the three primary colors of red, green, and blue, or a combination of two maximum emission wavelengths utilizing the relationship between complementary colors, such as blue and yellow, blue-green and orange, and the like.

In addition, the combination of light-emitting materials for obtaining a plurality of light emission colors may also be a combination of a plurality of materials emitting a plurality of phosphorescence light or fluorescence light, or a combination of a light-emitting material that emits fluorescence or phosphorescence and a dye material that emits light from a light-emitting material as excitation light. However, for a white organic EL device, it is preferable to mix a plurality of light-emitting dopants in combination.

In such a white organic EL device, the organic EL device itself emits white light, unlike a configuration in which white light emission is obtained by individually arranging organic EL devices of each color light emission in an array. This enables deposition to be carried out on just one surface by a vapor deposition method, a casting method, a spin coating method, an ink jet method, a printing method or the like, without needing a separate mask for the deposition of most of the layers constituting the organic EL device, thereby also enabling increased productivity.

The light-emitting material to be used for the light-emitting layer of such a white organic EL device is not particularly limited. For example, in the case of a backlight for a liquid crystal display device, the white light may be emitted by selecting and combining arbitrary above-mentioned metal complexes or known light-emitting materials so as to match the wavelength range corresponding to the CF (color filter) characteristics.

Using the white organic EL device described above enables a lighting device that produces substantially white light emission to be manufactured.

EXAMPLES

Hereinafter, the present invention will be specifically described with reference to examples, but the present invention is not limited thereto.

Example 1

<Manufacture of Transparent Electrodes>

In accordance with the following method, transparent electrodes 1 to 30 having a conductive region area of 5 cm×5 cm were manufactured. The transparent electrodes 1 to 4 were manufactured as a transparent electrode having a single layer structure consisting only of the conductive layer (1b), and the transparent electrodes 5 to 30 were manufactured as a transparent electrode having a stacked structure of a metal affinity layer (1a) and a conductive layer (1b).

[Manufacture of Transparent Electrode 1]

A base material made of transparent alkali-free glass was fixed to a base material holder of a commercially available vacuum deposition apparatus, and the base material holder was mounted in a vacuum chamber of a vacuum deposition apparatus. Meanwhile, a tungsten resistive heating boat was filled with silver (Ag) and mounted in the vacuum chamber. Next, the interior of the vacuum chamber was depressurized to $4 \times 10^{-4}$ Pa, and then the resistance heating boat was energized and heated, whereby a 5 nm-thick conductive layer (1b) of silver was deposited on the base material at a deposition rate within the range of 0.1 to 0.2 nm/sec to thereby manufacture a transparent electrode 1 having a single layer structure.

[Manufacture of Transparent Electrodes 2 to 4]

Transparent electrodes 2 to 4 were manufactured in the same manner as transparent electrode 1, except that the deposition time was appropriately changed, and the thickness of the conductive layer (1b) was changed to 8.5 nm, 10 nm, and 15 nm, respectively.

[Manufacture of Transparent Electrode 5]

A metal affinity layer (1a) having a thickness of 30 nm was deposited by sputtering using the Alq$_3$ shown below on a base material made of transparent alkali-free glass, and an 8.5 nm-thick conductive layer (1b) made of silver was formed on an upper portion of this metal affinity layer (1a) by vapor deposition in the same manner as the transparent electrode 2 to manufacture a transparent electrode 5.

[Formula 27]

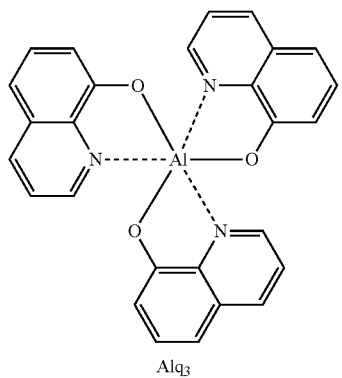

Alq$_3$

[Manufacture of Transparent Electrode 6]

A base material made of transparent alkali-free glass was fixed to the base material holder of a commercially available vacuum deposition apparatus, the ET-1 shown below was filled in a tantalum resistive heating boat, and the substrate holder and the heating boat were mounted in a first vacuum chamber of the vacuum deposition apparatus. Further, a tungsten resistive heating boat was filled with silver and mounted in a second vacuum chamber.

[Formula 28]

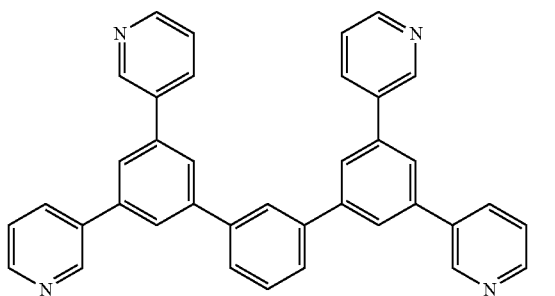

ET-1

First, the first vacuum chamber was depressurized to $4 \times 10^{-4}$ Pa, then the ET-1-containing heating boat was energized and heated, and a 30 nm-thick metal affinity layer (1a) made of ET-1 was formed on the base material at a deposition rate in the range of 0.1 to 0.2 nm/sec.

Next, the base material deposited up to the metal affinity layer (1a) was transferred to the second vacuum chamber while maintaining the vacuum, the second vacuum chamber was depressurized to $4 \times 10^{-4}$ Pa, and then the heating boat containing silver was energized and heated, whereby an 8.5 nm-thick conductive layer (1b) made of silver was formed at a deposition rate in the range of 0.1 to 0.2 nm/sec to thereby manufacture a transparent electrode 6 formed from a stacked structure of the metal affinity layer (1a) composed of ET-1 and the conductive layer (1b) made of silver.

[Manufacture of Transparent Electrodes 7 to 9]

Transparent electrodes 7 to 9 were manufactured in the same manner as the transparent electrode 6, except that the constituent materials of the metal affinity layer (1a) were changed to ET-2 to ET-4, respectively, shown below.

[Formula 29]

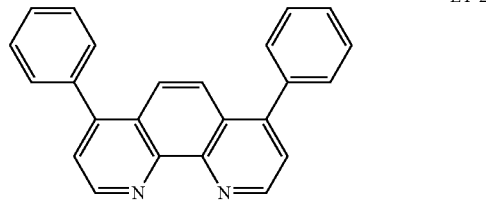

ET-2

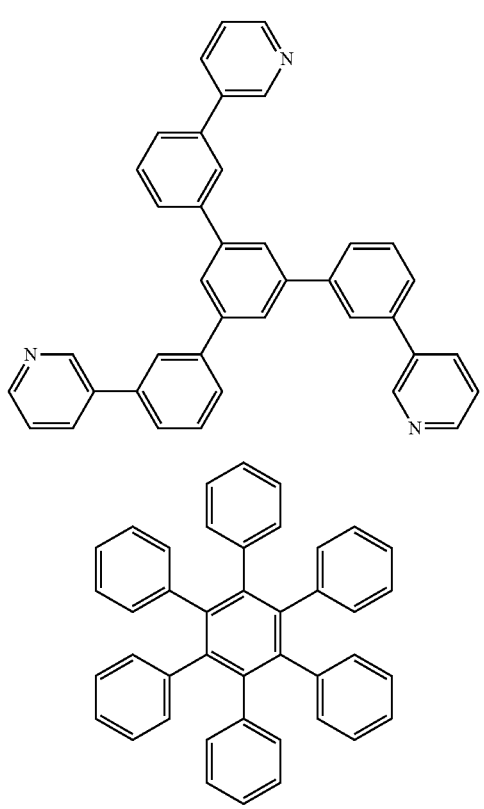

[Manufacture of Transparent Electrode 10]

A base material made of transparent alkali-free glass was fixed to the base material holder of a commercially available vacuum deposition apparatus, as an organic compound including a heteroatom having an unshared electron pair in the molecule, Example Compound No. 14 was filled in a tantalum resistive heating boat, and the substrate holder and the heating boat were mounted in a first vacuum chamber of the vacuum deposition apparatus. Further, a tungsten resistive heating boat was filled with silver and mounted in a second vacuum chamber.

In this state, first, the first vacuum chamber was depressurized to $4 \times 10^{-4}$ Pa, then the Example Compound No. 14-containing heating boat was energized and heated, and a 30 nm-thick metal affinity layer (1a) made of Example Compound No. 14 was formed on the base material at a deposition rate in the range of 0.1 to 0.2 nm/sec.

Next, the base material deposited up to the metal affinity layer (1a) was transferred to the second vacuum chamber while maintaining the vacuum, the second vacuum chamber was depressurized to $4 \times 10^{-4}$ Pa, and then the heating boat containing silver was energized and heated, whereby a 5 nm-thick conductive layer (1b) made of silver was formed at a deposition rate in the range of 0.1 to 0.2 nm/sec to thereby manufacture a transparent electrode 10 formed from a stacked structure of the metal affinity layer (1a) composed of only Example Compound No. 14 and the conductive layer (1b) made of silver.

[Manufacture of Transparent Electrode 11]

A base material made of transparent alkali-free glass was fixed to the base material holder of a commercially available vacuum deposition apparatus, LiQ (mono(8-quinolinolato) lithium complex) and Yb as a lanthanoid were each filled in a tantalum resistive heating boat, and the substrate holder and the heating boat were mounted in a first vacuum chamber of the vacuum deposition apparatus. Further, a tungsten resistive heating boat was filled with silver and mounted in a second vacuum chamber.

In this state, first, the first vacuum chamber was depressurized to $4 \times 10^{-4}$ Pa, then the LiQ and the Yb were prepared so as to achieve a deposition rate of 1:1, and a 30 nm-thick metal affinity layer (1a) made of LiQ and Yb was provided on the base material.

Next, the base material deposited up to the metal affinity layer (1a) was transferred to the second vacuum chamber while maintaining the vacuum, the second vacuum chamber was depressurized to $4 \times 10^{-4}$ Pa, and then the heating boat containing silver was energized and heated, whereby an 8.5 nm-thick conductive layer (1b) made of silver was formed at a deposition rate in the range of 0.1 to 0.2 nm/sec to thereby manufacture a transparent electrode 11 formed from a stacked structure of the metal affinity layer (1a) composed of LiQ and Yb and the conductive layer (1b) made of silver.

[Manufacture of Transparent Electrodes 12 to 15]

Transparent electrodes 12 to 15 were produced in the same manner as the transparent electrode 11, except that the materials shown in Table III were used as the constituent materials of the metal affinity layer (1a) instead of LiQ and Yb.

[Manufacture of Transparent Electrode 16]

A transparent electrode 16 was manufactured in the same manner as the transparent electrode 2, except that the constituent material of the conductive layer (1b) was changed from Ag to an alloy of Ag:Mg=9:1 (mass ratio).

[Manufacture of Transparent Electrode 17]

A transparent electrode 17 was manufactured in the same manner as the transparent electrode 3, except that the constituent material of the conductive layer (1b) was changed from Ag to an alloy of Ag:Mg=9:1 (mass ratio).

[Manufacture of Transparent Electrode 18]

A transparent electrode 18 was manufactured in the same manner as the transparent electrode 12, except that the constituent material of the conductive layer (1b) was changed from Ag to an alloy of Ag:Mg=9:1 (mass ratio).

[Manufacture of Transparent Electrode 19]

A transparent electrode 19 was manufactured in the same manner as the transparent electrode 10, except that the constituent material of the conductive layer (1b) was changed from Ag to an alloy of Ag:Mg=9:1 (mass ratio).

[Manufacture of Transparent Electrode 20]

A transparent electrode 20 was manufactured in the same manner as the transparent electrode 11, except that the constituent material of the conductive layer (1b) was changed from Ag to an alloy of Ag:Mg=9:1 (mass ratio).

[Manufacture of Transparent Electrodes 21 to 23]

Transparent electrodes 21 to 23 were manufactured in the same manner as the transparent electrodes 13 to 15, except that the constituent material of the conductive layer (1b) was changed from Ag to an alloy of Ag:Mg=9:1 (mass ratio).

[Manufacture of Transparent Electrodes 24 to 27] Transparent electrodes 24 to 27 were manufactured in the same manner as the transparent electrode 14, except that a 60 nm-thick capping layer was stacked on the conductive layer (1b) by further using the constituent materials shown in Table III.

[Formula 30]

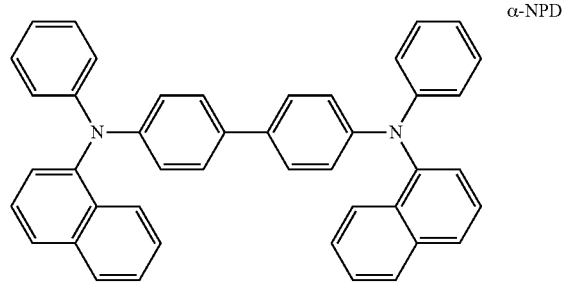

α-NPD

[Manufacture of Transparent Electrodes 28 to 30]

Transparent electrodes 28 to 30 were manufactured in the same manner as the transparent electrode 23, except that a 60 nm-thick capping layer was stacked on the conductive layer (1b) by further using the constituent materials shown in Table III.

<Evaluation of Transparent Electrodes>

The light transmittance, sheet resistance value, and heat resistance (amount of change in sheet resistance value) of the manufactured transparent electrodes 1 to 30 were measured according to the following methods.

[Measurement of Light Transmittance]

The light transmittance (%) at a wavelength of 500 nm was measured for each manufactured transparent electrode using a spectrophotometer (U-3300 manufactured by Hitachi, Ltd.) with the base material (transparent alkali-free glass) of each transparent electrode as a reference.

[Measurement of Sheet Resistance Value]

The sheet resistance value (Ω/sq.) was measured for each of the manufactured transparent electrodes using a resistivity meter (MCP-T610, manufactured by Mitsubishi Chemical Analytech Co., Ltd.) with a 4-terminal 4-probe constant current application method.

[Measurement of Amount of Change in Sheet Resistance Value]

Each of the manufactured transparent electrodes was stored for 240 hours in a high-temperature environment (temperature 80° C.), then the sheet resistance value (Ω/sq.) was measured, and the amount of change (Ω/sq.) with respect to the sheet resistance value before high-temperature storage determined in "Measurement of Sheet Resistance Value" described above was calculated.

The amount of change in the sheet resistance value is indicated as a relative value with respect to an amount of change in the sheet resistance value of the transparent electrode 10 of 100.

The measurement results obtained in the above are shown in Table III.

TABLE III

| Transparent Electrode No. | Base Layer (Metal Affinity Layer (1a)) Constituent Material | Conductive Layer (1b) Constituent Material | Thickness [nm] | Capping Layer Constituent Material | Evaluation Results Light Transmittance [%] | Sheet Resistance Value [Ω/sq.] | Amount of Change in Sheet Resistance Value | Note |
|---|---|---|---|---|---|---|---|---|
| 1 | — | Ag | 5.0 | — | 30 | Measurement not possible | — | Comparative Example |
| 2 | — | Ag | 8.5 | — | 42 | 452 | Measurement not possible | Comparative Example |
| 3 | — | Ag | 10.0 | — | 38 | 41 | Measurement not possible | Comparative Example |
| 4 | — | Ag | 15.0 | — | 22 | 10 | Measurement not possible | Comparative Example |
| 5 | Alq3 | Ag | 8.5 | — | 43 | 202 | 304 | Comparative Example |
| 6 | ET-1 | Ag | 8.5 | — | 44 | 42 | 372 | Comparative Example |
| 7 | ET-2 | Ag | 8.5 | — | 46 | 33 | 281 | Comparative Example |
| 8 | ET-3 | Ag | 8.5 | — | 46 | 23 | 247 | Comparative Example |
| 9 | ET-4 | Ag | 8.5 | — | 42 | 62 | 368 | Comparative Example |
| 10 | Example Compound No.14 | Ag | 8.5 | — | 73 | 6.9 | 100 | Comparative Example |
| 11 | LiQ:Yb (1:1) | Ag | 8.5 | — | 52 | 48 | 264 | Comparative Example |
| 12 | LiQ | Ag | 8.5 | — | 48 | 120 | 273 | Comparative Example |
| 13 | Example Compound No. 14:LiQ (1:1) | Ag | 8.5 | — | 68 | 9.8 | 132 | Comparative Example |
| 14 | Example Compound No. 14:Yb (1:1) | Ag | 8.5 | — | 78 | 5.8 | 89 | Present Invention |
| 15 | Example Compound No. 92:Yb (1:1) | Ag | 8.5 | — | 76 | 5.2 | 82 | Present Invention |
| 16 | — | Ag:Mg (9:1) | 8.5 | — | 55 | 630 | Measurement not possible | Comparative Example |
| 17 | — | Ag:Mg (9:1) | 10.0 | — | 50 | 62 | Measurement not possible | Comparative Example |

TABLE III-continued

| Transparent Electrode No. | Base Layer (Metal Affinity Layer (1a)) Constituent Material | Conductive Layer (1b) Constituent Material | Thickness [nm] | Capping Layer Constituent Material | Light Transmittance [%] | Sheet Resistance Value [Ω/sq.] | Amount of Change in Sheet Resistance Value | Note |
|---|---|---|---|---|---|---|---|---|
| 18 | LiQ | Ag:Mg (9:1) | 8.5 | — | 52 | 320 | Measurement not possible | Comparative Example |
| 19 | Example Compound No. 14 | Ag:Mg (9:1) | 8.5 | — | 75 | 20 | 161 | Comparative Example |
| 20 | LiQ:Yb (1:1) | Ag:Hg (9:1) | 8.5 | — | 70 | 163 | 262 | Comparative Example |
| 21 | Example Compound No. 14:LiQ (1:1) | Ag:Mg (9:1) | 8.5 | — | 72 | 26 | 184 | Comparative Example |
| 22 | Example Compound No. 14:Yb (1:1) | Ag:Mg (9:1) | 8.5 | — | 80 | 12 | 83 | Present Invention |
| 23 | Example Compound No. 92:Yb (1:1) | Ag:Mg (9:1) | 8.5 | — | 78 | 10 | 78 | Present Invention |
| 24 | Example Compound No. 14:Yb (1:1) | Ag | 8.5 | α-NPD | 74 | — | — | Present Invention |
| 25 | Example Compound No. 14:Yb (1:1) | Ag | 8.5 | Alq3 | 76 | — | — | Present Invention |
| 26 | Example Compound No. 14:Yb (1:1) | Ag | 8.5 | LiQ:Yb (1:1) | 78 | — | — | Present Invention |
| 27 | Example Compound No. 14:Yb (1:1) | Ag | 8.5 | Example Compound No. 14:Yb (1:1) | 82 | — | — | Present Invention |
| 28 | Example Compound No. 92:Yb (1:1) | Ag:Mg(9:1) | 8.5 | α-NPD | 76 | — | — | Present Invention |
| 29 | Example Compound No. 92:Yb (1:1) | Ag:Mg (9:1) | 8.5 | Example Compound No. 14 | 79 | — | — | Present Invention |
| 30 | Example Compound No. 92:Yb (1:1) | Ag:Mg (9:1) | 8.5 | Example Compound No. 14:Yb (1:1) | 81 | — | — | Present Invention |

\* Numbers inside parentheses represent ratio of constituent materials

It can be seen from the results shown in Table III that the transparent electrodes 14 and 15 having, as a base layer, a metal affinity layer (1a) defined in the present invention that contains a compound including a heteroatom having an unshared electron pair and a lanthanoid in the molecule, exhibit a high light transmittance of 60% or more while also exhibiting good conductivity of less than 10 Ω/sq. Further, even for the transparent electrode 10 serving as a comparison, although transmittance and conductivity are good, the transparent electrodes 14 and 15 of the present invention exhibit a better amount of change in sheet resistance (durability) than the transparent electrode 10, based on which it can be seen that transparent electrodes having the structure defined in the present invention exhibit excellent durability. Further, it can also be understood that the same tendency is observed also when the constituent material of the conductive layer (1b) is changed from Ag by itself to an Ag and Mg alloy. In addition, when an alloy of Ag and Mg is compared with Ag by itself as the material of the conductive layer (1b), it can be seen that Ag by itself is better in terms of light transmittance and conductivity.

Still further, forming a capping layer on the conductive layer (1b) further improved the light transmittance. In particular, it can be seen that when the metal affinity layer defined in the present invention is used as the configuration of the capping layer and the conductive layer (1b) is sandwiched between a pair of metal affinity layers, the light transmittance is improved even further.

Example 2

[Manufacture of Light-Emitting Panels]

Light-emitting panels (dual emission type organic electroluminescence panel) 1-1 to 1-15 were manufactured in which a transparent electrode is used as a cathode.

[Manufacture of Light-Emitting Panel 1-1]

The manufacturing procedure of the light-emitting panels is described with reference to FIG. 4.

(Formation of Glass Substrate and Counter Electrode (5c))

On a 100 mm×100 mm×1.1 mm glass substrate (131), a substrate (NA-45, manufactured by AvanStrate Inc.) on which a counter electrode (5c) made of ITO (indium tin oxide) had been deposited to a thickness of 100 nm as an anode was patterned. Then, the glass substrate (131) provided with the ITO counter electrode (5c) was ultrasonically cleaned with isopropyl alcohol, dried with dry nitrogen gas, and subjected to UV ozone cleaning for 5 minutes.

(Formation of Transparent Electrode (1) and Light-Emitting Function Layer Unit (3))

The glass substrate (131) having a cleaned counter electrode (5c) was fixed to a substrate holder of a commercially available vacuum deposition apparatus, and an optimum amount of the material for forming each of the transparent electrode (1) and the light-emitting function layer unit (3) was filled into the respective heating boat. The used heating boats were manufactured from a material for tungsten resistance heating.

First, the interior of the vapor deposition chamber of the vacuum vapor deposition apparatus was depressurized to a degree of vacuum of $4\times10^{-4}$ Pa, and the heating boats containing the respective materials were sequentially energized and heated to form the respective layers as follows.

<Formation of Hole Injection Layer (3a)>

As the hole injection material, a heating boat containing HAT-CN represented by the following structural expression was energized and heated to deposit a hole injection layer (3a) made of HAT-CN on the ITO counter electrode (5c). The deposition conditions were set such that the deposition rate was in the range of 0.1 to 0.2 nm/sec and the thickness was 10 nm.

[Formula 31]

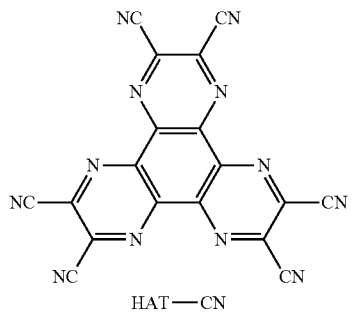

<Formation of Hole Transport Layer (3b)>

Then, a heating boat containing α-NPD (mentioned above) as a hole transport and injection material was energized and heated to deposit a hole transport layer (3b) made of α-NPD on the hole injection layer (3a). The deposition conditions were set such that the deposition rate was in the range of 0.1 to 0.2 nm/sec and the thickness was 120 nm.

<Formation of Light-Emitting Layer (3c)>

Next, a heating boat containing the following host material H1 as a host material and a heating boat containing the following phosphorescence light-emitting compound Ir-1, which is a phosphorescence light-emitting compound, were independently energized, whereby a light-emitting layer (3c) formed from the host material H1 and the phosphorescence light-emitting compound Ir-1 was deposited on the hole transport layer (3b). At this time, the energization of the heating boat was adjusted such that the deposition rate was host material H1:phosphorescence light-emitting compound Ir-1=85:15 (mass ratio). The thickness was 30 nm.

[Formula 32]

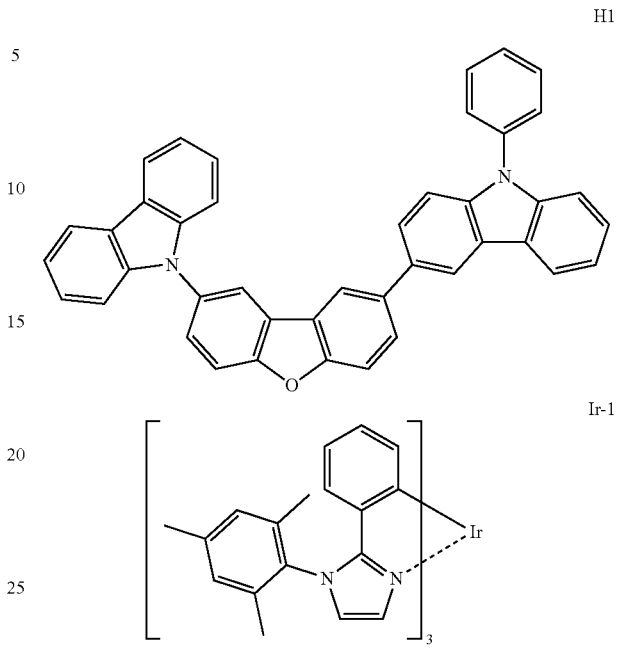

<Formation of Electron Transport Layer (3d)>

Next, a heating boat containing Alq$_3$ (mentioned above) as an electron transport material was energized such that an electron transport layer (3d) made of Alq$_3$ was deposited on the light-emitting layer (3c). The deposition conditions were set such that the deposition rate was in the range of 0.1 to 0.2 nm/sec and the thickness was 30 nm.

<Formation of Electron Injection Layer (3e)>

Next, a heating boat containing LiQ (mentioned above) as an electron injection material was energized and heated to deposit an electron injection layer (3e) made of LiQ on the electron transport layer (3d). The deposition conditions were set such that the deposition rate was in the range of 0.01 to 0.02 nm/sec and the thickness was 2 nm.

<Formation of Transparent Electrode (1)>

Next, the transparent substrate (131) formed up to the electron injection layer (3e) was transferred while maintaining the vacuum state from the deposition chamber of the vacuum deposition apparatus to a vacuum chamber equipped with a tungsten resistive heating boat filled with silver (Ag) as a material for forming the transparent electrodes (1 and conductive layer 1b).

Next, the vacuum chamber was depressurized to $4\times10^{-4}$ Pa, and then the resistive heating boat was energized and heated, whereby a 10 nm-thick conductive layer (1b) made of silver was deposited as a cathode on the electron injection layer (3e) at a deposition rate in the range of 0.1 to 0.2 nm/sec.

<Formation of Capping Layer>

Then, the substrate was transferred to the original vacuum chamber, and although not shown in FIG. 4, α-NPD (mentioned above) was deposited on the conductive layer (1b) at a deposition rate in the range of 0.1 to 0.2 nm/sec and to a thickness of 40 nm to form a capping layer.

As a result of the above procedure, an organic EL device (300) was formed on the transparent substrate (131).

(Sealing of Organic EL Device)

Then, the organic EL device (300) was covered with a sealing material (17) made of a glass substrate having a thickness of 300 μm, and sealed with an adhesive agent (19, sealing material) between the sealing material (17) and the transparent substrate (131) in a state surrounding the organic EL device (300). As the adhesive agent (19), a photocurable epoxy adhesive agent (Luxtrak LC0629B manufactured by Toagosei Co., Ltd.) was used. The adhesive agent (19) filled between the sealing material (17) and the transparent substrate (131) was irradiated with UV light from the glass substrate (sealing material, 17) side to cure the adhesive agent (19), thereby sealing the organic EL device (300).

In the formation of the organic EL device (300), a vapor deposition mask was used for forming each layer, with a 4.5 cm×4.5 cm area in the center of a 100 mm×100 mm transparent substrate (131) set as a light-emitting region A, and a 0.25 cm-wide non-light-emitting region B provided around the entire periphery of the light-emitting region A. In addition, the counter electrode (5c), which is the anode, and the transparent electrode (1), which is the cathode, were formed such that their terminal portion was each in a shape drawn out to the peripheral edge of the transparent substrate (131) in an insulated state by the light-emitting function layer unit (3) from the hole transport layer (3a) to the electron injection layer (3e).

In this manner, the light-emitting panel 1-1 was manufactured by providing the organic EL device (300) on the transparent substrate (131) and sealing the organic EL device (300) with the sealing material (17) and the adhesive agent (19).

In the light-emitting panel 1-1, emission light (L) in each color produced by the light-emitting layer (3c) was extracted from both the transparent electrode (1) side, that is, the sealing material (17) side, and the counter electrode side (5c), that is, the transparent substrate (131) side.

[Manufacture of Light-Emitting Panels 1-2 to 1-15]

Light-emitting panels 1-2 to 1-15 were manufactured in the same manner as the light-emitting panel 1-1, except that the constituent materials and thicknesses of the electron transport layer (3d), the electron injection layer (3e), and the conductive layer (1b) were changed to the conditions shown in Table IV. Note that in the formation of the electron injection layer (3e) of the light-emitting panel 1-15, a 10 nm-thick electron injection layer (3e) was formed by adjusting, as the electron injection layer material, Example Compound No. 92, Yb, and LiQ such that the deposition rate was 2:2:1.

<Evaluation of Light-Emitting Panels>

The light transmittance, drive voltage, drive voltage variation, and high-temperature device life of the light-emitting panels 1-1 to 1-15 manufactured above were measured according to the following method.

(Measurement of Light Transmittance]

Light transmittance (%) at a wavelength of 500 nm was measured for each light-emitting panel manufactured above using a spectrophotometer (U-3300, manufactured by Hitachi, Ltd.), with the transparent substrate (131) of each light-emitting panel as a reference.

[Measurement of Drive Voltage]

The front luminance on both sides of each of the light-emitting panels manufactured as described above, namely, the transparent electrode (1) side (i.e., the sealing material 17 side) and the counter electrode (5c) side (i.e., the substrate (131) side) of each light-emitting panel was measured, and the voltage when the sum of those front luminances reached 1000 cd/m$^2$ was measured as the drive voltage (V). For the luminance measurement, a spectral radiance meter CS-2000 (manufactured by Konica Minolta) was used. The evaluation represents an average value as measured from five panels manufactured in separate batches by the same manufacturing method. The smaller the numerical value of the obtained drive voltage (V) is, the more preferable the result.

[Evaluation of Drive Voltage Variation]

The drive voltage variation was evaluated by, for each light-emitting panel, separately manufacturing five samples in separate batches by the same manufacturing method, and measuring the drive voltage and the average drive voltage of those samples in the same manner as the above method. The degree of the variation was evaluated based on the following standards.

○: Difference for all five panels is less than 0.2 V with respect to the average drive voltage.
Δ: Difference for one or more panels is 0.2 V or more and less than 0.5 V with respect to the average drive voltage.
x: Difference for three or more panels is 0.5 V or more, or the difference for one or more panels is 1.0 V or more, with respect to the average drive voltage.

[Measurement of High-Temperature Device Life]

Each of the light-emitting panels manufactured above was made to continuously emit light at a constant current of 2.5 mA/cm$^2$ under an environment in which the room temperature was 50° C., and the time required to obtain half the initial luminance (half-life) was measured. The high-temperature device life was determined as a relative value based on a value of 100 for the luminance half-life (time) of the light-emitting panel 1-8.

The obtained results are shown in Table IV.

[Table 4]

TABLE IV

| Light-Emitting Panel No. | Electron Transport Layer (3d) | | Electron Injection Layer (3e) | | Conductive Layer (1b) | Evaluation Results | | | | |
|---|---|---|---|---|---|---|---|---|---|---|
| | | | | | | Light Transmittance [%] | Drive Voltage [V] | Drive Voltage Variation | High-Temperature Device Life [hours] | Note |
| | Constituent Material | Thickness [nm] | Constituent Material | Thickness [nm] | Constituent Material | | | | | |
| 1-1 | Alq3 | 30 | LiQ | 2 | Ag | 34 | 6.4 | x | 74 | Comparative Example |
| 1-2 | Alq3 | 30 | LiQ | 10 | Ag | 31 | 14.2 | ○ | 21 | Comparative Example |
| 1-3 | Alq3 | 30 | LiQ | 10 | Ag:Mg (9:1) | 33 | 9.6 | ○ | 38 | Comparative Example |
| 1-4 | Alq3 | 30 | LiQ:Yb (1:1) | 2 | Ag | 38 | 5.0 | x | 78 | Comparative Example |

TABLE IV-continued

| Light-Emitting Panel No. | Electron Transport Layer (3d) | | Electron Injection Layer (3e) | | Conductive Layer (1b) | Evaluation Results | | | | |
| --- | --- | --- | --- | --- | --- | --- | --- | --- | --- | --- |
| | Constituent Material | Thickness [nm] | Constituent Material | Thickness [nm] | Constituent Material | Light Transmittance [%] | Drive Voltage [V] | Drive Voltage Variation | High-Temperature Device Life [hours] | Note |
| 1-5 | Alq3 | 30 | LiQ:Yb (1:1) | 10 | Ag | 41 | 12.2 | ○ | 32 | Comparative Example |
| 1-6 | Alq3 | 30 | Example Compound No. 14:KF | 2 | Ag | 61 | 4.7 | Δ | 82 | Comparative Example |
| 1-7 | Example Compound No. 14 | 30 | KF | 2 | Ag | 40 | 4.6 | x | 88 | Comparative Example |
| 1-8 | Alq3 | 30 | Example Compound No. 14:KF | 10 | Ag | 65 | 4.7 | ○ | 100 | Comparative Example |
| 1-9 | Alq3 | 30 | Example Compound No. 14:LiF | 10 | Ag:Mg (9:1) | 66 | 4.8 | ○ | 105 | Comparative Example |
| 1-10 | Alq3 | 30 | Example Compound No. 14:Yb (1:1) | 10 | Ag:Mg (9:1) | 70 | 4.4 | ○ | 132 | Present Invention |
| 1-11 | ET-3 | 30 | Example Compound No. 14:Yb (1:1) | 10 | Ag:Mg (9:1) | 71 | 3.9 | ○ | 138 | Present Invention |
| 1-12 | Alq3 | 30 | Example Compound No. 92:Yb (1:1) | 10 | Ag:Mg (9:1) | 71 | 4.3 | ○ | 136 | Present Invention |
| 1-13 | Example Compound No. 14 | 30 | Example Compound No. 92:Yb (1:1) | 10 | Ag:Mg (9:1) | 72 | 4.0 | ○ | 147 | Present Invention |
| 1-14 | Example Compound No. 14 | 20 | Example Compound No. 92:Yb (1:1) | 10 | Ag:Mg (9:1) | 73 | 3.8 | ○ | 145 | Present Invention |
| 1-15 | Example Compound No. 92:Yb (1:1) | 20 | Example Compound No. 92:Yb:LiQ | 10 | Ag:Mg (9:1) | 72 | 3.8 | ○ | 149 | Present Invention |

\* Numbers inside parentheses represent ratio of constituent materials

From the results shown in Table IV, it can be seen that when the electron injection layer (3e) is an extremely thin layer of 2 nm, the drive voltage variation deteriorates. Further, comparing the light-emitting panels 1-1 and 1-2, although increasing the thickness of the electron injection layer (3e) from 2 nm to 10 nm did indeed allow the drive voltage variation to be suppressed, when the electron injection layer (3e) is composed only of a metal salt or a metal complex as the electron injection layer material, there is a problem in that the drive voltage rises. In addition, when the electron injection layer (3e) adjacent to the conductive layer (1b) contains a metal affinity compound and a metal salt, although light transmittance and drive voltage can be achieved, the high-temperature device life is still insufficient. In contrast, it can be seen that when an electron injection layer (3e) containing a lanthanoid (Yb) and the metal affinity compound having the structure defined in the present invention is provided adjacent to the conductive layer (1b), the high-temperature device life can be further improved while also achieving a light-transmitting property and drive voltage. In addition, it can be seen that the layer containing a lanthanoid (Yb) and the metal affinity compound according to the present invention also exhibits a function as an electron transport layer (3d).

Furthermore, comparing panels 1-14 and 1-15, it can be seen that although there is a slight difference between panel 1-14, which does not include a metal salt material in the electron injection layer (3e) adjacent to the conductive layer (1b), and panel 1-15, which includes a metal salt material (LiQ), those panels exhibit almost the same performance, suggesting that the silver affinity layer according to the present invention has the effect of suppressing the adverse effects of the metal salt.

Example 3

[Manufacture-2 of Light-Emitting Panels]
[Manufacture of Light-Emitting Panel 2-1]

A light-emitting panel (top emission type organic electroluminescence panel) 2-1 using a transparent electrode as a cathode was manufactured.

The light-emitting panel 2-1 was manufactured in the same manner as the manufacture of the light-emitting panel 1-3 described in Example 2, except that the method was changed to the method described below.

The cleaned glass substrate was fixed to a substrate holder of a commercially available vacuum deposition apparatus, and an optimum amount of the material for forming each electrode material (5c and 1) and the light-emitting function layer unit (3) was filled into the respective heating boat. The used heating boats were manufactured from a material for tungsten resistance heating.

The glass substrate (131) was transferred in a vacuum chamber filled with aluminum (Al) in place of ITO, while maintaining the vacuum state, to a tungsten resistive heating boat as a material for forming the counter electrode (5c). Next, the vacuum chamber was depressurized to $4\times10^{-4}$ Pa, and then the resistive heating boat was energized and heated, whereby a 100 nm-thick aluminum was deposited as the counter electrode (5c), which is a reflective electrode.

hours under a high-temperature environment (temperature of 120° C.), then made to continuously emit light at a constant current of 2.5 mA/cm² at room temperature (25° C.), and the time required to obtain half the initial luminance (half-life) was measured. The device life after storage at a high temperature was determined as a relative value based on a value of 100 for the luminance half-life of the light-emitting panel 2-3.

The obtained results are shown in Table IV.

TABLE V

| Light-Emitting Panel No. | Electron Injection Layer (3e) Constituent Material | Capping Layer Constituent Material | Evaluation Results | | Note |
|---|---|---|---|---|---|
| | | | Drive Voltage Change Rate | Device Life After Storage [hours] | |
| 2-1 | LiQ | α-NPD | X | 20 | Comparative Example |
| 2-2 | LiQ | LiQ:Yb (1:1) | Δ | 26 | Comparative Example |
| 2-3 | LiQ | Example Compound No. 14:Yb (1:1) | ○ | 100 | Present Invention |
| 2-4 | LiQ:Yb (1:1) | Example Compound No. 14:Yb (1:1) | ○ | 106 | Present Invention |
| 2-5 | Example Compound No. 14:Yb (1:1) | α-NPD | ○ | 136 | Present Invention |
| 2-6 | Example Compound No. 14:Yb (1:1) | Example Compound 3-10:Yb | ○ | 143 | Present Invention |
| 2-7 | Example Compound No. 14:Yb (1:1) | Example Compound No. 14:Yb (1-1) | ○ | 152 | Present Invention |
| 2-8 | Example Compound No. 14:Yb (1:1) | Example Compound No. 87:Yb | ○ | 156 | Present Invention |
| 2-9 | Example Compound No. 87:Yb | Example Compound No. 92:Yb (1:1) | ○ | 150 | Present Invention |

* Numbers inside parentheses represent ratio of constituent materials

[Manufacture of Light-Emitting Panels 2-2 to 2-9]

Light-emitting panels 2-2 to 2-9 were manufactured in the same manner as light-emitting panel 2-1, except that the constituent materials of the electron injection layer (3e) and the capping layer were changed as shown in Table V.

<Evaluation of Light-Emitting Panels>

For the light-emitting panels 2-1 to 2-9 manufactured above, the drive voltage change rate of the organic EL device and the device life after storage were evaluated by the following method.

[Evaluation of Drive Voltage Change Rate]

The front luminance on the transparent electrode (1) side (i.e., the sealing material 17 side) of each of the light-emitting panels manufactured as described above was measured, and the voltage when the sum thereof reached 1000 cd/m² was measured as the drive voltage (V). For the luminance measurement, a spectral radiance meter CS-1000 (manufactured by Konica Minolta) was used. Further, the drive voltage (V') when each light-emitting panel was stored in a high-temperature environment (temperature 120° C.) for 24 hours was measured, and a drive voltage change rate (5) was calculated according to the following expression and evaluated according to the following ranks.

Drive voltage change rate (%)=[after-storage drive voltage (V')/initial drive voltage (V)]×100

○: Drive voltage change rate is less than 5.0%.

Δ: Drive voltage change rate is 5.0% or more and less than 15.0%.

x: Drive voltage change rate is 15.0% or more.

[Evaluation of Device Life after Storage]

Each of the light-emitting panels manufactured above for evaluating the drive voltage change rate was stored for 24

From the results shown in Table V, it can be seen that by providing a layer containing a lanthanoid (Yb) and the metal affinity compound according to the present invention for either the electron injection layer (3e) or the capping layer adjacent to the conductive layer (1b), the drive voltage change rate is suppressed. Further, it can also be seen that after-storage device life was improved in panels 2-6 to 2-9, in which the layer containing a lanthanoid (Yb) and the metal affinity compound according to the present invention sandwiches the conductive layer (1b), compared with panels 2-3 to 2-5, in which the layer containing a lanthanoid (Yb) and the metal affinity compound is present on only either surface side of the conductive layer.

Although embodiments of the present invention have been described and illustrated in detail, the disclosed embodiments are made for purposes of illustration and example only and not limitation. The scope of the present invention should be interpreted by terms of the appended claims

INDUSTRIAL APPLICABILITY

The transparent electrode of the present invention can be suitably used in an organic EL device. Such an organic EL may be applied in lighting devices such as household lighting and automobile interior lighting, backlights of watches and liquid crystal display devices, signboard advertising light sources, traffic signal light sources, optical storage media light sources, electrophotographic copying machine light sources, optical communication processing machine light sources, optical sensor light sources, and the like.

Advantageous Effects

According to the above-mentioned solution of the present invention, it is possible to provide a transparent electrode having sufficient conductivity and light-transmitting property, as well as excellent durability (heat resistance), and an electronic device that has this transparent electrode and that combines a light-transmitting property and driving voltage with excellent durability (device lifetime).

Although the manifestation mechanism and operation mechanism of the effect of the present invention has not been clarified, it is presumed to be as follows.

Specifically, the transparent electrode of the present invention is characterized by comprising a metal affinity layer and a conductive layer formed adjacent to the metal affinity layer, wherein the conductive layer is made of silver as a main component and the metal affinity layer contains a lanthanoid and a compound (silver affinity compound) having atoms with affinity for silver atoms.

In the transparent electrode of the present invention, the metal affinity layer and the conductive layer may be adjacent to each other. The conductive layer may be formed on the metal affinity layer, or the metal affinity layer may be formed on the conductive layer. Furthermore, the conductive layer may be formed on a first metal affinity layer, and a second metal affinity layer formed on the conductive layer, so that the conductive layer is sandwiched between two metal affinity layers.

When depositing the conductive layer having silver as a main component on an upper portion of the metal affinity layer, the silver atoms constituting the conductive layer interact with the silver affinity compound and the lanthanoid contained in the metal affinity layer, causing the diffusion distance of the silver atoms on the surface of the metal affinity layer to decrease. As a result, agglomeration of silver atoms due to silver migration at a specific site can be suppressed.

That is, the silver atoms are deposited by layered growth type (Frank-van der Merwe: FM type) film growth in which the silver atoms first form two-dimensional nuclei on the surface of the metal affinity layer having atoms with affinity for silver atoms, and then a two-dimensional monocrystalline layer is formed centered around those nuclei.

It is thought that, in general, the silver atoms attached to the surface of the metal affinity layer tend to be deposited in an island-like manner through island type growth (Volumer-Weber: VW type) in which the silver atoms bind together to form three-dimensional nuclei while diffusing on the surface, and grow into three-dimensional islands.

However, in the present invention, it is inferred that island-like growth (VM type) is suppressed and layered growth (FM type) is promoted by the silver affinity compound and the lanthanoid contained in the metal affinity layer.

Therefore, a conductive layer having a uniform thickness even though it is a thin layer can be obtained. As a result, it is possible to obtain a transparent electrode ensuring conductivity while maintaining a light-transmitting property due to its thin thickness.

In addition, when the metal affinity layer is deposited on an upper portion of the conductive layer, it is thought that the silver atoms constituting the conductive layer interact with atoms having affinity for the silver atoms contained in the metal affinity layer, thereby suppressing mobility. As a result, the surface smoothness of the conductive layer is improved, enabling irregular reflection to be suppressed and transmittance to be improved. Further, it is presumed that the interaction suppresses changes in the conductive layer in response to physical stimuli such as heat and temperature, enabling durability to be improved.

REFERENCE SIGNS LIST

1 transparent electrode
1a metal affinity layer
1b conductive layer
3 light-emitting function layer unit
3a hole injection layer
3b hole transport layer
3c light-emitting layer
3d electron transport layer
3e electron injection layer
5a, 5b, 5c counter electrode
11 base material
13, 131 transparent substrate (base material)
13a, 131a light extraction surface
15 auxiliary electrode
17 sealing material
19 adhesive agent
100, 200, 300, 400 organic EL device
h luminous point
L emission light

The invention claimed is:

1. A transparent electrode, comprising a conductive layer and at least one metal affinity layer adjacent to the conductive layer,
   wherein the conductive layer is composed of silver as a main component,
   the metal affinity layer contains an organic compound and a lanthanoid, and
   the organic compound is a compound comprising a heteroatom having an unshared electron pair in a molecule.

2. The transparent electrode according to claim 1, wherein the organic compound contained in the metal affinity layer is an aromatic heterocyclic compound comprising a nitrogen atom having an unshared electron pair not involved in aromaticity and has an effective action energy $\Delta E_{ef}$ with silver represented by the following expression (1) that satisfies the condition defined by the following expression (2):

$$\Delta E_{ef} = n \times \Delta E/s \quad \text{Expression (1)}$$

wherein n represents the number of nitrogen atoms (N) in a compound that are stably bound to silver (Ag), $\Delta E$ represents an interaction energy between a nitrogen atom (N) and silver (Ag), and s represents a surface area of the compound, $$-0.50 \leq \Delta E_{ef} \leq -0.10 \, [\text{kcal/mol·Å}^2] \quad \text{Expression (2)}.$$

3. The transparent electrode according to claim 1, wherein the organic compound contained in the metal affinity layer is an organic compound having an energy level of a lowest unoccupied molecular orbital (LUMO) within a range of $-2.2$ to $-1.6$ eV.

4. The transparent electrode according to claim 1, wherein the organic compound contained in the metal affinity layer is a compound having a structure represented by the following general formula (I):

[Formula 1]

General Formula (I)

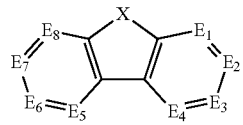

wherein X represents $NR_1$, an oxygen atom or a sulfur atom, $E_1$ to $E_8$ each independently represent $CR_2$ or a nitrogen atom, and $R_1$ and $R_2$ each independently represent a hydrogen atom or a substituent.

5. The transparent electrode according to claim 1, wherein the lanthanoid is samarium (Sm), europium (Eu) or ytterbium (Yb).

6. An electronic device comprising the transparent electrode according to claim 1.

7. The electronic device according to claim 6, wherein the electronic device is an organic electroluminescence device.

* * * * *